United States Patent
Dangler et al.

(10) Patent No.: US 10,271,434 B2
(45) Date of Patent: Apr. 23, 2019

(54) METHOD OF FABRICATING A TAMPER-RESPONDENT ASSEMBLY WITH REGION(S) OF INCREASED SUSCEPTIBILITY TO DAMAGE

(71) Applicant: INTERNATIONAL BUSINESS MACHINES CORPORATION, Armonk, NY (US)

(72) Inventors: John R. Dangler, Rochester, MN (US); David C. Long, Wappingers Falls, NY (US); Michael T. Peets, Staatsburg, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 197 days.

(21) Appl. No.: 15/249,676

(22) Filed: Aug. 29, 2016

(65) Prior Publication Data

US 2017/0094805 A1 Mar. 30, 2017

Related U.S. Application Data

(63) Continuation of application No. 14/865,591, filed on Sep. 25, 2015, now Pat. No. 10,098,235.

(51) Int. Cl.
*H05K 1/02* (2006.01)
*H05K 3/10* (2006.01)
*H05K 1/09* (2006.01)

(52) U.S. Cl.
CPC ............ *H05K 3/10* (2013.01); *H05K 1/0213* (2013.01); *H05K 1/0275* (2013.01); *H05K 1/09* (2013.01);

(Continued)

(58) Field of Classification Search
CPC ....... G06F 21/72; G06F 21/87; H05K 1/0275; H05K 1/028; H05K 1/0298; H05K 1/0393; H05K 1/147
See application file for complete search history.

(56) References Cited

U.S. PATENT DOCUMENTS 3,165,569 A  1/1965  Bright et al.
4,160,503 A  7/1979  Ohlbach
(Continued)

FOREIGN PATENT DOCUMENTS

CN    2014-30639 Y    3/2010
CN    10-4346587 A    2/2015
(Continued)

OTHER PUBLICATIONS

Brodsky et al., "Tamper-Respondent Assemblies", U.S. Appl. No. 15/800,497, filed Nov. 1, 2017 (108 pages).

(Continued)

*Primary Examiner* — Minh Trinh
(74) *Attorney, Agent, or Firm* — Tihon Poltavets, Esq.; Kevin P. Radigan, Esq.; Heslin Rothenberg Farley & Mesiti P.C.

(57) ABSTRACT

Methods of fabricating tamper-respondent assemblies provided which include a tamper-respondent electronic circuit structure. The tamper-respondent electronic circuit structure includes a tamper-respondent sensor. The tamper-respondent sensor includes, for instance, at least one flexible layer having opposite first and second sides, and circuit lines forming, at least in part, at least one tamper-detect network, such as one or more resistive networks. The circuit lines are disposed on at least one of the first side or the second side of the at least one flexible layer. At least one region of the tamper-respondent sensor is fabricated with increased susceptibility to damage from mechanical stress associated with a tamper event. The at least one region of increased suscep- (Continued)

tibility to damage facilitates detection of the tamper event by the tamper-respondent sensor.

12 Claims, 38 Drawing Sheets

(52) U.S. Cl.
CPC ....... *H05K 1/028* (2013.01); *H05K 2201/055* (2013.01); *H05K 2201/09263* (2013.01)

(56) References Cited

U.S. PATENT DOCUMENTS

| | | | |
|---|---|---|---|
| 4,211,324 A | 7/1980 | Ohlbach |
| 4,324,823 A | 4/1982 | Ray, III |
| 4,496,900 A | 1/1985 | Di Stefano et al. |
| 4,516,679 A | 5/1985 | Simpson |
| 4,593,384 A | 6/1986 | Kleinjne |
| 4,609,104 A | 9/1986 | Kasper et al. |
| 4,653,252 A | 3/1987 | Van de Haar et al. |
| 4,677,809 A | 7/1987 | Long et al. |
| 4,691,350 A | 9/1987 | Kleijne et al. |
| 4,807,284 A | 2/1989 | Kleijne |
| 4,811,288 A | 3/1989 | Kleijne et al. |
| 4,847,139 A | 7/1989 | Wolf et al. |
| 4,860,351 A | 8/1989 | Weingart |
| 4,865,197 A | 9/1989 | Craig |
| 5,009,311 A | 4/1991 | Schenk |
| 5,027,397 A | 6/1991 | Double et al. |
| 5,060,114 A | 10/1991 | Feinberg et al. |
| 5,075,822 A | 12/1991 | Baumler et al. |
| 5,117,457 A | 5/1992 | Comerford et al. |
| 5,159,629 A | 10/1992 | Double et al. |
| 5,185,717 A | 2/1993 | Mori |
| 5,201,868 A | 4/1993 | Johnson |
| 5,201,879 A | 4/1993 | Steele |
| 5,211,618 A | 5/1993 | Stoltz |
| 5,239,664 A | 8/1993 | Verrier et al. |
| 5,243,162 A | 9/1993 | Kobayashi |
| 5,389,738 A | 2/1995 | Piosenka et al. |
| 5,406,630 A | 4/1995 | Piosenka et al. |
| 5,506,566 A | 4/1996 | Oldfield et al. |
| 5,568,124 A | 10/1996 | Joyce et al. |
| 5,594,439 A | 1/1997 | Swanson |
| 5,675,319 A | 10/1997 | Rivenberg et al. |
| 5,715,652 A | 2/1998 | Stahlecker |
| 5,761,054 A | 6/1998 | Kuhn |
| 5,813,113 A | 9/1998 | Stewart et al. |
| 5,858,500 A | 1/1999 | MacPherson |
| 5,880,523 A | 3/1999 | Cadelore |
| 5,988,510 A | 11/1999 | Tuttle et al. |
| 6,121,544 A | 9/2000 | Petsinger |
| 6,195,267 B1 | 2/2001 | MacDonald, Jr. et al. |
| 6,201,296 B1 | 3/2001 | Fries et al. |
| 6,261,215 B1 | 7/2001 | Imer |
| 6,301,096 B1 | 10/2001 | Wozniczka |
| 6,384,397 B1 | 5/2002 | Takiar et al. |
| 6,424,954 B1 | 7/2002 | Leon |
| 6,438,825 B1 | 8/2002 | Kuhm |
| 6,469,625 B1 | 10/2002 | Tomooka |
| 6,473,995 B2 | 11/2002 | Miyakawa et al. |
| 6,512,454 B2 | 1/2003 | Miglioli et al. |
| 6,686,539 B2 | 2/2004 | Farquhar et al. |
| 6,746,960 B2 | 6/2004 | Goodman et al. |
| 6,798,660 B2 | 9/2004 | Moss et al. |
| 6,853,093 B2 | 2/2005 | Cohen et al. |
| 6,879,032 B2 | 4/2005 | Rosenau et al. |
| 6,895,509 B1 | 5/2005 | Clark |
| 6,929,900 B2 | 8/2005 | Farquhar et al. |
| 6,946,960 B2 | 9/2005 | Sisson et al. |
| 6,957,345 B2 | 10/2005 | Cesana et al. |
| 6,970,360 B2 | 11/2005 | Sinha |
| 6,985,362 B2 | 1/2006 | Mori et al. |
| 6,991,961 B2 | 1/2006 | Hubbard et al. |
| 6,996,953 B2 | 2/2006 | Perreault et al. |
| 7,005,733 B2 | 2/2006 | Kommerling et al. |
| 7,015,823 B1 | 3/2006 | Gillen et al. |
| 7,054,162 B2 | 5/2006 | Benson et al. |
| 7,057,896 B2 | 6/2006 | Matsuo et al. |
| 7,094,143 B2 | 8/2006 | Wolm et al. |
| 7,094,459 B2 | 8/2006 | Takahashi |
| 7,095,615 B2 | 8/2006 | Nichols |
| 7,156,233 B2 | 1/2007 | Clark et al. |
| 7,180,008 B2 | 2/2007 | Heitmann et al. |
| 7,189,360 B1 | 3/2007 | Ho et al. |
| 7,214,874 B2 | 5/2007 | Dangler et al. |
| 7,247,791 B2 | 7/2007 | Kulpa |
| 7,304,373 B2 | 12/2007 | Taggart et al. |
| 7,310,737 B2 | 12/2007 | Patel et al. |
| 7,465,887 B2 | 12/2008 | Suzuki et al. |
| 7,475,474 B2 | 1/2009 | Heitmann et al. |
| 7,515,418 B2 | 4/2009 | Straznicky et al. |
| 7,549,064 B2 | 6/2009 | Elbert et al. |
| 7,640,658 B1 | 1/2010 | Pham et al. |
| 7,643,290 B1 | 1/2010 | Narasimhan et al. |
| 7,663,883 B2 | 2/2010 | Shirakami et al. |
| 7,672,129 B1 | 3/2010 | Ouyang et al. |
| 7,679,921 B2 | 3/2010 | Cesana et al. |
| 7,731,517 B2 | 6/2010 | Lee et al. |
| 7,746,657 B2 | 6/2010 | Oprea et al. |
| 7,760,086 B2 | 7/2010 | Hunter et al. |
| 7,768,005 B2 | 8/2010 | Condorelli et al. |
| 7,783,994 B2 | 8/2010 | Ball et al. |
| 7,787,256 B2 | 8/2010 | Chan et al. |
| 7,868,411 B2 | 1/2011 | Eaton et al. |
| 7,898,413 B2 | 3/2011 | Hsu et al. |
| 7,901,977 B1 | 3/2011 | Angelopoulos et al. |
| 7,947,911 B1 | 5/2011 | Pham et al. |
| 7,978,070 B2 | 7/2011 | Hunter |
| 8,006,101 B2 | 8/2011 | Crawford |
| 8,084,855 B2 | 12/2011 | Lower et al. |
| 8,094,450 B2 | 1/2012 | Cole et al. |
| 8,101,267 B2 | 1/2012 | Samuels et al. |
| 8,133,621 B2 | 3/2012 | Wormald et al. |
| 8,199,506 B2 | 6/2012 | Janik et al. |
| 8,287,336 B2 | 10/2012 | Dangler et al. |
| 8,325,486 B2 | 12/2012 | Arshad et al. |
| 8,516,269 B1 | 8/2013 | Hamlet et al. |
| 8,589,703 B2 | 11/2013 | Lee et al. |
| 8,646,108 B2 | 2/2014 | Shiakallis et al. |
| 8,659,506 B2 | 2/2014 | Nomizo |
| 8,659,908 B2 | 2/2014 | Adams et al. |
| 8,664,047 B2 | 3/2014 | Lower et al. |
| 8,716,606 B2 | 5/2014 | Kelley et al. |
| 8,797,059 B2 | 8/2014 | Boday et al. |
| 8,836,509 B2 | 9/2014 | Lowy |
| 8,853,839 B2 | 10/2014 | Gao et al. |
| 8,879,266 B2 | 11/2014 | Jarvis et al. |
| 8,890,298 B2 | 11/2014 | Buer et al. |
| 8,947,889 B2 | 2/2015 | Kelley et al. |
| 8,961,280 B2 | 2/2015 | Dangler et al. |
| 9,003,199 B2 | 4/2015 | Dellmo et al. |
| 9,011,762 B2 | 4/2015 | Seppa et al. |
| 9,052,070 B2 | 6/2015 | Davis et al. |
| 9,166,586 B2 | 10/2015 | Carapelli et al. |
| 9,298,956 B2 | 3/2016 | Wade et al. |
| 2001/0049021 A1 | 12/2001 | Valimont |
| 2001/0050425 A1 | 12/2001 | Beroz et al. |
| 2001/0056542 A1 | 12/2001 | Cesana et al. |
| 2002/0002683 A1 | 1/2002 | Benson |
| 2002/0068384 A1 | 6/2002 | Beroz et al. |
| 2002/0084090 A1 | 7/2002 | Farquhar |
| 2003/0009684 A1 | 1/2003 | Schwenck et al. |
| 2004/0218366 A1 | 11/2004 | Speigl |
| 2005/0068735 A1 | 3/2005 | Fissore et al. |
| 2005/0111194 A1 | 5/2005 | Sohn et al. |
| 2005/0161253 A1 | 7/2005 | Heitmann et al. |
| 2005/0180104 A1 | 8/2005 | Olesen et al. |
| 2006/0034731 A1 | 2/2006 | Lewis et al. |
| 2006/0049941 A1 | 3/2006 | Hunter et al. |
| 2006/0072288 A1 | 4/2006 | Stewart et al. |
| 2006/0080348 A1 | 4/2006 | Cesana et al. |
| 2006/0196945 A1 | 9/2006 | Mendels |
| 2006/0218779 A1 | 10/2006 | Ooba et al. |

(56) References Cited

U.S. PATENT DOCUMENTS

| | | |
|---|---|---|
| 2007/0038865 A1 | 2/2007 | Oggioni et al. |
| 2007/0064396 A1 | 3/2007 | Oman et al. |
| 2007/0064399 A1 | 3/2007 | Mandel et al. |
| 2007/0108619 A1 | 5/2007 | Hsu |
| 2007/0125867 A1 | 6/2007 | Oberle |
| 2007/0211436 A1 | 9/2007 | Robinson et al. |
| 2007/0230127 A1 | 10/2007 | Peugh et al. |
| 2007/0268671 A1 | 11/2007 | Brandenburg et al. |
| 2008/0050512 A1 | 2/2008 | Lower et al. |
| 2008/0086876 A1 | 4/2008 | Douglas |
| 2008/0144290 A1 | 6/2008 | Brandt et al. |
| 2008/0159539 A1 | 7/2008 | Huang et al. |
| 2008/0160274 A1 | 7/2008 | Dang et al. |
| 2008/0191174 A1 | 8/2008 | Ehrensvard et al. |
| 2008/0251906 A1 | 10/2008 | Eaton et al. |
| 2008/0278353 A1 | 11/2008 | Smith et al. |
| 2009/0040735 A1 | 2/2009 | Chan et al. |
| 2009/0073659 A1 | 3/2009 | Peng et al. |
| 2009/0166065 A1 | 7/2009 | Clayton et al. |
| 2009/0212945 A1 | 8/2009 | Steen |
| 2010/0088528 A1 | 4/2010 | Sion |
| 2010/0110647 A1 | 5/2010 | Hiew et al. |
| 2010/0177487 A1 | 7/2010 | Arshad et al. |
| 2010/0319986 A1 | 12/2010 | Bleau et al. |
| 2011/0001237 A1 | 1/2011 | Brun et al. |
| 2011/0038123 A1 | 2/2011 | Janik et al. |
| 2011/0103027 A1 | 5/2011 | Aoki et al. |
| 2011/0241446 A1 | 10/2011 | Tucholski |
| 2011/0299244 A1 | 12/2011 | Dede et al. |
| 2012/0047374 A1 | 2/2012 | Klum et al. |
| 2012/0050998 A1 | 3/2012 | Klum et al. |
| 2012/0117666 A1 | 5/2012 | Oggioni et al. |
| 2012/0140421 A1 | 6/2012 | Kirstine et al. |
| 2012/0319986 A1 | 6/2012 | Toh et al. |
| 2012/0170217 A1 | 7/2012 | Nishikimi et al. |
| 2012/0185636 A1 | 7/2012 | Leon et al. |
| 2012/0244742 A1 | 9/2012 | Wertz et al. |
| 2012/0256305 A1 | 10/2012 | Kaufmann et al. |
| 2012/0320529 A1 | 12/2012 | Loong et al. |
| 2013/0021758 A1 | 1/2013 | Bernstein et al. |
| 2013/0033818 A1 | 2/2013 | Hosoda et al. |
| 2013/0058052 A1 | 3/2013 | Arshad et al. |
| 2013/0104252 A1 | 4/2013 | Yanamadala et al. |
| 2013/0141137 A1 | 6/2013 | Krutzik et al. |
| 2013/0154834 A1 | 6/2013 | Busca et al. |
| 2013/0158936 A1 | 6/2013 | Rich et al. |
| 2013/0170217 A1 | 7/2013 | Lee |
| 2013/0208422 A1 | 8/2013 | Hughes et al. |
| 2013/0235527 A1 | 9/2013 | Wagner et al. |
| 2013/0283386 A1 | 10/2013 | Lee |
| 2014/0022733 A1 | 1/2014 | Lim et al. |
| 2014/0027159 A1 | 1/2014 | Salle et al. |
| 2014/0028335 A1 | 1/2014 | Salle et al. |
| 2014/0033331 A1 | 1/2014 | Salle et al. |
| 2014/0160679 A1 | 6/2014 | Kelty et al. |
| 2014/0184263 A1 | 7/2014 | Ehrenpfordt et al. |
| 2014/0204533 A1 | 7/2014 | Abeyasekera et al. |
| 2014/0233165 A1 | 8/2014 | Farkas et al. |
| 2014/0306014 A1 | 10/2014 | Salle et al. |
| 2014/0321064 A1 | 10/2014 | Bose et al. |
| 2014/0325688 A1 | 10/2014 | Cashin et al. |
| 2015/0007427 A1 | 1/2015 | Dangler et al. |
| 2015/0163933 A1 | 6/2015 | Steiner |
| 2015/0235053 A1 | 8/2015 | Lee et al. |
| 2015/0244374 A1 | 8/2015 | Hadley |
| 2015/0307250 A1 | 10/2015 | Sokol |
| 2016/0005262 A1 | 1/2016 | Hirato et al. |
| 2016/0137548 A1 | 5/2016 | Cabral, Jr. et al. |
| 2016/0262253 A1 | 9/2016 | Isaacs et al. |
| 2016/0262270 A1 | 9/2016 | Isaacs et al. |
| 2017/0006712 A1 | 1/2017 | Matsushima |
| 2017/0019987 A1 | 1/2017 | Dragone et al. |
| 2017/0094805 A1* | 3/2017 | Dangler .................. H05K 3/10 |
| 2018/0124915 A1* | 5/2018 | Busby .................. H05K 1/0275 |

FOREIGN PATENT DOCUMENTS

| | | |
|---|---|---|
| DE | 19816571 A1 | 10/1999 |
| DE | 19816572 A1 | 10/1999 |
| DE | 10-2012-203955 A1 | 9/2013 |
| EP | 0 056 360 A1 | 10/1993 |
| EP | 0 629 497 A2 | 12/1994 |
| EP | 1 184 773 A1 | 3/2002 |
| EP | 1 207 444 A2 | 5/2002 |
| EP | 1 734 578 A1 | 12/2006 |
| EP | 1 968 362 A2 | 9/2008 |
| EP | 2 104 407 A1 | 9/2009 |
| EP | 1 672 464 B1 | 4/2012 |
| EP | 2 560 467 A1 | 2/2013 |
| JP | 61-297035 A | 12/1986 |
| JP | 2000-238141 A | 9/2000 |
| JP | 2013-125807 A | 6/2013 |
| JP | 2013-140112 A | 7/2013 |
| WO | WO 1999/003675 A1 | 1/1999 |
| WO | WO 1999/021142 A1 | 4/1999 |
| WO | WO 2001/063994 A2 | 8/2001 |
| WO | WO 2003/012606 A2 | 2/2003 |
| WO | WO 2003/025080 A1 | 3/2003 |
| WO | WO 2004/040505 A1 | 5/2004 |
| WO | WO 2009/042335 A1 | 4/2009 |
| WO | WO 2009/092472 A1 | 7/2009 |
| WO | WO 2010/128939 A1 | 11/2010 |
| WO | WO 2013/004292 A1 | 1/2013 |
| WO | WO 2013/0189483 A1 | 12/2013 |
| WO | WO 2014/086987 A2 | 6/2014 |
| WO | WO 2014/158159 A1 | 10/2014 |

OTHER PUBLICATIONS

Brodsky et al., "Overlapping, Discrete Tamper-Respondent Sensors", U.S. Appl. No. 15/819,540, filed Nov. 21, 2017 (111 pages).

Brodsky et al., "Tamper-Respondent Assemblies with Bond Protection", U.S. Appl. No. 15/835,557, filed Dec. 3, 2017 (111 pages).

Brodsky et al., "Tamper-Respondent Assemblies with Bond Protection", U.S. Appl. No. 15/835,569, filed Dec. 3, 2017 (108 pages).

Fisher et al., "Enclosure with Inner Tamper-Respondent Sensor(s) and Physical Security Element(s)", U.S. Appl. No. 15/835,585, filed Dec. 8, 2017 (113 pages).

Dangler et al., "Replacement List of IBM Patents and/or Patent Applications Treated as Related", U.S. Appl. No. 15/249,676, filed Aug. 29, 2016, dated Dec. 12, 2017 (3 pages).

Brodsky et al., Office Action for U.S. Appl. No. 14/941,860, filed Nov. 16, 2015 (U.S. Patent Publication No. 2017/0094820 A1), dated Apr. 12, 2017 (7 pages).

Brodsky et al., Office Action for U.S. Appl. No. 14/865,708, filed Sep. 25, 2015 (U.S. Patent Publication No. 2017/0094778 A1), dated Apr. 26, 2017 (11 pages).

Dangler et al., Office Action for U.S. Appl. No. 14/865,591, filed Sep. 25, 2015 (U.S. Patent Publication No. 2017/0094783 A1), dated May 2, 2017 (16 pages).

NIST, "Security Requirements for Cryptographic Modules", FIPS Pub. 140-2, Issued May 25, 2001 (69 pages).

Gold Phoenix Printed Circuit Board, "Why multilayer pcb is used so widely?", May 7, 2012, accessed online @ [http://www.goldphoenixpcb.com/html/Support_Resource/others/arc_110.html] on Feb. 15, 2017 (1 page).

Brodsky et al., "Tamper-Respondent Assembly with Flexible Tamper-Detect Sensor(s) Overlying In-Situ-Formed Tamper-Detect Sensor", U.S. Appl. No. 15/430,842, filed Feb. 13, 2017, (61 pages).

Brodsky et al., Office Action for U.S. Appl. No. 14/865,632, filed Sep. 25, 2015, dated Feb. 17, 2017, (20 pages).

Brodsky et al., Notice of Allowance for U.S. Appl. No. 15/409,851, filed Jan. 19, 2017, dated Mar. 20, 2017 (16 pages).

Dangler et al., International Search Report and Written Opinon for PCT/IB2016/055447, filed Sep. 13, 2016, dated Nov. 25, 2016, (10 pages).

Holm, Ragnar, "Electric Contacts: Theory and Application", Spinger-Verlag, New York, 4th Edition, 1981 (pp. 10-19).

(56) References Cited

OTHER PUBLICATIONS

Clark, Andrew J., "Physical Protection of Cryptographic Devices", Advanced in Cyprtology, Eurocrypt '87, Springer, Berlin Heidelberg (1987) (11 pages).
Halperin et al., "Latent Open Testing of Electronic Packaging", MCMC-194, IEEE (1994) (pp. 83-33).
Simek, Bob, "Tamper Restrictive Thermal Ventilation System for Enclosures Requiring Ventilation and Physical Security", IBM Publication No. IPCOM000008607D, Mar. 1, 1998 (2 pages).
Pamula et al., "Cooling of Integrated Circuits Using Droplet-Based Microfluidics", Association for Computing Machinery (ACM), GLSVLSI'03, Apr. 28-29, 2003 (pp. 84-87).
Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).
Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).
Drimer et al., "Thinking Inside the Box: System-Level Failures of Tamper Proofing", 2008 IEEE Symposium on Security and Privacy, (Feb. 2008) (pp. 281-295).
Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).
Sample et al., "Design of an RFID-Based Battery-Free Programmable Sensing Platform", IEEE Transactions on Instrumentation and Measurement, vol. 57, No. 11, Nov. 2008 (pp. 2608-2615).
Jhang et al., "Nonlinear Ultrasonic Techniques for Non-Destructive Assessment of Micro Damage in Material: A Review", International Journal of Prec. Eng. & Manuf., vol. 10, No. 1, Jan. 2009 (pp. 123-135).
Anonymous, "Consolidated Non-Volatile Memory in a Chip Stack", IBM Technical Disclosure: IP.com No. IPCOM000185250, Jul. 16, 2009 (6 pages).
Isaacs et al., "Tamper Proof, Tamper Evident Encryption Technology", Pan Pacific Symposium SMTA Proceedings (2013) (9 pages).
Anonymous, "Selective Memory Encryption", IBM Technical Disclosure: IP.com IPCOM000244183, Nov. 20, 2015 (6 pages).
Zhou et al., "Nonlinear Analysis for Hardware Trojan Detection", ICSPCC2015, IEEE (2015) (4 pages).
Harting Mitronics, "Saftey Caps for Payment Terminals", http://harting-mitronics.ch/fileadmin/hartingmitronics/case_studies/Saftey_caps_for_payment_terminals.pdf, downloaded Aug. 2016 (2 pages).
Dangler et al., "Tamper-Respondent Sensors with Formed Flexible Layer(s)", U.S. Appl. No. 14/865,551, filed Sep. 25, 2015 (113 pages).
Brodsky et al., "Overlapping, Discrete Tamper-Respondent Sensors", U.S. Appl. No. 14/865,572, filed Sep. 25, 2015 (114 pages).
Dangler et al., "Tamper-Respondent Assemblies with Region(s) of Increased Susceptibility to Damage", U.S. Appl. No. 14/865,591, filed Sep. 25, 2015 (114 pages).
Brodsky et al., "Circuit Boards and Electronic Packages with Embedded Tamper-Respondent Sensor", U.S. Appl. No. 14/865,610, filed Sep. 25, 2015 (43 pages).
Brodsky et al, "Tamper-Respondent Assemblies", U.S. Appl. No. 14/865,632, filed Sep. 25, 2015 (115 pages).
Brodksky et al., "Enclosure with Inner Tamper-Respondent Sensor(s)", U.S. Appl. No. 14/865,651, filed Sep. 25, 2015 (115 pages).
Fisher et al., "Enclosure with Inner Tamper-Respondent Sensor(s) and Physical Security Element(s)", U.S. Appl. No. 14/865,686, filed Sep. 25, 2015 (114 pages).
Brodsky et al., "Tamper-Respondent Assemblies with Bond Protection", U.S. Appl. No. 14/865,708, filed Sep. 25, 2015 (113 pages).
Brodsky et al., "Circuit Layouts of Tamper-Respondent Sensors", U.S. Appl. No. 14/886,179, filed Oct. 19, 2015 (113 pages).

Isaacs, Phillip Duane, "Tamper-Respondent Assembly with Protective Wrap(s) Over Tamper-Respondent Sensor(s)", U.S. Appl. No. 14/918,691, filed Oct. 21, 2015 (40 pages).
Brodsky et al., "Tamper-Respondent Assemblies with Bond Protection", U.S. Appl. No. 14/941,860, filed Nov. 16, 2015 (108 pages).
Fisher et al., "Enclosure with Inner Tamper-Respondent Sensor(s) and Physical Security Element(s)", U.S. Appl. No. 14/941,872, filed Nov. 16, 2015 (109 pages).
Brodsky et al, "Tamper-Respondent Assemblies", U.S. Appl. No. 14/941,887, filed Nov. 16, 2015 (109 pages).
Brodsky et al., "Circuit Boards and Electronic Packages with Embedded Tamper-Respondent Sensors", U.S. Appl. No. 14/941,908, filed Nov. 16, 2015 (41 pages).
Fisher et al., "Tamper-Respondent Assembly with Vent Structure", U.S. Appl. No. 14/955,283, filed Dec. 1, 2015 (61 pages).
Fisher et al., "Applying Pressure to Adhesive Using CTE Mismatch Between Components", U.S. Appl. No. 14/963,681, filed Dec. 9, 2015 (68 pages).
Brodsky et al., "Tamper-Respondent Assemblies with Enclosure-to-Board Protection", U.S. Appl. No. 14/974,036, filed Dec. 18, 2015 (55 pages).
Busby et al., "Multi-Layer Stack with Embedded Tamper-Detect Protection", U.S. Appl. No. 15/053,336, filed Feb. 25, 2016 (68 pages).
Campbell et al., "Tamper-Proof Electronic Packages With Two-Phase Dielectric Fluid", U.S. Appl. No. 15/139,503, filed Apr. 27, 2016 (60 pages).
Busby et al., "Tamper-Proof Electronic Packages Formed With Stressed Glass", U.S. Appl. No. 15/154,077, filed May 13, 2016 (45 pages).
Busby et al., "Tamper-Proof Electronic Packages With Stressed Glass Component Substrate(s)", U.S. Appl. No. 15/154,088, filed May 13, 2016 (56 pages).
Brodsky et al., "Circuit Layouts of Tamper-Respondent Sensors", U.S. Appl. No. 15/187,002, filed Jun. 20, 2016 (110 pages).
Brodsky et al., "Tamper-Respondent Assemblies with Enclosure-to-Board Protection", U.S. Appl. No. 15/193,525, filed Jun. 27, 2016 (54 pages).
Fisher et al., "Applying Pressure to Adhesive Using CTE Mismatch Between Components", U.S. Appl. No. 15/193,556, filed Jun. 27, 2016 (71 pages).
Busby et al., "Tamper-Respondent Assembly with Nonlinearity Monitoring", U.S. Appl. No. 15/194,738, filed Jun. 28, 2016 (48 pages).
Dangler et al., "Tamper-Respondent Sensors with Formed Flexible Layer(s)", U.S. Appl. No. 15/249,663, filed Aug. 29, 2016 (109 pages).
Brodsky et al., "Overlapping, Discrete Tamper-Respondent Sensors", U.S. Appl. No. 15/249,671, filed Aug. 29, 2016 (109 pages).
Dragone et al., "Tamper-Respondent Assembly with Sensor Connection Adapter", U.S. Appl. No. 15/268,959, filed Sep. 19, 2016 (45 pages).
Dragone et al., "Vented Tamper-Respondent Assemblies", U.S. Appl. No. 15/275,748, filed Sep. 26, 2016 (53 pages).
Dragone et al., "Tamper-Respondent Assemblies with In Situ Vent Structure(s)", U.S. Appl. No. 15/275,762, filed Sep. 26, 2016 (72 pages).
Fisher et al., Office Action for U.S. Appl. No. 14/865,686, filed Sep. 25, 2015, dated Jun. 29, 2016 (17 pages).
Brodsky et al., Office Action for U.S. Appl. No. 14/865,651, filed Sep. 25, 2015, dated Jul. 13, 2016 (10 pages).
Dangler et al., "List of IBM Patents and/or Patent Applications Treated as Related", U.S. Appl. No. 15/249,676, filed Aug. 29, 2016, dated Sep. 30, 2016 (2 pages).
Busby et al., "Tamper-Respondent Assemblies with Trace Regions of Increased Susceptibility to Breaking", U.S. Appl. No. 15/341,108, filed Nov. 2, 2016 (56 pages).
Brodsky et al., International Search Report (ISR) & Written Opinion for PCT/IB2016/055444, dated Dec. 22, 2016 (11 pages).
Brodsky et al., "Enclosure with Inner Tamper-Respondent Sensor(s)", U.S. Appl. No. 15/409,851, filed Jan. 19, 2017 (115 pages).

(56) References Cited

OTHER PUBLICATIONS

Brodsky et al., "Tamper-Respondent Assemblies with Enclosure-to-Board Protection", U.S. Appl. No. 15/423,833, filed Feb. 3, 2017 (54 pages).
Dangler et al, Non-Final Office Action for U.S. Appl. No. 14/865,551, filed Sep. 25, 2017 (U.S. Publication No. 2017/0091491 A1), dated Sep. 19, 2017 (12 pages).
Dangler et al., Final Office Action for U.S. Appl. No. 14/865,591, filed Sep. 25, 2015, dated Sep. 22, 2017 (17 pages).
Brodsky, et al., Non-Final Office Action for U.S. Appl. No. 14/865,572, filed Sep. 25, 2015, dated Jun. 16, 2017 (14 pages).
Brodsky, et al., Non-Final Office Action for U.S. Appl. No. 14/941,887, filed Nov. 16, 2015, dated Jun. 28, 2017 (20 pages).
Fisher, et al., Non-Final Office Action for U.S. Appl. No. 14/941,872, filed Nov. 16, 2015, dated Jul. 12, 2017 (11 pages).
Brodsky, et al., Final Office Action for U.S. Appl. No. 14/865,632, filed Sep. 25, 2015, dated Jul. 27, 2017 (12 pages).
Brodsky, et al., Non-Final Office Action for U.S. Appl. No. 14/941,908, filed Nov. 16, 2015, dated Aug. 2, 2017 (12 pages).
Brodsky, et al., Non-Final Office Action for U.S. Appl. No. 14/865,610, filed Sep. 25, 2015, dated Aug. 2, 2017 (11 pages).

* cited by examiner

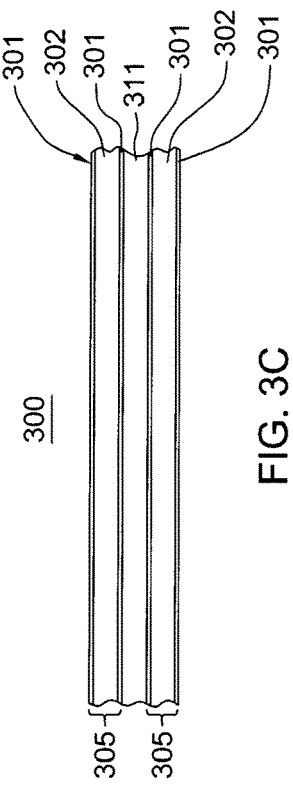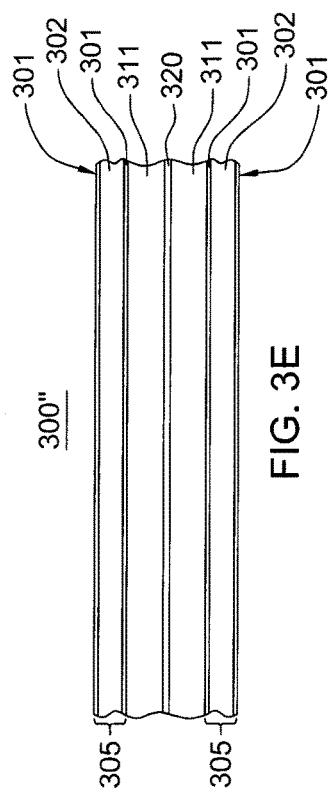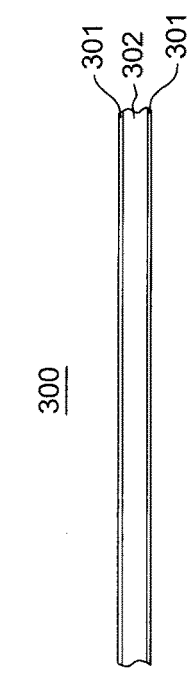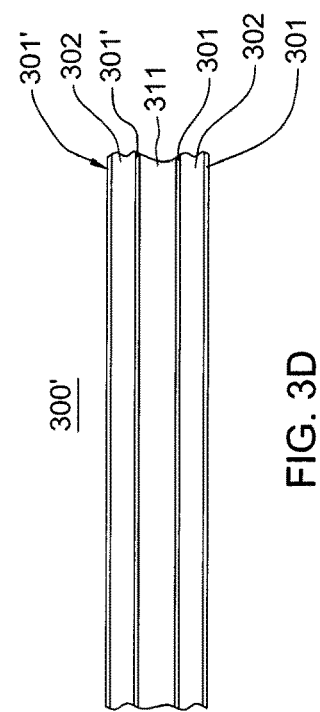
FIG. 3C
FIG. 3E
FIG. 3B
FIG. 3D

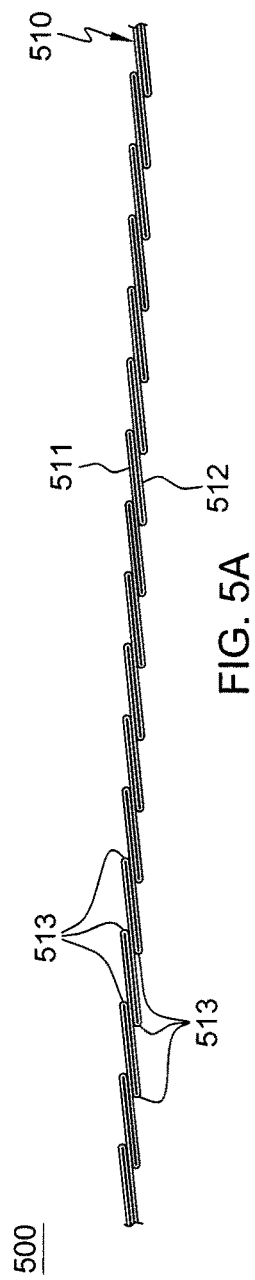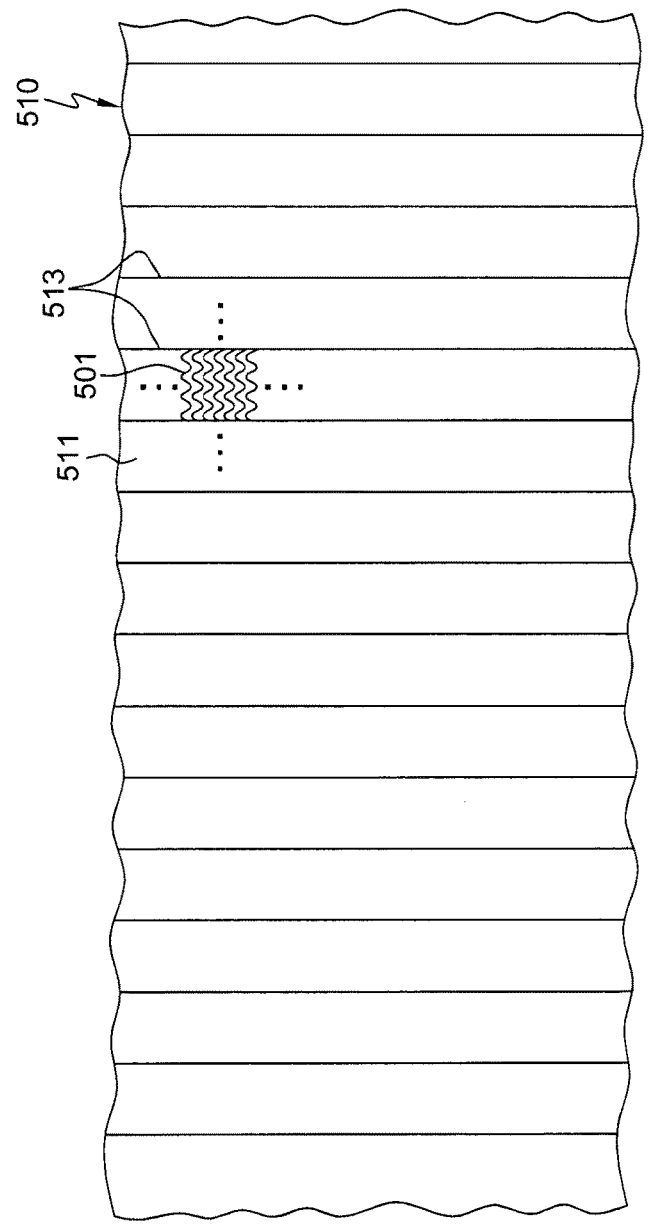

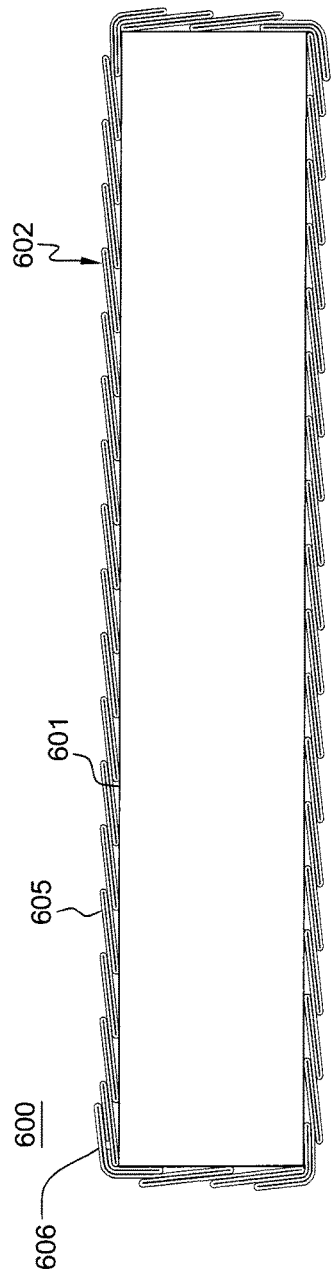
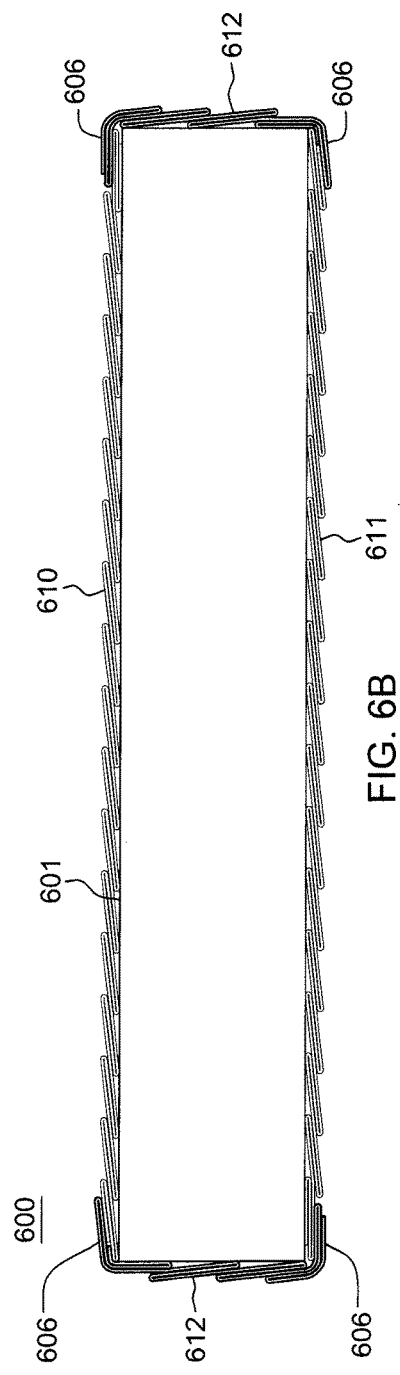

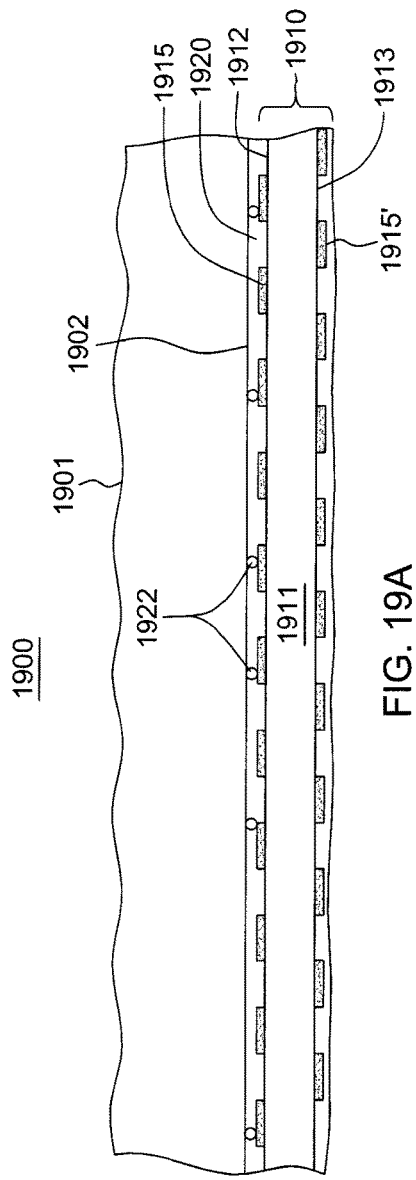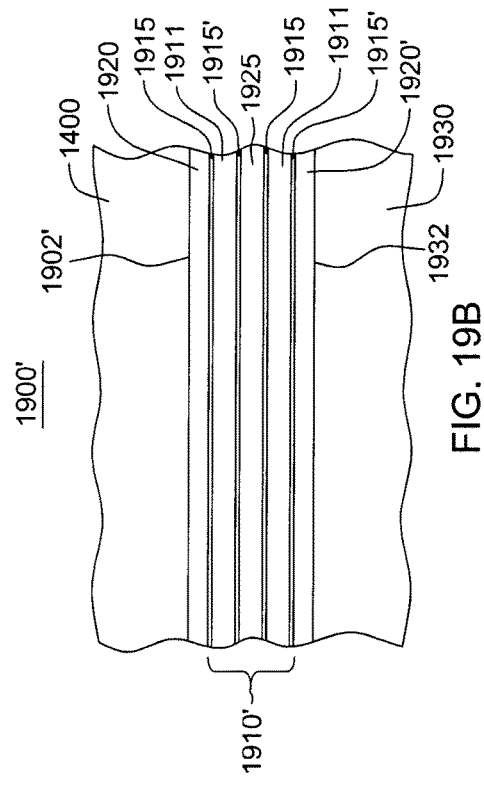
FIG. 19A
FIG. 19B

METHOD OF FABRICATING A TAMPER-RESPONDENT ASSEMBLY WITH REGION(S) OF INCREASED SUSCEPTIBILITY TO DAMAGE

BACKGROUND

Many activities require secure electronic communications. To facilitate secure electronic communications, an encryption/decryption system may be implemented on an electronic assembly or printed circuit board assembly that is included in equipment connected to a communications network. Such an electronic assembly is an enticing target for malefactors since it may contain codes or keys to decrypt intercepted messages, or to encode fraudulent messages. To prevent this, an electronic assembly may be mounted in an enclosure, which is then wrapped in a security sensor and encapsulated with polyurethane resin. A security sensor may be, in one or more embodiments, a web or sheet of insulating material with circuit elements, such as closely-spaced, conductive lines fabricated on it. The circuit elements are disrupted if the sensor is torn, and the tear can be sensed in order to generate an alarm signal. The alarm signal may be conveyed to a monitor circuit in order to reveal an attack on the integrity of the assembly. The alarm signal may also trigger an erasure of encryption/decryption keys stored within the electronic assembly.

BRIEF SUMMARY

Provided herein, in one or more aspects, is a fabrication method which includes fabricating a tamper-respondent assembly. Fabricating the tamper-respondent assembly includes providing a tamper-respondent electronic circuit structure comprising a tamper-respondent sensor. The tamper-respondent sensor includes: at least one flexible layer having opposite first and second sides; circuit lines forming, at least in part, at least one tamper-detect network, the circuit lines being disposed on at least one of the first side or the second side of the at least one flexible layer; and at least one region of the tamper-respondent sensor having an increased susceptibility to damage from mechanical stress associated with a tamper event, the at least one region of increased susceptibility to damage facilitating detection of the tamper event by the tamper-respondent sensor.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3B is a cross-sectional elevational view of another embodiment of a tamper-respondent sensor, in accordance with one or more aspects of the present invention;

FIG. 3C is a cross-sectional elevational view of another embodiment of a tamper-respondent sensor, in accordance with one or more aspects of the present invention;

FIG. 3D is a cross-sectional elevational view of a further embodiment of a tamper-respondent sensor, in accordance with one or more aspects of the present invention;

FIG. 3E depicts a cross-sectional elevational view of another embodiment of a tamper-respondent sensor, in accordance with one or more aspects of the present invention;

FIG. 5A depicts one embodiment of a tamper-respondent sensor comprising a flattened, folded layer with circuit lines, in accordance with one or more aspects of the present invention;

FIG. 5B is a partial plan view of the flattened, folded layer with circuit lines of FIG. 5A, in accordance with one or more aspects of the present invention;

FIG. 6A is a cross-sectional elevational view of a tamper-respondent assembly comprising an electronic enclosure and a tamper-respondent electronic circuit structure comprising a tamper-respondent sensor, where the tamper-respondent sensor comprises a flattened, folded layer with circuit lines that wraps around the electronic enclosure, in accordance with one or more aspects of the present invention;

FIG. 6B is a cross-sectional elevational view of a tamper-respondent assembly comprising an electronic enclosure and a tamper-respondent electronic circuit structure comprising multiple tamper-respondent sensors, where the tamper-respondent sensors comprise multiple discrete flattened, folded layers with circuit lines, wherein one flattened, folded layer along the edge or side of the enclosure wraps around and doubles over the flattened, folded layers with circuit lines located above and below the enclosure, in accordance with one or more aspects of the present invention;

FIG. 19A is a partial cross-sectional elevational view of another embodiment of a tamper-respondent assembly comprising a structure with a rigid surface and a tamper-respondent sensor secured to the rigid surface of the structure, in accordance with one or more aspects of the present invention;

FIG. 19B is a cross-sectional elevational view of another embodiment of a tamper-respondent assembly comprising a tamper-respondent sensor secured to an electronic enclosure, and to a rigid surface of another structure, such as a thermal spreader, in accordance with one or more aspects of the present invention;

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application, for establishing a secure volume about an electronic component or electronic assembly to be protected.

Figure 1:
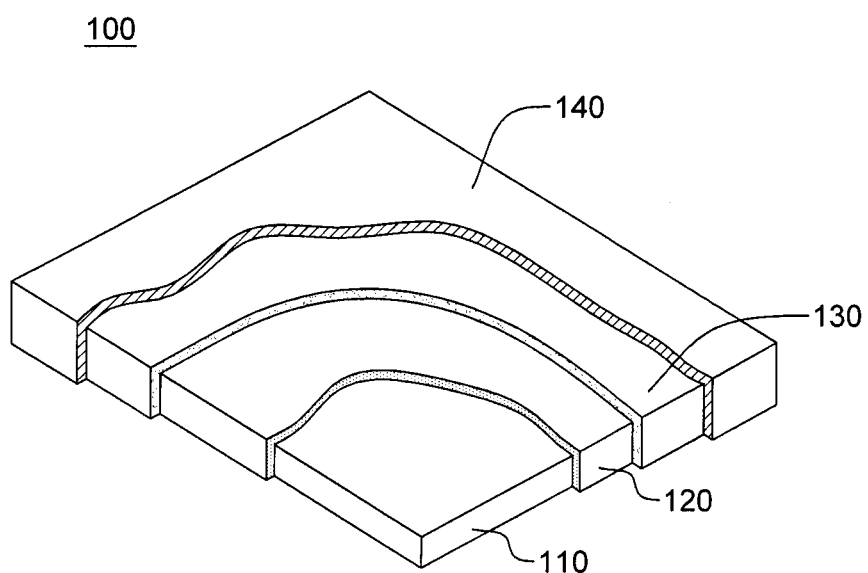
FIG. 1 is a partial cut-away of one embodiment of a tamper-proof electronic package which may incorporate a tamper-respondent electronic circuit structure, in accordance with one or more aspects of the present invention.

Reference is first made to FIG. 1 of the drawings, which illustrates one embodiment of an electronic assembly package 100 configured as a tamper-proof electronic assembly package for purposes of discussion. In the depicted embodiment, an electronic assembly enclosure 110 is provided containing, for instance, an electronic assembly, which in one embodiment may include a plurality of electronic components, such as an encryption and/or decryption module and associated memory. The encryption and/or decryption module may comprise security-sensitive information with, for instance, access to the information stored in the module requiring use of a variable key, and with the nature of the key being stored in the associated memory within the enclosure.

In one or more implementations, a tamper-proof electronic package such as depicted is configured or arranged to detect attempts to tamper-with or penetrate into electronic assembly enclosure 110. Accordingly, electronic assembly enclosure 110 also includes, for instance, a monitor circuit which, if tampering is detected, activates an erase circuit to erase information stored within the associated memory, as well as the encryption and/or decryption module within the communications card. These components may be mounted on, and interconnected by, a multi-layer circuit board, such as a printed circuit board or other multi-layer substrate, and be internally or externally powered via a power supply provided within the electronic assembly enclosure.

In the embodiment illustrated, and as one example only, electronic assembly enclosure 110 may be surrounded by a tamper-respondent sensor 120, an encapsulant 130, and an outer, thermally conductive enclosure 140. In one or more implementations, tamper-respondent sensor 120 may include a tamper-respondent laminate that is folded around electronic assembly enclosure 110, and encapsulant 130 may be provided in the form of a molding. Tamper-respondent sensor 120 may include various detection layers, which are monitored through, for instance, a ribbon cable by the enclosure monitor, against sudden violent attempts to penetrate enclosure 110 and damage the enclosure monitor or erase circuit, before information can be erased from the encryption module. The tamper-respondent sensor may be, for example, any such article commercially available or described in various publications and issued patents, or any enhanced article such as disclosed herein.

By way of example, tamper-respondent sensor 120 may be formed as a tamper-respondent laminate comprising a number of separate layers with, for instance, an outermost lamination-respondent layer including a matrix of, for example, diagonally-extending or sinusoidally-extending, conductive or semi-conductive lines printed onto a regular, thin insulating film. The matrix of lines forms a number of continuous conductors which would be broken if attempts are made to penetrate the film. The lines may be formed, for instance, by printing carbon-loaded Polymer Thick Film (PTF) ink onto the film and selectively connecting the lines on each side, by conductive vias, near the edges of the film. Connections between the lines and an enclosure monitor of the communications card may be provided via, for instance, one or more ribbon cables. The ribbon cable itself may be formed of lines of conductive ink printed onto an extension of the film, if desired. Connections between the matrix and the ribbon cable may be made via connectors formed on one edge of the film. As noted, the laminate may be wrapped around the electronic assembly enclosure to define the tamper-respondent sensor 120 surrounding enclosure 110.

In one or more implementations, the various elements of the laminate may be adhered together and wrapped around enclosure 110, in a similar manner to gift-wrapping a parcel, to define the tamper-respondent sensor shape 120. The assembly may be placed in a mold which is then filled with, for instance, cold-pour polyurethane, and the polyurethane may be cured and hardened to form an encapsulant 130. The encapsulant may, in one or more embodiments, completely surround the tamper-respondent sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

Note that, as an enhancement, within a sealed electronic package, such as the tamper-proof electronic package depicted in FIG. 1 and described above, structures and methods for facilitating heat transfer from one or more electronic components disposed therein outwards through the enclosure and any other layers of the electronic package may be provided.

Figure 2:
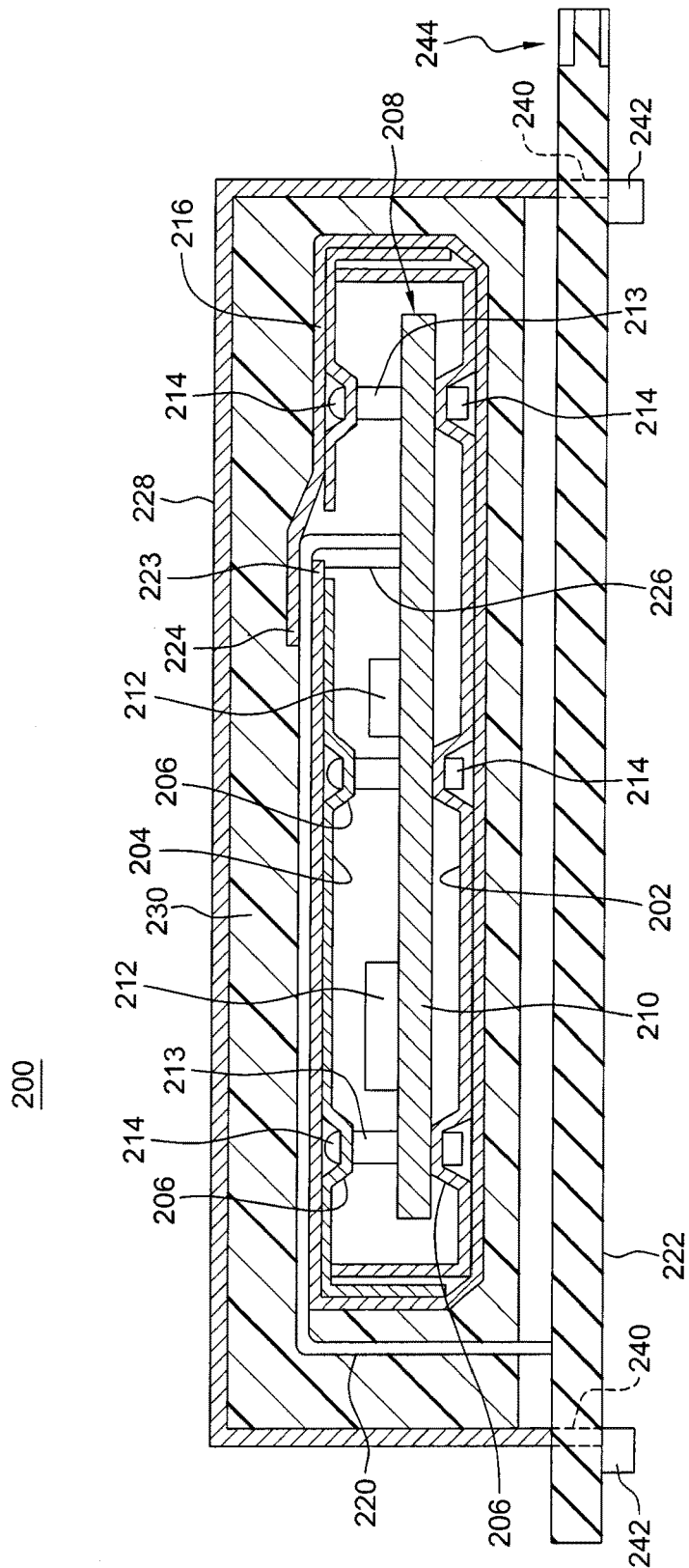
FIG. 2 is a cross-sectional elevational view of one embodiment of a prior art, tamper-proof electronic package comprising an electronic circuit.

FIG. 2 depicts in detail one embodiment of a typical tamper-proof electronic package 200. Electronic package 200 is defined by, for instance, a base metal shell 202 and a top metal shell 204. Outer surfaces of base metal shell 202 and top metal shell 204 may be provided with standoffs 206, with an electronic assembly 208 resting on standoffs 206 defined in base metal shell 202. Electronic assembly 208 may include, for instance, a printed circuit board 210 with electronic components 212 that are electrically connected via conductors (not shown) defined within or on printed circuit board 210.

Hollow spacers 213 may be placed below dimples 206 in top metal shell 204, and rivets 214 provided, extending through openings in dimples 206, through hollow spacers 213 and through openings in printed circuit board 210 to base metal shell 202 in order to fixedly secure electronic assembly 208 within the enclosure formed by base and top metal shells 202, 204. A security mesh or tamper-respondent sensor 216 is wrapped around the top, base, and four sides of the enclosure formed by base and top metal shells 202, 204. As illustrated, in one or more embodiments, top metal shell 204 may have an opening through which a bus 220 extends. One end of bus 220 may be connected to conductors (not shown) on printed circuit board 210, and the other end may be connected to conductors (not shown) on a printed circuit board 222. As bus 220 passes through the opening, the bus extends between an inner edge region 223 of the security mesh 216 and an overlapping, outer edge region 224 of the security mesh 216. A group of wires 226 connect, in one embodiment, security mesh 216 to conductors on printed circuit board 210. Circuitry on printed circuit board 210 is responsive to a break or discontinuity in security sensor array 216, in which case, an alarm signal may be emitted on bus 220, and also encryption/decryption keys stored within electronic assembly 208 may be erased.

In one or more implementations, liquid polyurethane resin may be applied to security mesh 216 and cured. An outer, thermally conductive enclosure 228, such as a copper enclosure, may be filled with liquid polyurethane resin with the electronic assembly and inner enclosure and security mesh suspended within it. Upon curing the resin, the electronic assembly and inner enclosure and security mesh become embedded in a polyurethane block or encapsulant 230, as shown. The enclosure 228 is mounted on the printed circuit board 222, which can be accomplished using, for instance, legs 240 which extend through slots in printed circuit board 222 and terminate in flanges 242, which are then bent out of alignment with the slots. Bus 220 may be connected, by way of printed circuit board 222 to connectors 244 located along, for instance, one edge of printed circuit board 222.

When considering tamper-proof packaging, the electronic package needs to maintain defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs). Security Level 4 cryptographic modules are useful for operation in physically unprotected environments. Security Level 4 also protects a cryptographic module against a security compromise due to environmental conditions or fluctuations outside of the module's normal operating ranges for voltages and temperature. Intentional excursions beyond the normal operating ranges may be used by an attacker to thwart the cryptographic module's defenses. The cryptographic module is required to either include specialized environmental protection features designed to detect fluctuations and zeroize critical security parameters, or to undergo rigorous environmental failure testing to provide reasonable assurance that the module will not be affected by fluctuations outside of the normal operating range in a manner that can compromise the security of the module.

To address the demands of ever-improving anti-intrusion technology, and the higher-performance encryption/decryption functions being provided, enhancements to the tamper-proof, tamper-evident packaging for the electronic assembly at issue are desired. Numerous enhancements are described hereinbelow to, for instance, tamper-respondent assemblies and tamper-respondent sensors. Note that the numerous inventive aspects described herein may be used singly, or in any desired combination. Additionally, in one or more implementations, the enhancements to tamper-proof electronic packaging described herein may be provided to work within defined space limitations for existing packages. For instance, one or more of the concepts described may be configured to work with peripheral component interconnect express (PCIe) size limits, and the limitations resulting from being capsulated in, for instance, an insulating encapsulant.

Thus, disclosed hereinbelow with reference to FIGS. 3A-21C are various approaches and/or enhancements to creating a secure volume for accommodating one or more electronic components, such as one or more encryption and/or decryption modules and associated components of a communications card or other electronic assembly.

Figure 3A:
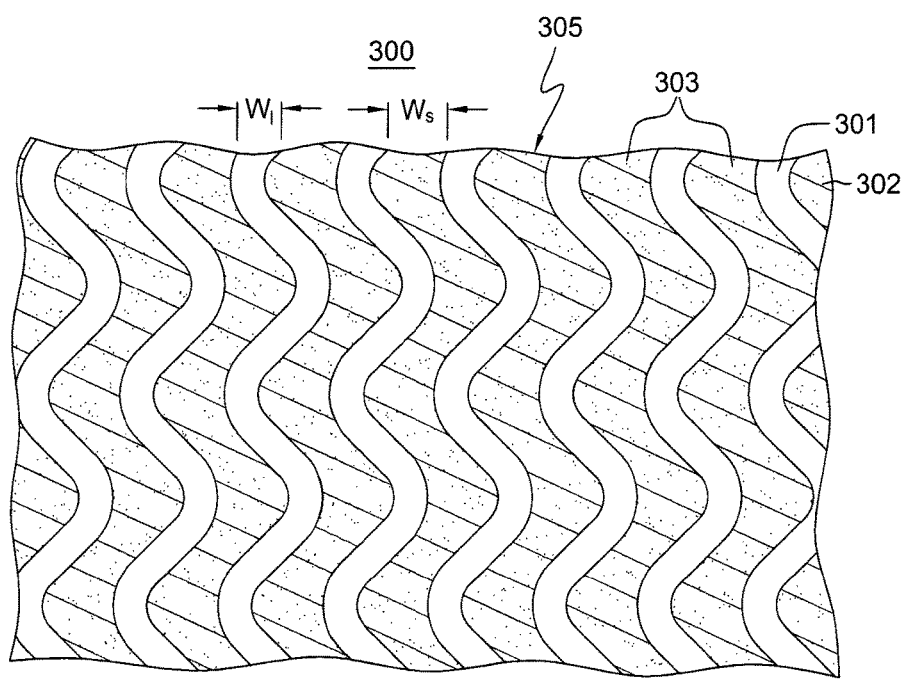
FIG. 3A depicts one embodiment of a tamper-respondent sensor comprising one or more flexible layers and circuit lines forming at least one tamper-detect network, in accordance with one or more aspects of the present invention.

FIG. 3A depicts a portion of one embodiment of a tamper-respondent layer 305 (or laser and pierce-respondent layer) of a tamper-respondent sensor 300 or security sensor, such as discussed herein. In FIG. 3A, the tamper-respondent layer 305 includes circuit lines or traces 301 provided on one or both opposite sides of a flexible layer 302, which in one or more embodiments, may be a flexible insulating layer or film. FIG. 3A illustrates circuit lines 301 on, for instance, one side of flexible layer 302, with the traces on the opposite side of the film being, for instance, the same pattern, but (in one or more embodiments) offset to lie directly below spaces 303, between circuit lines 301. As described below, the circuit lines on one side of the flexible layer may be of a line width $W_1$ and have a pitch or line-to-line spacing $W_s$ such that piercing of the layer 305 at any point results in damage to at least one of the circuit lines traces 301. In one or more implementations, the circuit lines may be electrically connected in-series or parallel to define one or more conductors which may be electrically connected in a network to an enclosure monitor, which monitors the resistance of the lines, as described herein. Detection of an increase, or other change, in resistance, caused by cutting or damaging one of the traces, will cause information within the encryption and/or decryption module to be erased. Providing conductive lines 301 in a pattern, such as a sinusoidal pattern, may advantageously make it more difficult to breach tamper-respondent layer 305 without detection. Note, in this regard, that conductive lines 301 could be provided in any desired pattern. For instance, in an alternate implementation, conductive lines 301 could be provided as parallel, straight conductive lines, if desired, and the pattern or orientation of the pattern may vary between sides of a layer, and/or between layers.

As noted, as intrusion technology continues to evolve, anti-intrusion technology needs to continue to improve to stay ahead. In one or more implementations, the above-summarized tamper-respondent sensor 300 of FIG. 3A may be disposed over an outer surface of an electronic enclosure, such as an electronic enclosure described above in connection with FIGS. 1 & 2. Alternatively, as described further herein, the tamper-respondent sensor may cover or line an inner surface of an electronic enclosure to provide a secure volume about at least one electronic component to be protected. Numerous enhancements to the tamper-respondent sensor itself are described below.

In one or more aspects, disclosed herein is a tamper-respondent sensor 300 with circuit lines 301 having reduced line widths $W_1$ of, for instance, 200 µm, or less, such as less than or equal to 100 µm, or even more particularly, in the range of 30-70 µm. This is contrasted with conventional trace widths, which are typically on the order of 350 µm or larger. Commensurate with reducing the circuit line width $W_1$, line-to-line spacing width $W_s$ 303 is also reduced to less than or equal to 200 µm, such as less than or equal to 100 µm, or for instance, in a range of 30-70 µm. Advantageously, by reducing the line width $W_1$ and line-to-line spacing $W_s$ of circuit lines 301 within tamper-respondent sensor 300, the circuit line width and pitch is on the same order of magnitude as the smallest intrusion instruments currently available, and therefore, any intrusion attempt will necessarily remove a sufficient amount of a circuit line(s) to cause resistance to change, and thereby the tamper intrusion to be detected. Note that, by making the circuit line width of the smaller dimensions disclosed herein, any cutting or damage to the smaller-dimensioned circuit line will also be more likely to be detected, that is, due to a greater change in resistance. For instance, if an intrusion attempt cuts a 100 µm width line by 50%, it reduces the remaining available line width for conducting current to 50 µm. This change is more likely to result in a detectable change in resistance, compared with, for instance, a 50% reduction in a more conventional line width of 350 µm to, for instance, 175 The smaller the conductive circuit line width becomes, the more likely that a tampering of that line will be detected.

Note also that a variety of materials may advantageously be employed to form the circuit lines. For instance, the circuit lines may be formed of a conductive ink (such as a carbon-loaded conductive ink) printed onto one or both opposite sides of one or more of the flexible layers 302 in a stack of such layers. Alternatively, a metal or metal alloy could be used to form the circuit lines, such as copper, silver, silver carbon, or nickel-phosphorus (NiP), or Omega-Ply®, offered by Omega Technologies, Inc. of Culver City, Calif. (USA), or Ticer™ offered by Ticer Technologies, Chandler, Ariz. (USA). Note that the process employed to form the fine circuit lines or traces on the order described herein is dependent, in part, on the choice of material used for the circuit lines. For instance, if copper circuit lines are being fabricated, then additive processing, such as plating up copper traces, or subtractive processing, such as etching away unwanted copper between trace lines, may be employed. By way of further example, if conductive ink is employed as the circuit line material, fine circuit lines on the order disclosed herein can be achieved by focusing on the rheological properties of the conductive ink formulation. Further, rather than simple pneumatics of pushing conductive ink through an aperture in a stencil with a squeegee, the screen emulsion may be characterized as very thin (for instance, 150 to 200 µm), and a squeegee angle may be used such that the ink is sheared to achieve conductive ink breakaway rather than pumping the conductive ink through the screen apertures. Note that the screen for fine line width printing such as described herein may have the following characteristics in one specific embodiment: a fine polyester thread for both warp and weave on the order of 75 micrometers; a thread count between 250-320 threads per inch; a mesh thickness of, for instance, 150 micrometers; an open area between threads that is at least 1.5× to 2.0× the conductive ink particle size; and to maintain dimensional stability of the print, the screen snap-off is kept to a minimum due the screen strain during squeegee passage.

In one or more implementations, circuit lines 301 of tamper-respondent sensor 300 are electrically connected to define one or more resistive networks. Further, the circuit lines may include one or more resistive circuit lines by selecting the line material, line width $W_1$ and line length $L_1$, to provide a desired resistance per line. As one example, a "resistive circuit line" as used herein may comprise a line with 1000 ohms resistance or greater, end-to-end. In one specific example, a circuit line width of 50 μm, with a circuit line thickness of 10 μm may be used, with the line length $L_1$ and material selected to achieve the desired resistance. At the dimensions described, good electrical conductors such as copper or silver may also be employed and still form a resistive network due to the fine dimensions noted. Alternatively, materials such as conductive ink or the above-noted Omega-Ply® or Ticer™ may be used to define resistive circuit lines.

In a further aspect, the flexible layer 302 itself may be further reduced in thickness from a typical polyester layer by selecting a crystalline polymer to form the flexible layer or substrate. By way of example, the crystalline polymer could comprise polyvinylidene difluoride (PVDF), or Kapton, or other crystalline polymer material. Advantageously, use of a crystalline polymer as the substrate film may reduce thickness of the flexible layer 302 to, for instance, 2 mils thick from a more conventional amorphous polyester layer of, for instance, 8 mils. A crystalline polymer can be made much thinner, while still maintaining structural integrity of the flexible substrate, which advantageously allows for far more folding, and greater reliability of the sensor after folding. Note that the radius of any fold or curvature of the sensor is necessarily constrained by the thickness of the layers comprising the sensor. Thus, by reducing the flexible layer thickness to, for instance, 2 mils, then in a four tamper-respondent layer stack, the stack thickness can be reduced from, for instance, 30 mils in the case of a typical polyester film, to 10 mils or less with the use of crystalline polymer films.

As noted, the circuit lines 301 forming the at least one resistive network may be disposed on either the first side or the second side of the opposite sides of the flexible layer(s) 302 within the tamper-respondent sensor 300, or on both the first and second sides. One embodiment of this depicted in FIG. 3B, wherein circuit lines 301 are illustrated on both opposite sides of flexible layer 302. In this example, circuit lines 301 on the opposite sides of the tamper-respondent sensor 302 may each have line widths $W_1$ less than or equal to 200 μm, and those lines widths may be the same or different. Further, the line-to-line spacing width $W_s$ between adjacent lines of the circuit lines 301 may also be less than or equal to 200 μm, and may also be the same or different. In particular, the circuit lines may be different line widths on the two different sides of the tamper-respondent layer, and the line-to-line spacing widths may also be different. For instance, a first side of the tamper-respondent layer may have circuit line widths and line-to-line spacings of approximately 50 microns, while the second side of the tamper-respondent layer may have circuit lines and line-to-line spacing of 70 microns. Intrusion through the sensor is potentially made more difficult by providing such different widths. Circuit lines 301 on the opposite sides of the flexible layer 302 may also be in the same or different patterns, and in the same or different orientations. If in the same pattern, the circuit lines may be offset, as noted above, such that the circuit lines of one side align to spaces between circuit lines on the other side.

As illustrated in FIG. 3C, the tamper-respondent sensor 300 may comprise a stack of tamper-respondent layers 305 secured together via an adhesive 311, such as a double-sided adhesive film. The process may be repeated to achieve any desired number of tamper-respondent layers, or more particularly, any desired number of layers of circuit lines 301 within the tamper-respondent sensor to achieve a desired anti-intrusion sensor.

An alternate tamper-respondent sensor 300' is depicted in FIG. 3D, where multiple flexible layers 302 with circuit lines are secured together via an adhesive 311, and by way of example, circuit lines are provided on one or both sides of each flexible layer. In this example, a first flexible layer 302 has first circuit lines 301 and a second flexible layer 302 has second circuit lines 301'. In one or more implementations the first circuit lines may have a first line width $W_1$ and the second circuit lines may have a second line width $W_1$, where the first line width of the first circuit lines 301 is different from the second line with the second circuit lines 301'. For instance, the first circuit line width may be 50 μm, and the second circuit line width may be 45 μm. Note that any desired combination of circuit line widths may be employed in this example, which assumes that the circuit line widths may be different between at least two of the layers. Additionally, the first circuit lines 301 of the first flexible layer may have first line-to-line spacing width $W_s$ and the second circuit lines 301' of second flexible layer may have a second line-to-line spacing width $W_s$, where the first line-to-line spacing width of the first circuit lines may be different from the second line-to-line spacing width of the second circuit lines. Note that this concept applies as well to circuit lines on only one side of flexible layer 302, where two or more of the flexible layers in the stack defining the tamper-respondent sensor may have different circuit line widths and/or different line-to-line spacing widths. This concept may be extended to any number of tamper-respondent layers within the tamper-respondent sensor to provide a desired degree of tamper protection.

In addition, or alternatively, the first circuit lines 301 of the first flexible layer may be formed of a first material, and the second circuit lines 301' of the second flexible layer may be formed of a second material, where the first material of the first circuit lines 301 may be different from the second material of the second circuit lines 301'. For instance, first circuit lines 301 may be formed of conductive ink, and second circuit lines 301' may be formed of a metal, such as copper. By providing tamper-respondent sensor 300' with at least some of the circuit lines formed of a metal material, such as copper, enhanced tamper detection may be obtained. For instance, an intrusion tool passing through one or more layers of circuit lines 301' formed of a metal could generate debris which may be distributed during the intrusion attempt and result in shorting or otherwise damaging one or more other tamper-respondent layers within the tamper-respondent sensor 300'. If desired, more than two materials may be employed in more than one layers of circuit lines within the tamper-respondent sensor.

FIG. 3E depicts another embodiment of a tamper-respondent assembly 300", in accordance with one or more aspects of the present invention. In this implementation, multiple tamper respondent layers 305 are secured with another flexible layer 320 in a stack using, for instance, one or more layers of an adhesive film 311. In one or more implementations, the another flexible layer 320 could comprise a malleable metal film. In the example shown, the malleable metal film is disposed between two tamper-respondent layers 305, and thus, is disposed between two layers of circuit lines 301 on the different tamper-respondent layers 305. By way of example, malleable metal film 320 could comprise a sheet of copper or a copper alloy. By providing a thin malleable metal film 320 on the order of, for instance, 0.001" thickness, an attempt to penetrate through tamper-respondent sensor 300" would necessarily pass through malleable metal film 320, and in so doing generate debris which would be carried along by the intrusion tool or drill. This metal debris would facilitate detection of the intrusion attempt by potentially shorting or otherwise damaging one or more of the tamper-respondent layers 305 within tamper-respondent sensor 300". As a variation, the malleable metal film 320 could be applied directly to one side of a flexible layer 302 with the opposite side having circuit lines forming the at least one resistive network. Note that a similar concept applies where one or more of the layers of circuit lines 301 are formed of metal circuit lines, such as copper or silver, and other layers of circuit lines 301 are formed of, for instance, conductive ink. In such embodiments, clipping of one or more metal lines would generate metal debris that could carried along by the intrusion tool and ultimately interact with one or more other circuit lines of the tamper-respondent electronic circuit structure to enhance the likelihood of damage and thus detection of the intrusion attempt.

Based on the description provided herein, those skilled in the art will understand that the tamper-respondent sensors described above in connection with FIGS. 3A-3E may be employed with any of a variety of different tamper-respondent assemblies, and if desired, may be pre-formed in any of the various configurations described herein below. For instance, one or more of the tamper-respondent sensors of FIGS. 3A-3E could be used in conjunction with an electronic enclosure to enclose, at least in part, one or more electronic components to be protected, with the tamper-respondent sensor overlying or being adhered to an outer surface of the electronic enclosure. Alternatively, in one or more implementations, the tamper-respondent sensor could be provided to cover or line an inner surface of the electronic enclosure, such as in one or more of the tamper-respondent assembles described below.

Figure 4A:
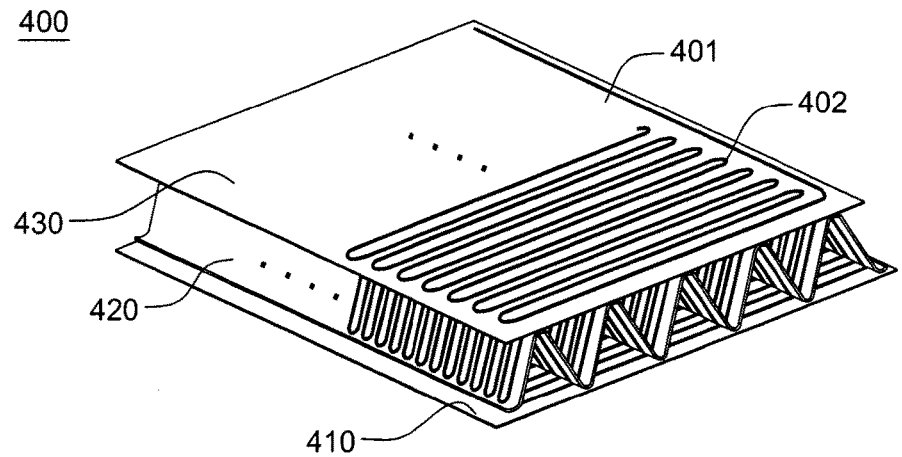
FIG. 4A is a partial depiction of one embodiment of a tamper-respondent sensor comprising a corrugated layer of flexible dielectric with circuit lines, in accordance with one or more aspects of the present invention.
Figure 4B:
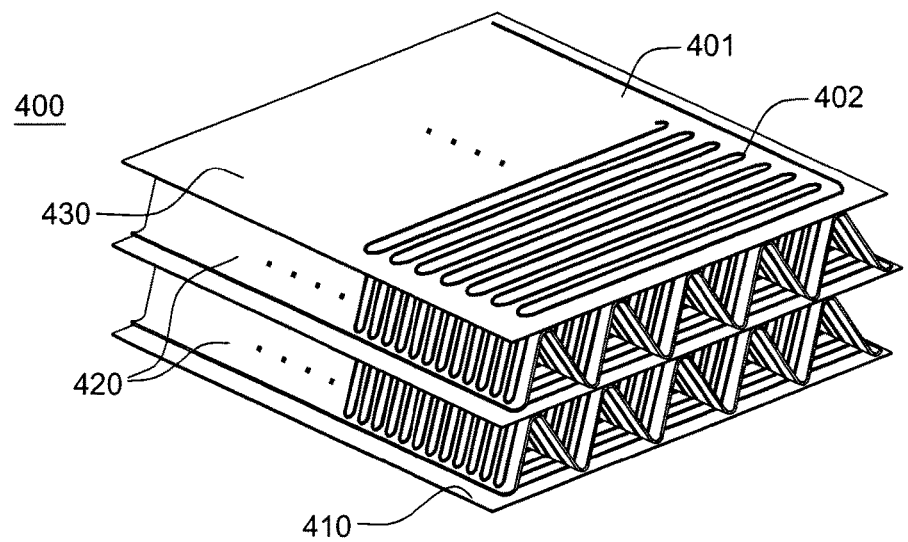
FIG. 4B depicts an alternate embodiment of a tamper-respondent sensor comprising multiple corrugated layers of flexible dielectric with circuit lines, in accordance with one or more aspects of the present invention.

In contrast to a prior tamper-respondent sensor which may utilize a single substrate of flexible dielectric with circuit lines, either on the upper or lower surface, or both surfaces, provided herein are tamper-respondent sensors which comprise, in one or more embodiments, multiple layers of materials and circuits to provide an enhanced tamper-proof, tamper-evident packaging, to meet the demands of ever-improving anti-intrusion technology requirements to protect encryption/decryption functions. By way of example, FIGS. 4A & 4B depict tamper-respondent sensors comprising stacks of layers, each of which include at least one formed flexible layer, which may be configured, by way of example, as a corrugated layer of flexible dielectric with circuit lines on one or both sides. Note that as used herein, a "formed layer" refers to a specially-shaped layer manufactured with, for instance, curvatures extending, at least in part, out-of-plane. For example, in the case of a corrugated layer as shown, the curvatures have a vertical component that results in an undulation of the formed layer.

As illustrated in FIG. 4A, a tamper-respondent sensor 400 may include, by way of example, a first sensor layer 410, a second sensor layer 420, and a third sensor layer 430, with the second sensor layer 420 being sandwiched between the first and third sensor layers 410, 430. In this configuration, second sensor layer 420 comprises a formed flexible layer 401 having opposite first and second sides with circuit lines 402 comprising, for instance, conductive lines, such as metal lines (e.g., Cu or Au lines), wires, printed conductive ink (e.g., carbon ink), resistive materials, etc., which form at least one resistive network on at least one of the first side or the second side of the formed flexible layer. In one or more embodiments, the circuit lines may comprise fine-pitched line circuitry, for instance, circuit lines in the 20-50 micron width range, and 20-50 micron spaces between the circuit lines. In one or more implementations, the formed flexible layer comprises, at least in part, a dielectric material (such as polyimide, Mylar™, Teflon™, etc.), with the layer in such an example being referred to as a corrugated layer of flexible dielectric that has the circuit lines overlying, at least in part, the curvatures of the corrugated layer of flexible dielectric, as illustrated. Note in the example of FIG. 4A, a cross-section through the tamper-respondent sensor 400 intersects multiple layers of circuit lines on the different sensor layers. The wiring patterns of the circuit lines may be in any desired configuration. For instance, circuit lines may be orthogonal or angled, or randomly arranged, with respect to adjacent or underlying or overlying circuit lines of the tamper-respondent sensor. This option applies to any of the tamper-respondent sensors disclosed herein, where circuit lines are provided on multiple different surfaces of a tamper-respondent sensor. As a further variation, each tamper-respondent electronic circuit structure may have a unique circuit line configuration or set of circuit line configurations associated with, for instance, a serial number of the tamper-respondent electronic circuit structure being provided. Also, any desired number of sensor layers may be associated with the at least one formed flexible layer of the tamper-respondent sensor.

Therefore, in one or more embodiments, first sensor layer 410 and third sensor layer 430 may also each comprise a flexible layer of material having circuit lines forming one or more resistive networks disposed on the first and/or second sides thereof. For instance, conductive circuit lines may be provided on both the first and second sides of the flexible layers of the first sensor layer 410, the second sensor layer 420, and the third sensor layer 430, such that a vertical cross-section through the stack of layers intersects multiple layers of circuit lines. In this configuration, forming the second sensor layer 420 with curvatures, for instance, forming the second layer to be corrugated, advantageously enhances protection against physical intrusion, such as by a drill, without detection by the resistive networks by making the location of the circuit lines defining the resistive network(s) harder to identify.

By way of example, the second sensor layer 420 may initially comprise a thin, flexible layer of material, such as a thin, flexible layer with a thickness comparable to the desired minimum radius of the bending curvature for the desired corrugation of the second sensor layer. In one or more implementations, the second sensor layer may be corrugated by obtaining a flat, flexible sensor which is then fed through a set of heated top and bottom rollers, each with mating gear teeth to create the desired sinusoidal pattern in the sensor layer. One or more outer circuit layers or films comprising the circuit lines forming the one or more resistive networks may then be laminated, as desired, to one or both of the first and second sides of the formed layer to define the formed, flexible layer. In one or more implementations, an adhesive may be employed to affix the circuit layers or films comprising the one or more resistive networks to the formed layer. By way of example, the adhesive could include a PSA, epoxy, acrylic, thermoset, thermoplastic, electrically conductive epoxy, thermally conductive epoxy, etc., one or more of which could also be employed to affix the multiple sensor layers 410, 420, 430 together within the stack of layers.

As illustrated in FIG. 4B, multiple second, corrugated layers 420 of flexible dielectric with circuit lines may be provided in the stack of layers of the tamper-respondent sensor 400 with, for instance, adjacent corrugated layers of flexible dielectric being separated by a substantially flat flexible layer, with or without additional circuit lines defining one or more additional resistive networks. In the embodiment depicted, adjacent corrugated layers of flexible dielectric with circuit lines are separated by a sensor layer 425, which again may include circuit lines on one or both sides thereof.

Connections of the tamper-respondent sensors, and sensor layers, described herein to, for instance, monitor circuitry disposed within the associated secure volume defined by the tamper-respondent electronic circuit structure may comprise input/output contacts or connectors formed on one or more edges of the tamper-respondent sensor (or sensor layer) or, for instance, one or more ribbon cables extending from the tamper-respondent sensor into the secure volume, as will be understood by one skilled in the art.

FIGS. 5A & 5B depict another embodiment of a tamper-respondent sensor 500, in accordance with one or more aspects of the present invention. As illustrated, tamper-respondent sensor 500 includes at least one formed flexible layer 510 having opposite first and second surfaces 511, 512. Circuit lines 501 forming at least one resistive network are provided on at least one of the first or second sides 511, 512 of formed flexible layer 510. As noted, the circuit lines may comprise any desired pattern of conductive circuit lines advantageous for a particular tamper-respondent sensor technology, and may include multiple sets of circuit lines in different regions or zones of the formed flexible layer. By way of example, the circuit lines may comprise conductive lines such as metal lines (e.g., copper lines), wires, printed conductive ink (e.g., carbon ink), etc. provided on one or both of the first and second sides of formed flexible layer 510. As illustrated in FIG. 5A, the formed flexible layer again includes curvatures 513, with the formed flexible layer with curvatures being collapsed as a flattened, folded layer in this embodiment. Note that circuit lines 501 forming the at least one resistive network on the first side 511 or second side 512 of formed flexible layer 510 overlie, at least in part, at least some of curvatures 513, such that the circuit lines wrap over or within the curvatures 513 and in transverse cross-section view, provide multiple layers of circuit lines formed on the same curving surface of the formed flexible layer. In one or more embodiments, formed flexible layer 510 may be a corrugated layer that has been flattened by applying a z-direction force with a metered x-y shear force, creating a controlled, flattening collapse of the multi-dimensional, formed flexible layer 510.

Figure 5C:
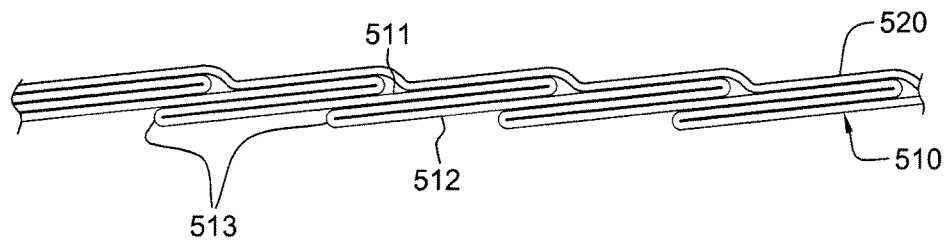
FIG. 5C is a partial cross-sectional elevational view of a tamper-respondent sensor comprising a flattened, folded layer with circuit lines, and at least one other layer overlying one or both sides of the flattened, folded layer, in accordance with one or more aspects of the present invention.

FIGS. 5C-5H depict various examples of a tamper-respondent sensor comprising a stack of layers, with one or more of the layers comprising a formed flexible layer 510, such as described above in connection with FIGS. 5A & 5B. By way of example, FIG. 5C depicts a stack of layers comprising formed flexible layer 510 with at least one other layer 520 overlying one or both of first side 511 and second side 512 of formed flexible layer 510. In one or more embodiments, the at least one other layer 502 overlying the formed flexible layer 510 may be, or include, an opaque layer of material to mask location of the circuit lines, or a breakable layer of material that will shatter with tampering and facilitate damaging the circuit lines forming the at least one resistive network to assist with detection of the attack on the tamper-respondent sensor. In one or more implementations, the opaque layer of material may be dark, non-transparent material obscuring what lies beneath, or, in one or more embodiments, the opaque material could be the same color material as the resistive circuit lines of the underlying layer, both obscuring and camouflaging the covered circuit lines.

Figure 5D:
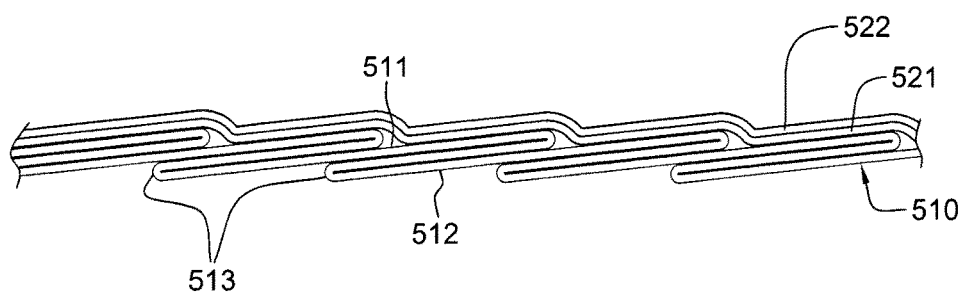
FIG. 5D depicts another embodiment of the tamper-respondent sensor of FIG. 5C, further comprising a breakable layer for enhanced tamper-detection capabilities, in accordance with one or more aspects of the present invention.

In FIG. 5D, multiple other layers 521, 522 overlie one or both sides 511, 512 of formed flexible layer 510. In one example, the multiple other layers may include both a breakable layer 521 and an opaque layer 522 disposed on one side of formed flexible layer 510, or both sides of formed flexible layer 510.

Figure 5E:
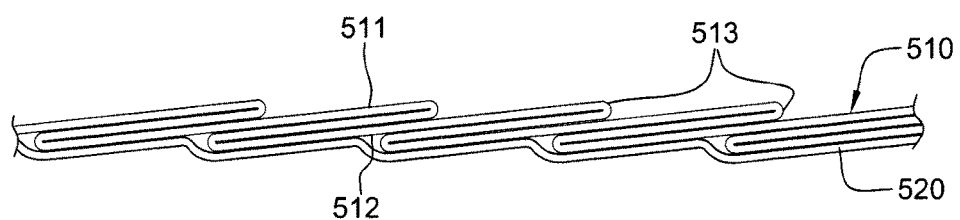
FIG. 5E is a partial cross-sectional elevational view of a tamper-respondent sensor comprising a flattened, folded layer with circuit lines, and at least one other layer overlying the lower surface of the flattened, folded layer, in accordance with one or more aspects of the present invention.
Figure 5F:
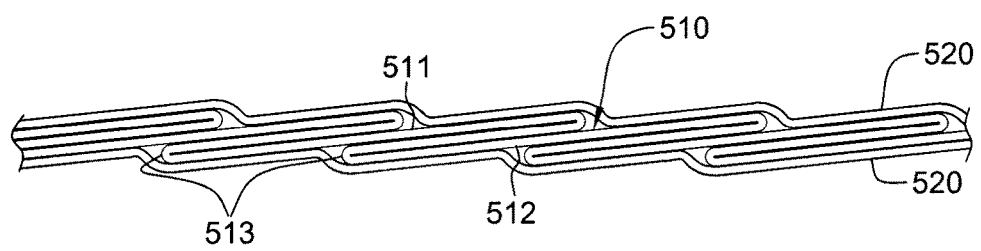
FIG. 5F is a partial cross-sectional elevational view of a further embodiment of a tamper-respondent sensor comprising a flattened, folded layer with circuit lines sandwiched between two other layers overlying opposite sides of the flattened, folded layer, in accordance with one or more aspects of the present invention.

In further embodiments, one or more of the other layers may themselves comprise a flexible dielectric material with circuit lines forming at least one other resistive network on one of the first side or second side thereof. FIG. 5E depicts one other layer 520 overlying second side 512 of formed flexible layer 510, and FIG. 5F depicts one other layer 520 overlying first side 511, and one other layer 520 overlying second side 512 of formed flexible layer 510.

Figure 5G:
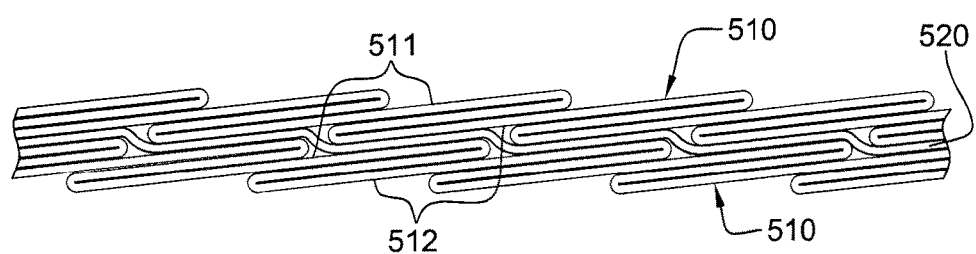
FIG. 5G depicts a partial cross-sectional elevational view of another embodiment of a tamper-respondent sensor which comprises multiple flattened, folded layers with circuit lines separated by at least one other layer in a stack of layers, in accordance with one or more aspects of the present invention.
Figure 5H:
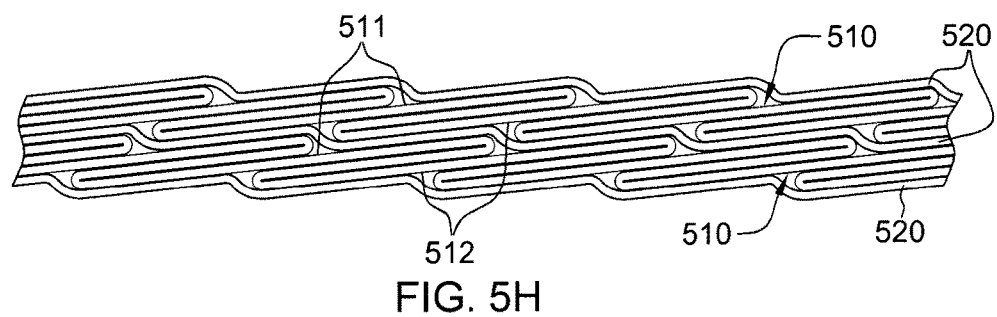
FIG. 5H depicts a partial cross-sectional elevational view of a further embodiment of a tamper-respondent sensor comprising a stack of layers with multiple flattened, folded layers with circuit lines, and multiple other layers, for instance, multiple other flexible layers, disposed above and/or below the flattened, folded layers with circuit lines, in accordance with one or more aspects of the present invention.

FIGS. 5G & 5H depict additional embodiments of a tamper-respondent sensor 500 comprising a stack of layers. In these embodiments, multiple formed flexible layers 510 are provided along with one or more other layers overlying one or more sides 511, 512 of the formed flexible layers 510. As noted, the one or more other layers may comprise a variety of layers, such as an opaque flexible layer, a breakable layer, or additional flexible layers with circuit lines forming additional resistive networks of the tamper-respondent sensor, as desired to provide enhanced tamper-proof, tamper evident packaging for a particular application.

Figure 6C:
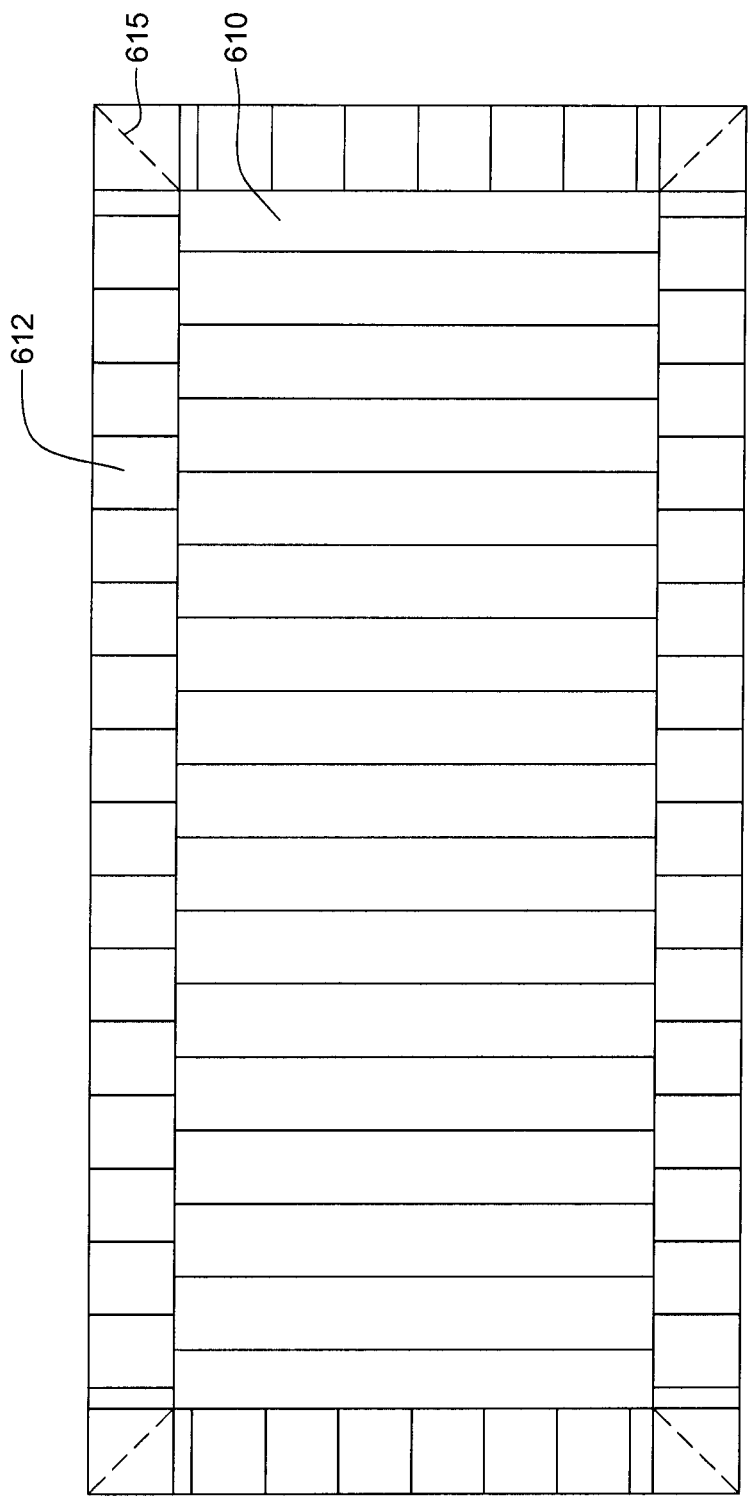
FIG. 6C is an upper (or lower) plan view of one embodiment of the tamper-respondent assembly of FIG. 6B, in accordance with one or more aspects of the present invention.

FIGS. 6A-6G depict various embodiments of a tamper-respondent assembly, generally denoted 600, within which a secure volume is defined for protecting one or more electronic components or an electronic assembly, such as discussed herein. Referring to FIG. 6A, tamper-respondent assembly 600 may include an electronic enclosure 601, such as a rigid, conductive enclosure, and a tamper-respondent electronic circuit structure 602 associated with the electronic enclosure 601. As shown, tamper-respondent electronic circuit structure 602 comprises a tamper-respondent sensor 605. In one or more implementations, tamper-respondent sensor 605 includes at least one formed flexible layer having opposite first and second sides, circuit lines forming at least one resistive network disposed on at least one of first or second sides, and formed curvatures provided within the formed flexible layer, with the circuit lines overlying, at least in part, the curvatures of the formed flexible layer, such as described above in connection with the exemplary embodiments of FIGS. 4A-5H.

In the implementation of FIG. 6A, a single, continuous tamper-respondent sensor 605 is provided, which is wrapped around to encircle electronic enclosure 601, and which includes overlaps 606 where the ends join along the electronic enclosure 601. For instance, the single, continuous tamper-respondent sensor 605 could be folded around electronic enclosure 601 in any manner analogous to wrapping a present. By way of example only, electronic enclosure 601 may be a 6-sided metal container, sized to accommodate the electronic to be protected. Further, in this configuration, tamper-respondent sensor 605, configured as described herein, may be employed in an electronic assembly package such as described initially in connection with FIGS. 1 & 2.

FIGS. 6B-6G depict further embodiments of tamper-respondent assembly 600. In one or more of these embodiments, multiple discrete tamper-respondent sensors 610, 611, 612, are illustrated. By way of example, each tamper-respondent sensor may include one or more formed flexible layers with circuit lines extending, at least in part, over the curvatures of the formed flexible layers, such as described herein.

In the example of FIG. 6B an upper tamper-respondent sensor 610 and a lower tamper-respondent sensor 611 are provided overlying the upper and lower main surfaces, respectively, of electronic enclosure 601. Additionally, a sidewall tamper-respondent sensor 612 wraps around the edge of electronic enclosure 601, and in this example, is of sufficient width to fold over and thus overlap 606 upper tamper-respondent 610 and lower tamper-respondent 611, as illustrated. The extent of overlap 606 may be customized as desired to inhibit a line of attack through the tamper-respondent electronic circuit structure at the seams where different tamper-respondent sensors 610, 611, 612 meet.

FIG. 6C is an upper plan view of one embodiment of the assembly of FIG. 6B, with tamper-respondent sensor 612 shown wrapping over upper tamper-respondent sensor 610 provided over the upper main surface of electronic enclosure 601. An analogous wrapping of tamper-respondent sensor 612 over the lower tamper-respondent sensor may also be employed. Note in this configuration the provision of diagonal folds 615 at the corners, where tamper-respondent sensor 612 overlaps upper tamper-respondent sensor 610. This overlap and fold example of FIG. 6C is provided by way of example only, and other overlap and fold configurations may be employed, without departing from the scope of the claims presented herewith. In this six-sided enclosure example, sidewall tamper-respondent sensor 612 is a separate sensor that wraps around the perimeter of electronic assembly enclosure 601, and overlaps the upper and lower tamper-respondent sensors 610, 611, respectively.

Figure 6D:
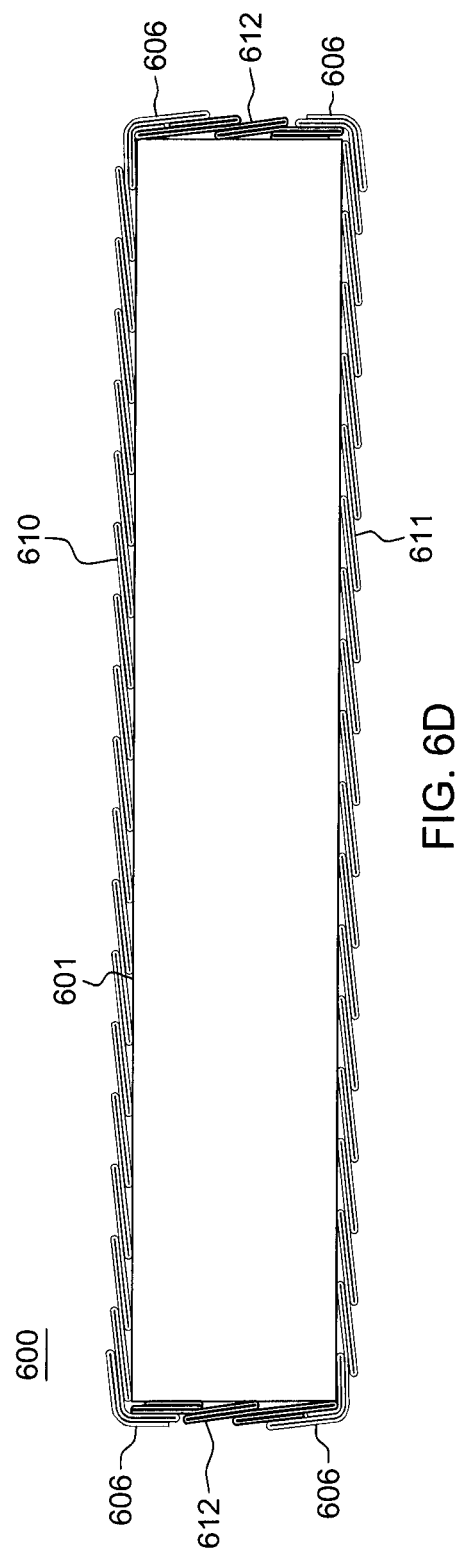
FIG. 6D is a cross-sectional elevational view of a further embodiment of a tamper-respondent assembly comprising an electronic enclosure and a tamper-respondent electronic circuit structure comprising multiple tamper-respondent sensors, where the tamper-respondent sensors comprise multiple flattened, folded layers with circuit lines, and one flattened, folded layer wraps around the edge of the electronic enclosure, and the other flattened, folded layers located above and below the electronic enclosure wrap over the flattened, folded layer positioned around the edge of the electronic enclosure, in accordance with one or more aspects of the present invention.

FIG. 6D depicts a variation on the tamper-respondent assembly 600 of FIG. 6B, wherein upper tamper-respondent sensor 610 and lower tamper-respondent sensor 611 are extended past the upper and lower surfaces, respectively, of electronic enclosure 601 and folded to overlap sidewall tamper-respondent sensor 612 provided along the edge or perimeter of electronic enclosure 601.

Figure 6E:
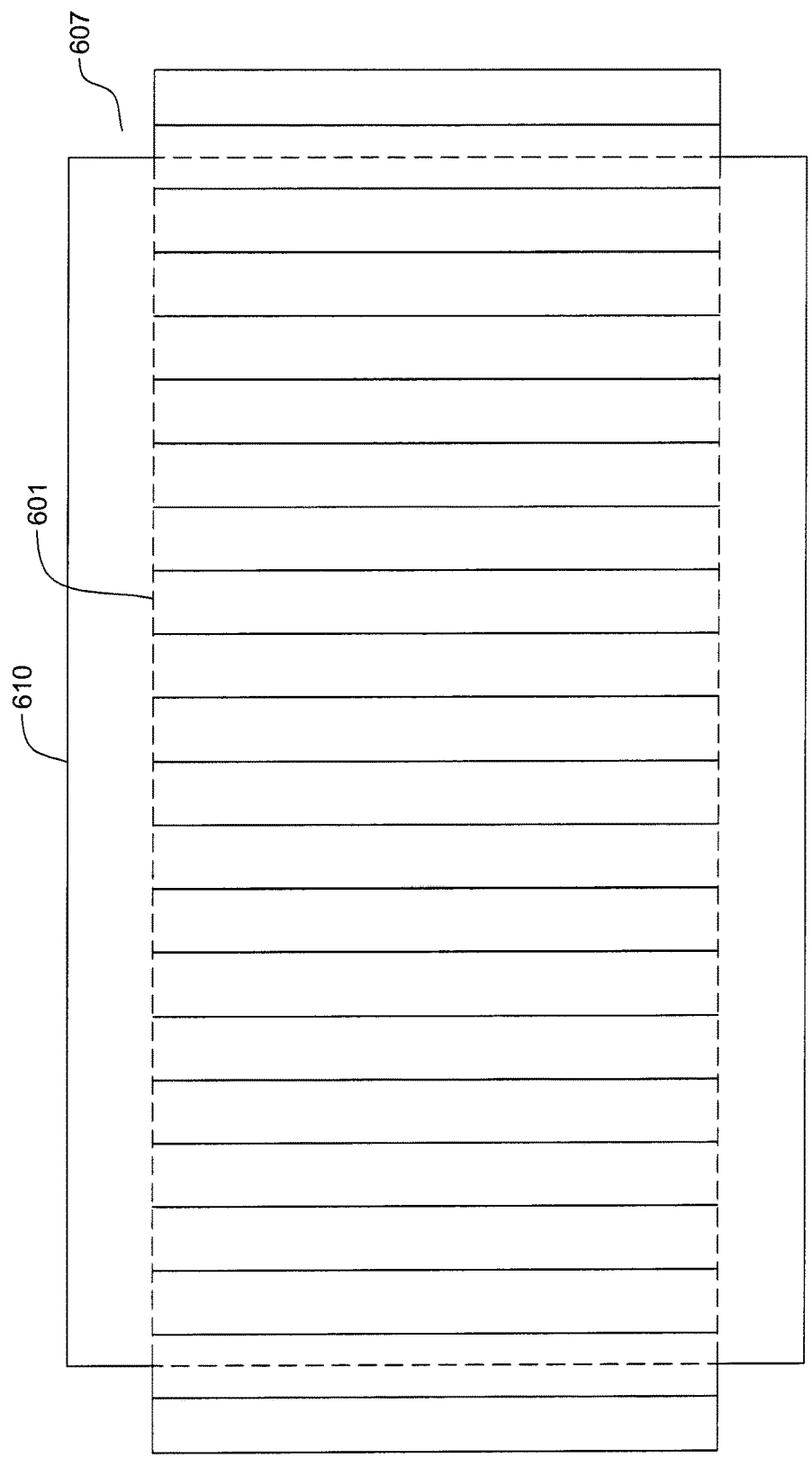
FIG. 6E is a plan view of one embodiment of an upper (or lower) tamper-respondent sensor for use in a tamper-respondent assembly such as depicted in FIG. 6D, wherein the upper (or lower) tamper-respondent sensor is depicted by way of example only as a flattened, folded layer, in accordance with one or more aspects of the present invention.
Figure 6F:
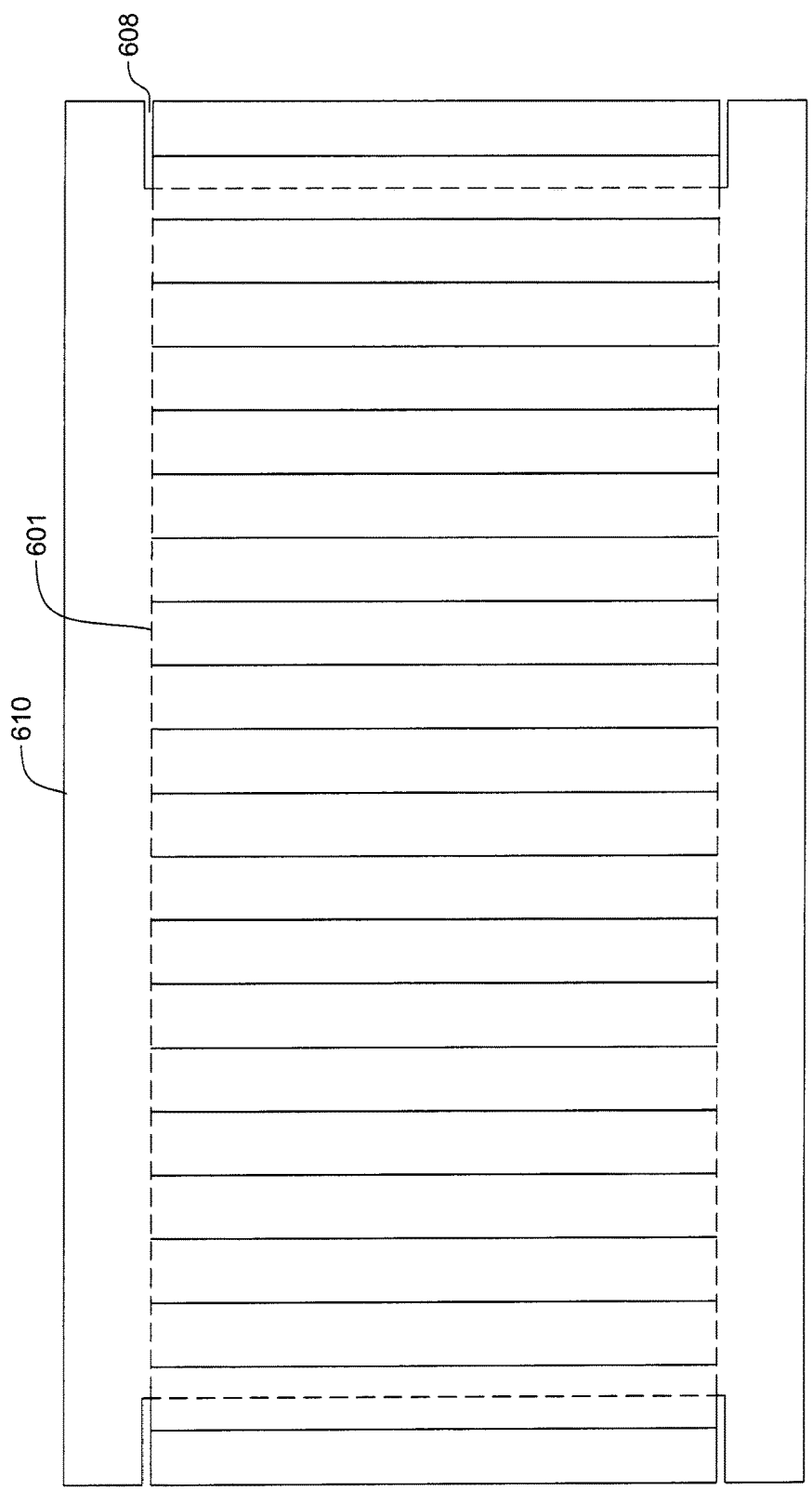
FIG. 6F is a plan view of a further embodiment of an upper (or lower) tamper-respondent sensor for a tamper-respondent assembly such as depicted in FIG. 6D, wherein the upper (or lower) tamper-respondent sensor is depicted by way of example only as a flattened, folded layer, in accordance with one or more aspects of the present invention.

FIGS. 6E & 6F depict alternate embodiments of upper tamper-respondent sensor 610, for use in various embodiments of a tamper-respondent assembly, including, for instance, an assembly such as depicted in FIG. 6D, where upper tamper-respondent sensor 610 wraps over an edge of the enclosure and sidewall tamper-respondent sensor 612 is sized to the width of the edge or sidewall of electronic enclosure 601. In the upper tamper-respondent sensor 610 embodiment of FIG. 6E, corner cutouts or indents 607 are established to facilitate folding of the illustrated edge flaps over the sidewall tamper-respondent sensor 612 as illustrated, for instance, in FIG. 6D. If desired, where the edge flaps meet at the corners of the assembly package, additional corner tamper-respondent sensors (not shown) may be used as patches over the corners to provide still further tamper-proof, tamper-evident packaging along the respective seams of the edge flaps. Note that, in this configuration, the sidewall tamper-respondent sensor 612 (FIG. 6D) wraps fully around the electronic enclosure 601, and thus, necessarily provides coverage at the seams where the edge flaps meet.

As a variation, FIG. 6F depicts upper tamper-respondent sensor 610 with corner cutouts 608 reduced to slots or channels to define tabs from the edge flaps at the corners of the edge flaps, so as to allow for a further folding along the edge or sidewall of the electronic enclosure 601. That is, the further tabs may be transversely folded over the seam between adjoining edge flaps at the corners when the upper tamper-respondent sensor 610 is folded over sidewall tamper-respondent sensor 612, such as illustrated in FIG. 6D.

Note that in the embodiments of FIGS. 6A-6D, the tamper-respondent sensors may have respective input/output (I/O) cabling extending off one or more ends thereof in a region under an overlap area of two of the tamper-respondent sensors, with the I/O cabling extending into the secure volume of the package to make electrical connection with the tamper-detect circuitry. For instance, the resistive networks within the tamper-respondent sensors may be electrically coupled to circuitry within the secure volume for monitoring the networks. The monitor circuitry may include various bridge and/or compare circuits, and utilize conventional electrical interconnect inside the secure volume of electronic enclosure 601. Any of a number of interconnect configurations may be employed dependent, for instance, on the number and characteristics of the resistive networks provided within the tamper-respondent sensors.

Figure 6G:
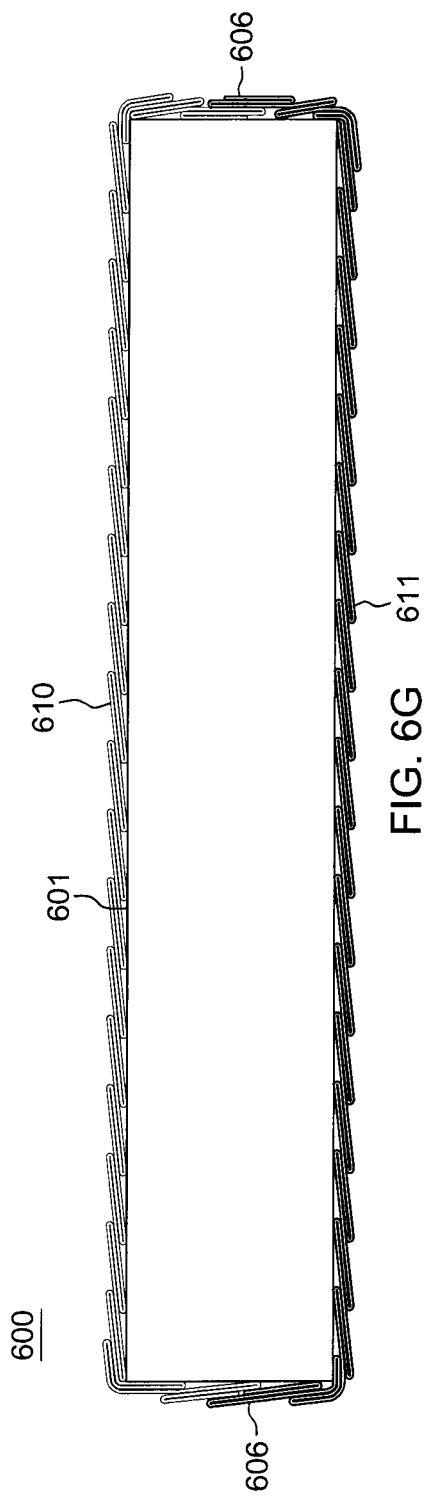
FIG. 6G is a cross-sectional elevational view of a further embodiment of a tamper-respondent assembly comprising an electronic enclosure and a tamper-respondent electronic circuit structure comprising multiple tamper-respondent sensors, where the tamper-respondent sensors comprise two flattened, folded layers with circuit lines surrounding the electronic enclosure and overlapping along the edge or side thereof, in accordance with one or more aspects of the present invention.

In the embodiment of FIG. 6G, tamper-respondent sensor 612 (FIG. 6D) is removed, and size of the upper and lower tamper-respondent sensors 610, 611 is extended to allow the upper and lower tamper-respondent sensors 610, 611 to overlap along the edge or sidewall of electronic enclosure 601 where folded, as shown.

Note that although depicted in FIGS. 6A-6G as flattened, folded layers, one or more of the respective tamper-respondent sensors illustrated could be otherwise implemented. For instance, one or more of the upper, lower, or sidewall tamper-respondent sensors in the depicted examples could comprise other formed, flexible layers, such as depicted in FIGS. 4A-5H, or other non-formed, flexible layers, with circuit lines forming resistive networks on one or both opposing sides of the flexible layer(s). Further examples of tamper-respondent sensors are described below in connection with FIGS. 7A-7C.

Figure 7A:
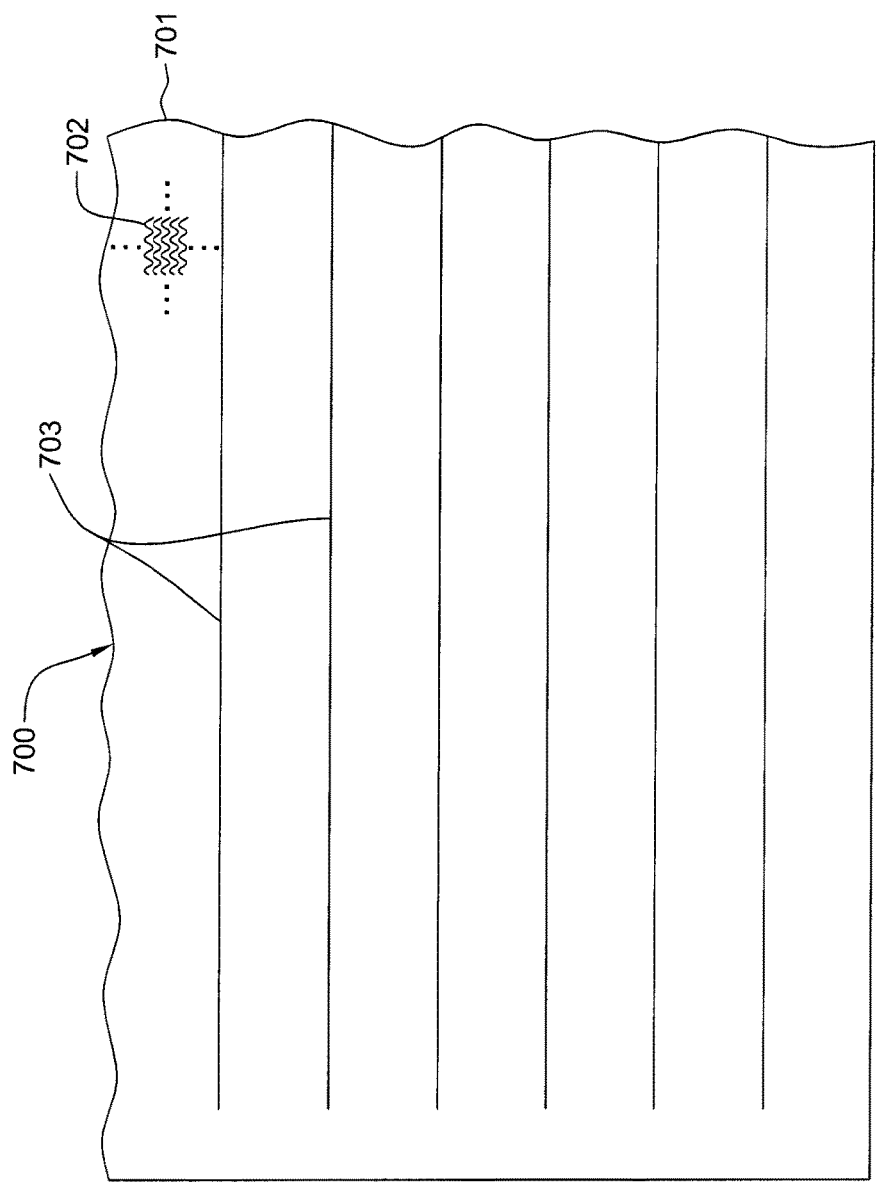
FIG. 7A is a plan view of one embodiment of a first tamper-respondent sensor to be interweaved with a similarly constructed, second tamper-respondent sensor, in accordance with one or more aspects of the present invention.
Figure 7B:
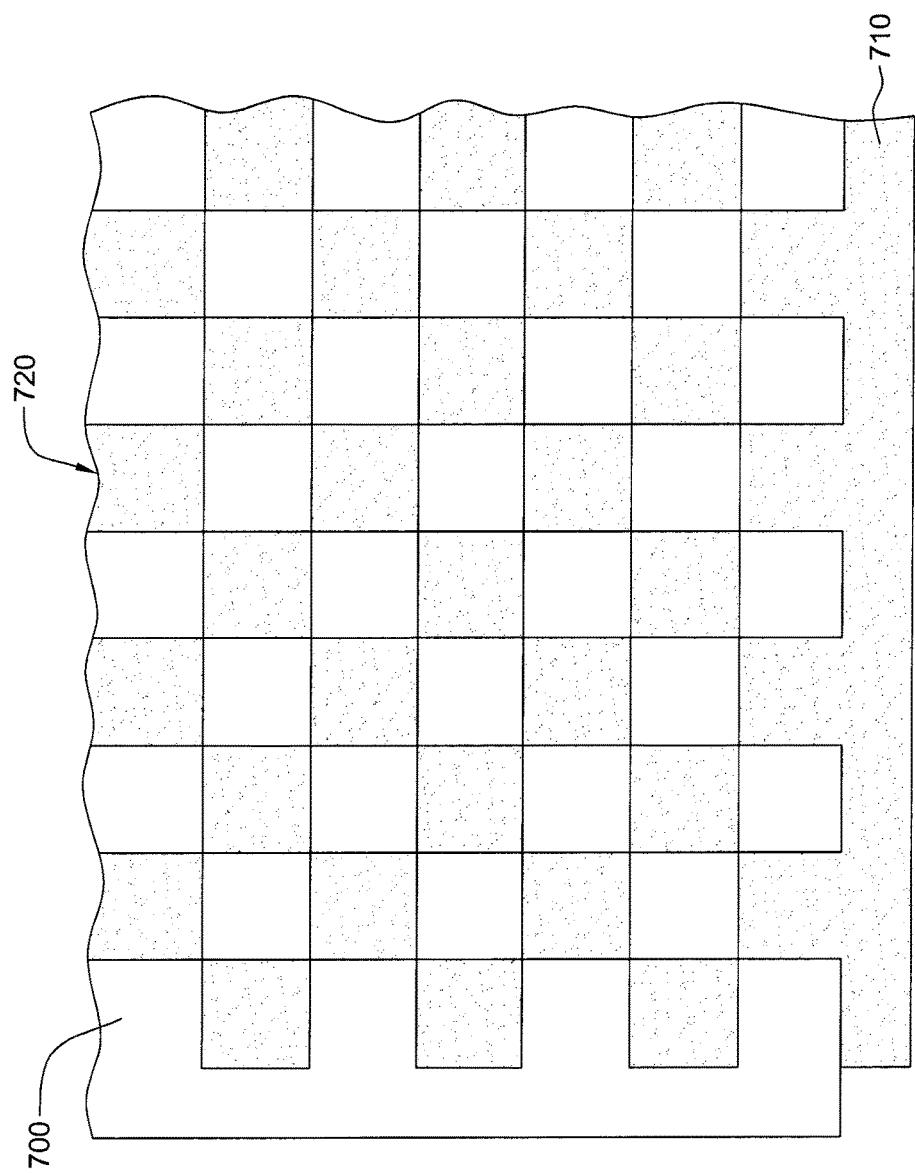
FIG. 7B is a plan view of one embodiment of a tamper-respondent electronic circuit structure comprising two discrete tamper-respondent sensors, such as depicted in FIG. 7A, interweaved in a multi-sensor interweaved layer, in accordance with one or more aspects of the present invention.
Figure 7C:
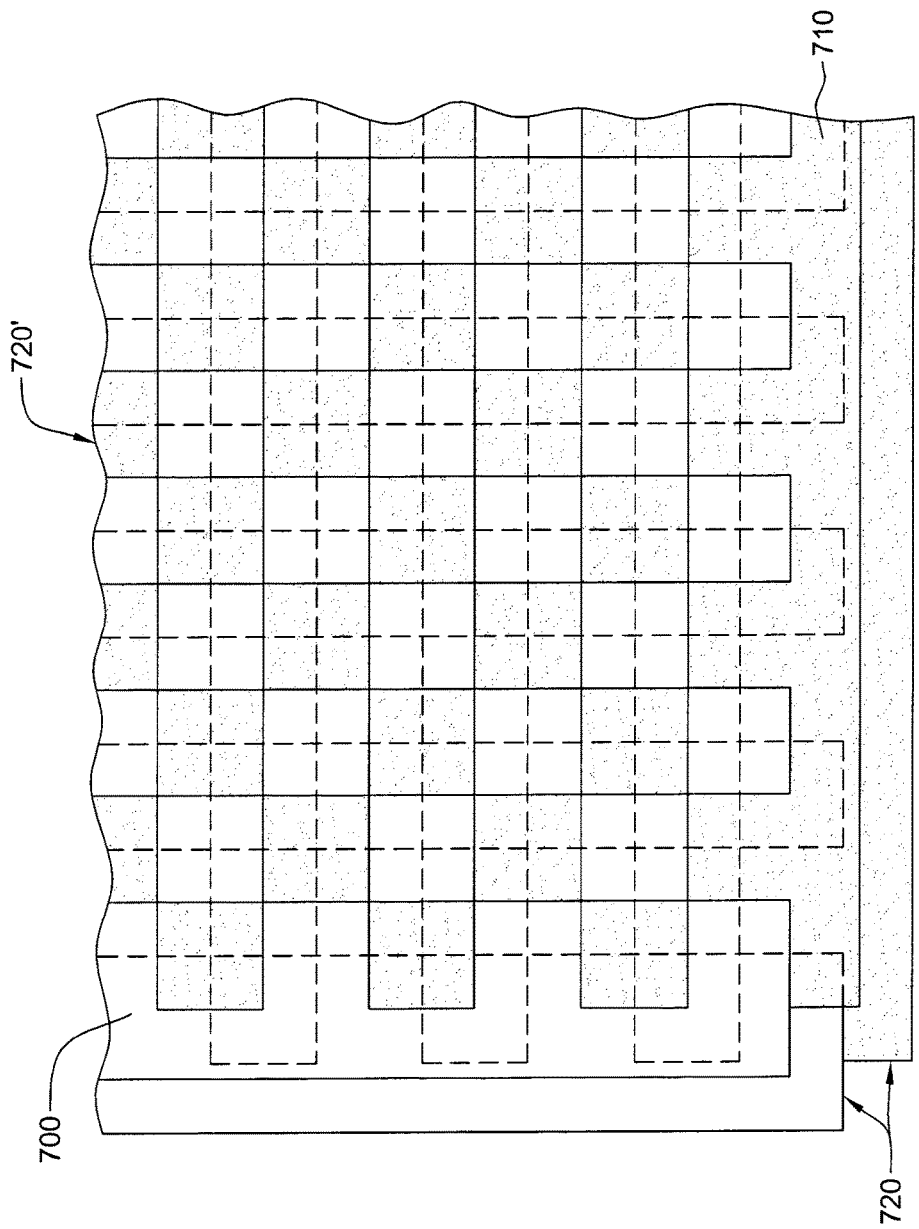
FIG. 7C depicts, by way of further example, a stack of multi-sensor interweaved layers which may be employed, for instance, in association with an electronic enclosure within a tamper-respondent assembly to define a secure volume, in accordance with one or more aspects of the present invention.

FIGS. 7A-7C depict a further embodiment of a tamper-respondent circuit structure comprising one or more multi-sensor interweaved layers. In particular, a first tamper-respondent sensor 700 is depicted in FIG. 7A as comprising at least one first layer 701, such as a flexible dielectric layer having opposite first and second sides. First circuit lines 702 are provided on at least one of the first side or the second side of the at least one first layer 701 to form at least one first resistive network. Multiple slits 703 are provided within the at least one first layer 701, with the first circuit lines being located back from the multiple slits 703 a specified minimum distance, such as 2-10 mils.

As illustrated in FIG. 7B, the tamper-respondent electronic circuit structure may comprise a multi-sensor interweaved layer 720 defined by interweaving first tamper-respondent sensor 700 with a second tamper-respondent sensor 710 constructed, in one or more embodiments, similarly to first tamper-respondent sensor 700. In particular, second tamper-respondent sensor 710 may include at least one layer, such as at least one flexible layer having opposite first and second sides, and second circuit lines disposed on at least one of the first or second sides of the at least one second layer, which define at least one second resistive network. Note that the at least one first resistive network and at least one second resistive network may be the same or differently patterned resistive networks. For instance, in one or more implementations, the width of the circuit lines or traces in the different resistive networks, as well as the pitch between lines, may be varied. By providing slits within first tamper-respondent sensor 700 and second tamper-respondent sensor 710, the resultant fingers of the first and second tamper-respondent sensors may be interweaved to define multi-sensor interweaved layer 720 to comprise a checkerboard pattern, as illustrated by way of example in FIG. 7B.

As depicted in FIG. 7C, an enhanced tamper-respondent electronic circuit structure may be obtained by stacking two multi-sensor interweaved layers 720, with the slit lines, and in particular, the intersections of the slit lines, offset to provide a more tamper-proof, tamper-evident electronic structure. For instance, the multi-sensor interweaved layer 720 of FIG. 7B may be a first multi-sensor interweaved layer, and the circuit structure may include a second multi-sensor interweaved layer overlying the first sensor interweaved layer, with the second multi-sensor interweaved layer being formed from additional discrete tamper-respondent sensors, in a manner such as described above in connection with FIGS. 7A & 7B. In this configuration, the second multi-sensor interweaved layer 720' may be constructed such that the slit intersections between the discrete tamper-respondent sensors interweaved into that layer do not align with those of the first multi-sensor interweaved layer 720 when stacked. For instance, the slits in the second multi-sensor interweaved layer 720' could be differently spaced apart from those in the first multi-sensor interweaved layer 720 such that the intersections of the slits in the second multi-sensor interweaved layer are offset from those in the first multi-sensor interweaved layer, or second multi-sensor interweaved layer 720' could be identically constructed as first multi-sensor interweaved layer 702, but offset slightly from the first multi-sensor interweaved layer when stacked. Advantageously, in one or more implementations, one or more multi-sensor interweaved layers 720, 720' may be employed as one of the upper, lower, or sidewall tamper-respondent sensors described above in connection with FIGS. 6A-6G, if desired.

Figure 8A:
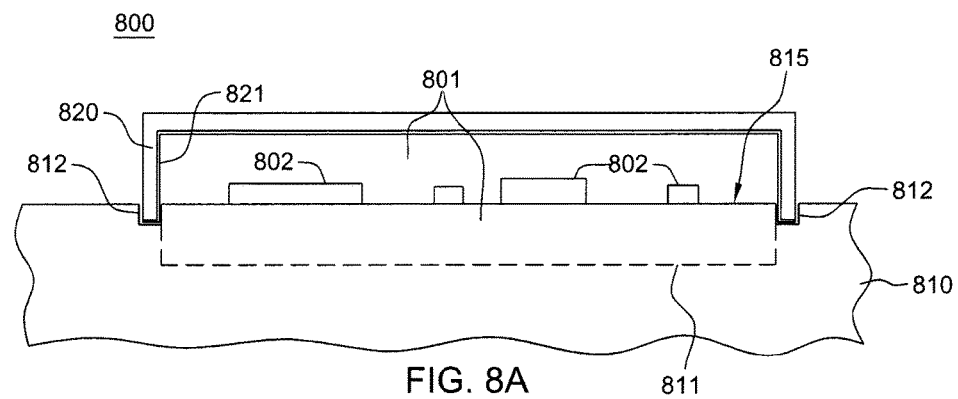
FIG. 8A is a cross-sectional elevational view of one embodiment of a tamper-respondent assembly, or tamper-proof electronic package, which includes (in part) a tamper-respondent sensor embedded within a multilayer circuit board, in accordance with one or more aspects of the present invention.
Figure 8B:
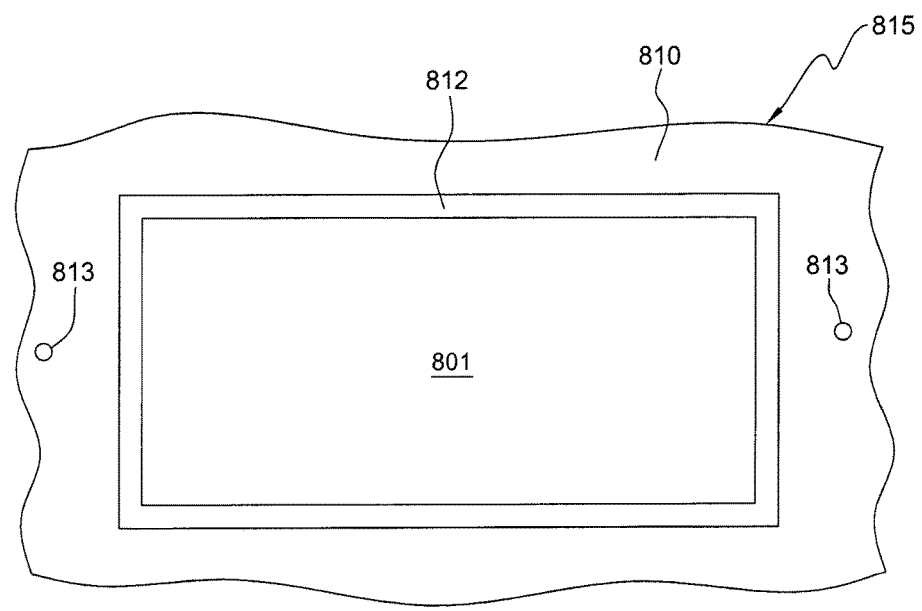
FIG. 8B is a top plan view of the multilayer circuit board of FIG. 8A, depicting one embodiment of the secure volume where defined, in part, within the multilayer circuit board, in accordance with one or more aspects of the present invention.

By way of further example, FIGS. 8A & 8B depict one embodiment of another tamper-respondent assembly, or tamper-proof electronic package 800, which comprises an electronic circuit 815, in accordance with one or more further aspects of the present invention.

Referring collectively to FIGS. 8A & 8B, electronic circuit 815 includes a multilayer circuit board 810 which has an embedded tamper-respondent sensor 811 therein that facilitates defining, in part, a secure volume 801 associated with multilayer circuit board 810 that extends into multilayer circuit board 810. In particular, in the embodiment of FIGS. 8A & 8B, secure volume 801 exists partially within multilayer circuit board 810, and partially above multilayer circuit board 810. One or more electronic components 802 are mounted to multilayer circuit board 810 within secure volume 801 and may comprise, for instance, one or more encryption modules and/or decryption modules, and associated components, with the tamper-proof electronic package comprising, in one or more embodiments, a communications card of a computer system.

Tamper-proof electronic package 800 further includes an enclosure 820, such as a pedestal-type enclosure, mounted to multilayer circuit board 810 within, for instance, a continuous groove (or trench) 812 formed within an upper surface of multilayer circuit board 810. In one or more embodiments, enclosure 820 may comprise a thermally conductive material and operate as a heat sink for facilitating cooling of the one or more electronic components 802 within the secure volume. A security mesh or tamper-respondent sensor 821, such as the above-described tamper-respondent sensors of FIGS. 4A-7C, may be associated with enclosure 820, for example, wrapping around the inner surface of enclosure 820 to facilitate defining, in combination with tamper-respondent sensor 811 embedded within multilayer circuit board 810, secure volume 801. In one or more implementations, tamper-respondent sensor 821 extends down into continuous groove 812 in multilayer circuit board 810 and may, for instance, even wrap partially or fully around the lower edge of enclosure 820 within continuous groove 812 to provide enhanced tamper detection where enclosure 820 couples to multilayer circuit board 810. In one or more implementations, enclosure 820 may be securely affixed to multilayer circuit board 810 using, for instance, a bonding material such as an epoxy or other adhesive.

As depicted in FIG. 8B, one or more external circuit connection vias 813 may be provided within multilayer circuit board 810 for electrically connecting to the one or more electronic components 802 (FIG. 8A) within secure volume 801. These one or more external circuit connection vias 813 may electrically connect to one or more external signal lines or planes (not shown) embedded within multilayer circuit board 810 and extending, for instance, into a secure base region of (or below) secure volume 801, as explained further below. Electrical connections to and from secure volume 801 may be provided by coupling to such external signal lines or planes within the multilayer circuit board 810.

As noted with reference to FIGS. 8A & 8B, secure volume 801 defined in association with multilayer circuit board 810 may be sized to house electronic components 802 to be protected, and be constructed to extend into multilayer circuit board 810. In one or more implementations, multilayer circuit board 810 includes electrical interconnect within the secure volume 801 defined in the board, for instance, for electrically connecting the multiple tamper-respondent layers of the embedded tamper-respondent sensor 811 to associated monitor circuitry also disposed within secure volume 801.

Note that the embodiment depicted in FIGS. 8A & 8B is presented by way of example only. In one or more other implementations, the electronic circuit may comprise multiple multilayer circuit boards, each with a tamper-respondent sensor embedded within the multilayer circuit board with an appropriate connector, located within a secure volume defined between two adjacent multilayer circuit boards, interconnecting selected wiring of the multilayer circuit boards. In such an implementation, the overlying multilayer circuit board could be hollowed out to accommodate, for instance, the connector and/or one or more other electronic components between the multilayer circuit boards. In addition, other configurations of enclosure 820, and/or other approaches to coupling enclosure 820 and multilayer circuit board 810 may be employed.

Figure 9:
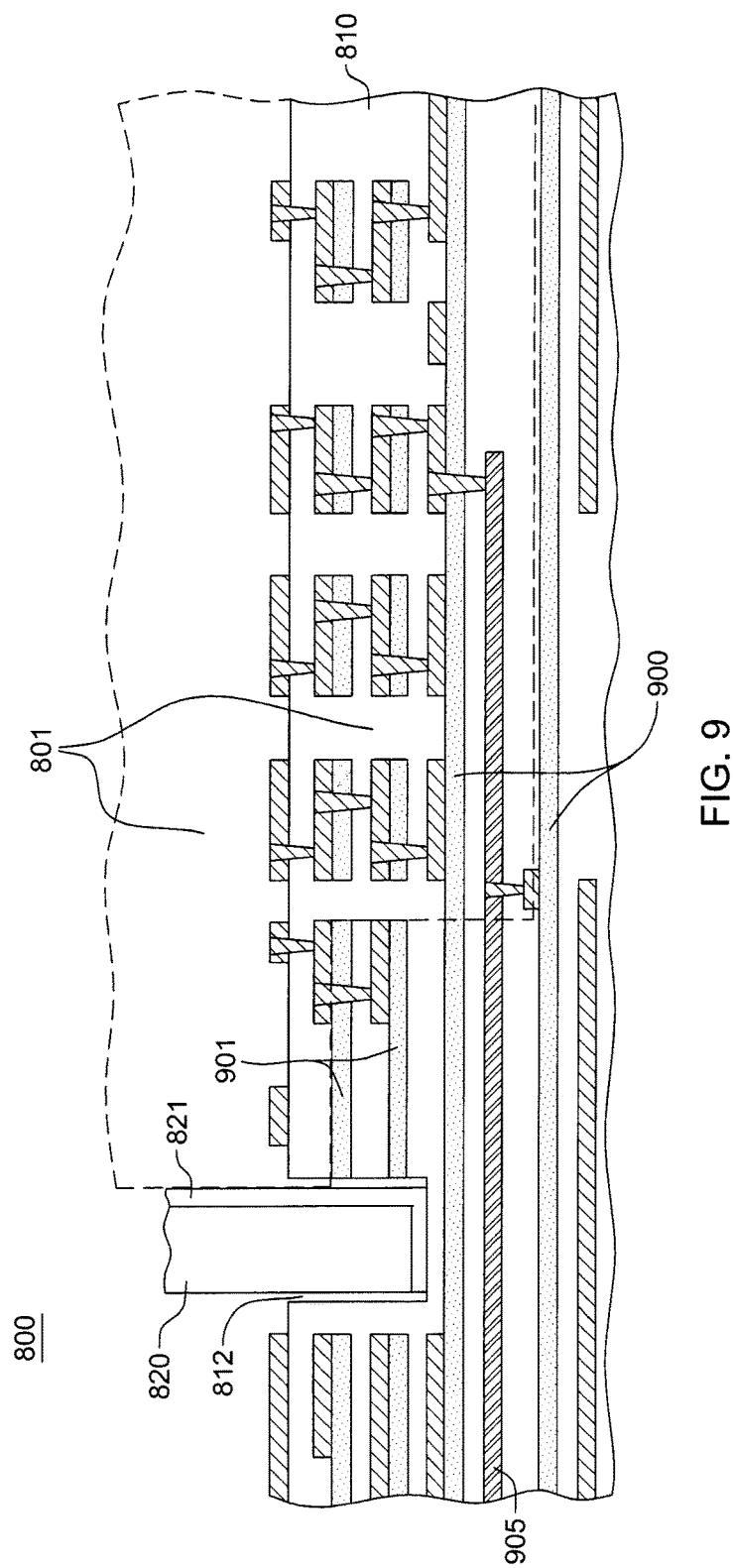
FIG. 9 is a partial cross-sectional elevational view of a tamper-respondent assembly comprising (in part) a multilayer circuit board and embedded tamper-respondent sensor, in accordance with one or more aspects of the present invention.

By way of further example, FIG. 9 depicts a partial cross-sectional elevational view of one embodiment of multilayer circuit board 810 and enclosure 820. In this configuration, the embedded tamper-respondent sensor includes multiple tamper-respondent layers including, by way of example, at least one tamper-respondent mat (or base) layer 900, and at least one tamper-respondent frame 901. In the example depicted, two tamper-respondent mat layers 900 and two tamper-respondent frame 901 are illustrated, by way of example only. The lower-most tamper-respondent mat layer 900 may be a continuous sense or detect layer extending completely below the secure volume being defined within multilayer circuit board 810. One or both tamper-respondent mat layers 900 below secure volume 801 may be partitioned into multiple circuit zones, as discussed further below. Within each tamper-respondent mat layer, or more particularly, within each circuit zone of each tamper-respondent mat layer, multiple circuits or conductive traces are provided in any desired configuration, such as the configuration described above in connection with FIG. 3. Further, the conductive traces within the tamper-respondent layers may be implemented as, for instance, a resistive layer which is difficult to attach shunt circuits to, as explained further below.

As illustrated, one or more external signal lines or planes 905 enter secure volume 801 between, in this embodiment, two tamper-respondent mat layers 900, and then electrically connect upwards into the secure volume 801 through one or more conductive vias, arranged in any desired location and pattern. In the configuration depicted, the one or more tamper-respondent frames 901 are disposed at least inside of the area defined by continuous groove 812 accommodating the base of enclosure 820. Together with security sensor 821 associated with enclosure 820, tamper-respondent frames 901 define secure volume 801 where extending, in part, into multilayer circuit board 810. With secure volume 801 defined, at least in part, within multilayer circuit board 810, the external signal line(s) 905 may be securely electrically connected to, for instance, the one or more electronic components 802 (FIG. 8A) mounted to multilayer circuit board 810 within secure volume 801. In addition, the secure volume 801 may accommodate electrical interconnection of the conductive traces of the multiple tamper-respondent layers, for instance, via appropriate monitor circuitry.

Added security may be provided by extending tamper-respondent mat layers 900 (and if desired, tamper-respondent frames 901) outward past continuous groove 812 accommodating enclosure 820. In this manner, a line of attack may be made more difficult at the interface between enclosure 820 and multilayer circuit board 810 since the attack would need to clear tamper-respondent mat layers 900, the bottom edge of tamper-respondent sensor 821 associated with enclosure 820, as well as the tamper-respondent frames 901 of the embedded tamper-respondent sensor.

Variations on the multilayer circuit board 810 of FIG. 8A are possible. For instance, in this embodiment, the embedded tamper-respondent sensor include multiple tamper-respondent mat layers 900 and multiple tamper-respondent frames 901, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, would be facilitated.

Note also that, once within the secure volume is defined within multilayer circuit board 810, conductive vias within the secure volume between layers of multilayer circuit board 810 may be either aligned, or offset, as desired, dependent upon the implementation. Alignment of conductive vias may facilitate, for instance, providing a shortest connection path, while offsetting conductive vias between layers may further enhance security of the tamper-proof electronic package by making an attack into the secure volume through or around one or more tamper-respondent layers of the multiple tamper-respondent layers more difficult.

The tamper-respondent layers of the embedded tamper-respondent sensor formed within the multilayer circuit board of the electronic circuit or electronic package may include multiple conductive traces or lines formed between, for instance, respective sets of input and output contacts or vias at the trace termination points. Any number of conductive traces or circuits may be employed in defining a tamper-respondent layer or a tamper-respondent circuit zone within a tamper-respondent layer. For instance, 4, 6, 8, etc., conductive traces may be formed in parallel (or otherwise) within a given tamper-respondent layer or circuit zone between the respective sets of input and output contacts to those conductive traces.

Figure 10:
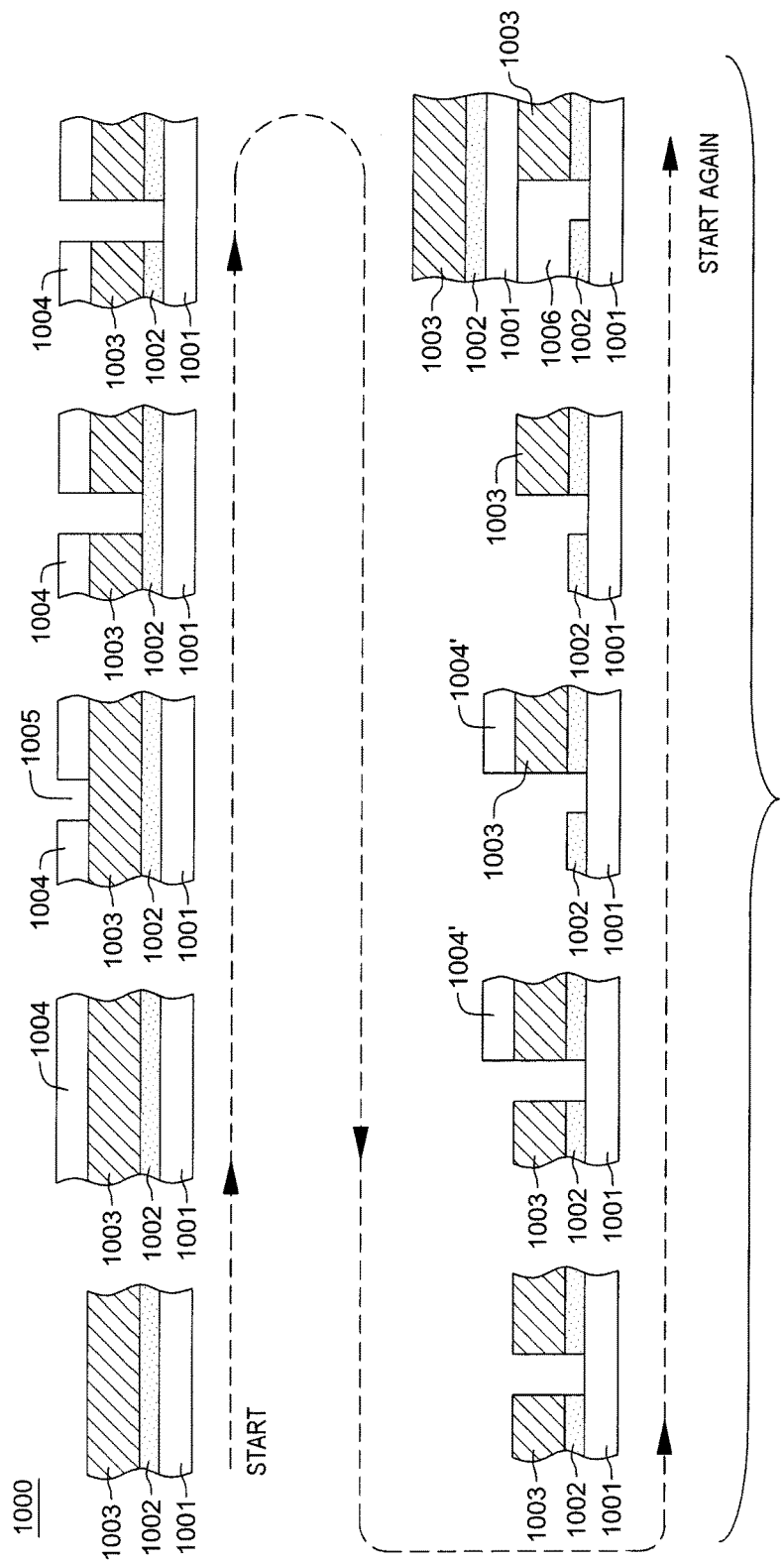
FIG. 10 depicts one embodiment of a process of fabricating a multilayer circuit board with an embedded tamper-respondent sensor, in accordance with one or more aspects of the present invention.

In one or more implementations, the multilayer circuit board may be a multilayer wiring board or printed circuit board formed, for instance, by building up the multiple layers of the board. FIG. 10 illustrates one embodiment for forming and patterning a tamper-respondent layer within such a multilayer circuit board.

As illustrated in FIG. 10, in one or more implementations, a tamper-respondent layer, such as a tamper-respondent mat layer or a tamper-respondent frame disclosed herein, may be formed by providing a material stack comprising, at least in part, a structural layer 1001, such as a pre-preg (or pre-impregnated) material layer, a trace material layer 1002 for use in defining the desired trace patterns, and an overlying conductive material layer 1003, to be patterned to define conductive contacts or vias electrically connecting to the pattern of traces being formed within the trace material layer 1002, for instance, at trace terminal points. In one or more implementations, the trace material layer 1002 may comprise nickel phosphorous (NiP), and the overlying conductive layer 1003 may comprise copper. Note that these materials are identified by way of example only, and that other trace and/or conductive materials may be used within the build-up 1000.

A first photoresist 1004 is provided over build-up 1000, and patterned with one or more openings 1005, through which the overlying conductive layer 1003 may be etched. Depending on the materials employed, and the etch processes used, a second etch process may be desired to remove portions of trace material layer 1002 to define the conductive traces of the subject tamper-respondent layer. First photoresist 1004 may then be removed, and a second photoresist 1004' is provided over the conductive layer 1003 features to remain, such as the input and output contacts. Exposed portions of conductive layer 1003 are then etched, and the second photoresist 1004' may be removed, with any opening in the layer being filled, for instance, with an adhesive (or pre-preg) and a next build-up layer is provided, as shown. Note that in this implementation, most of overlying conductive layer 1003 is etched away, with only the conductive contacts or vias remaining where desired, for instance, at the terminal points of the traces formed within the layer by the patterning of the trace material layer 1002. Note that any of a variety of materials may be employed to form the conductive lines or traces within a tamper-respondent layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which could be employed include OhmegaPly®, offered by Ohmega Technologies, Inc., of Culver City, Calif. (USA), or Ticer™, offered by Ticer Technologies of Chandler, Ariz. (USA).

The trace lines or circuits within all of the tamper-respondent layers, and in particular, the tamper-respondent circuit zones, of the embedded tamper-respondent sensor, along with the tamper-respondent sensor 821, may be electrically connected into monitor or compare circuitry provided, for instance, within secure volume 801 of multilayer circuit board 810. The monitor circuitry may include various bridge or compare circuits, and conventional printed wiring board electrical interconnect inside the secure volume 801, for instance, located within the secure volume defined by the tamper-respondent frames 901 (FIG. 9), and the tamper-respondent mat layers.

Note that advantageously, different tamper-respondent circuit zones on different tamper-respondent layers may be electrically interconnected into, for instance, the same comparator circuit or Wheatstone bridge of the monitor circuitry. Thus, any of a large number of interconnect configurations may be possible. For instance, if each of two tamper-respondent mat layers contains 30 tamper-respondent circuit zones, and each of two tamper-respondent frames contains 4 tamper-respondent circuit zones, then, for instance, the resultant 68 tamper-respondent circuit zones may be connected in any configuration within the secure volume to create the desired arrangement of circuit networks within the secure volume being monitored for changes in resistance or tampering. Note in this regard, that the power supply or battery for the tamper-respondent sensor may be located external to the secure volume, with the sensor being configured to trip and destroy any protected or critical data if the power supply or battery is tampered with.

Figure 11:
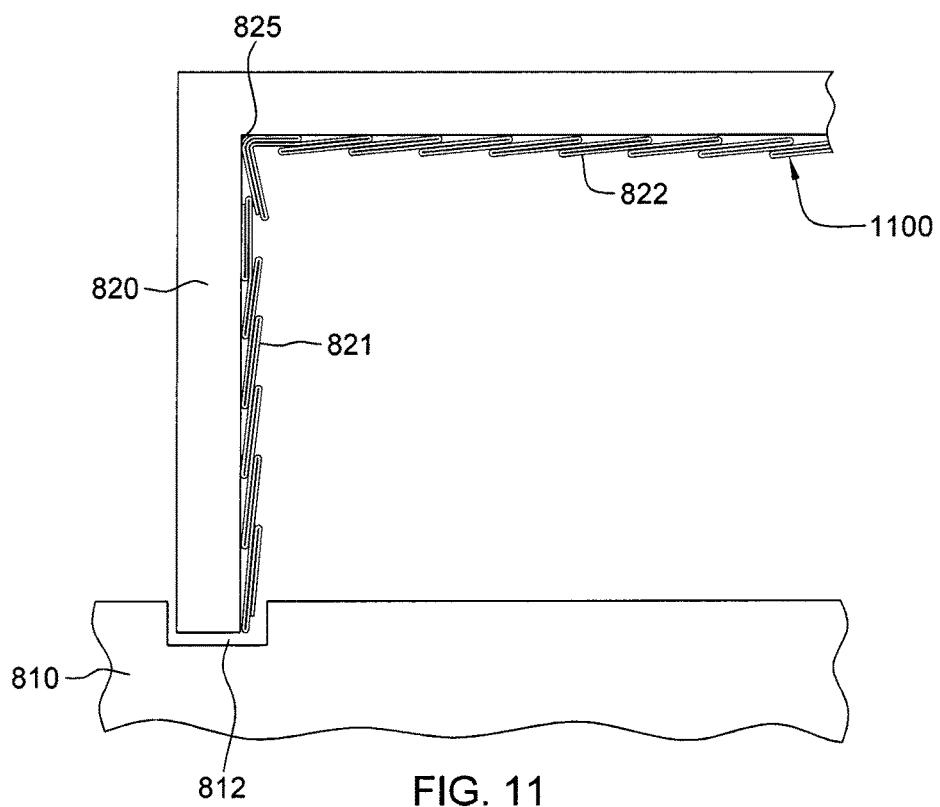
FIG. 11 is a partial cross-sectional elevational view of a tamper-respondent assembly comprising an electronic enclosure and associated tamper-respondent sensor, and a multilayer circuit board with an embedded tamper-respondent sensor therein, in accordance with one or more aspects of the present invention.

FIG. 11 is a partial enlarged view of the tamper-respondent assembly of FIGS. 8A-9, with a tamper-respondent electronic circuit structure 1100 comprising multiple tamper-respondent sensors 821, 822 disposed on the inner surface 825 of enclosure 820. As illustrated, in one embodiment, enclosure 820 and the inner sidewall-disposed, tamper-respondent sensor 821 align at the bottom edge and extend into a continuous groove or trench 812 in multilayer circuit board 810 comprising, or associated with, the electronic circuit to be protected, as explained above. Tamper-respondent sensors 821, 822 may overlap, for instance, a few millimeters, or more, in order to provide added tamper-proof protection along the seam, where the tamper-respondent sensors 821, 822 meet within the electronic assembly enclosure 820.

Figure 12:
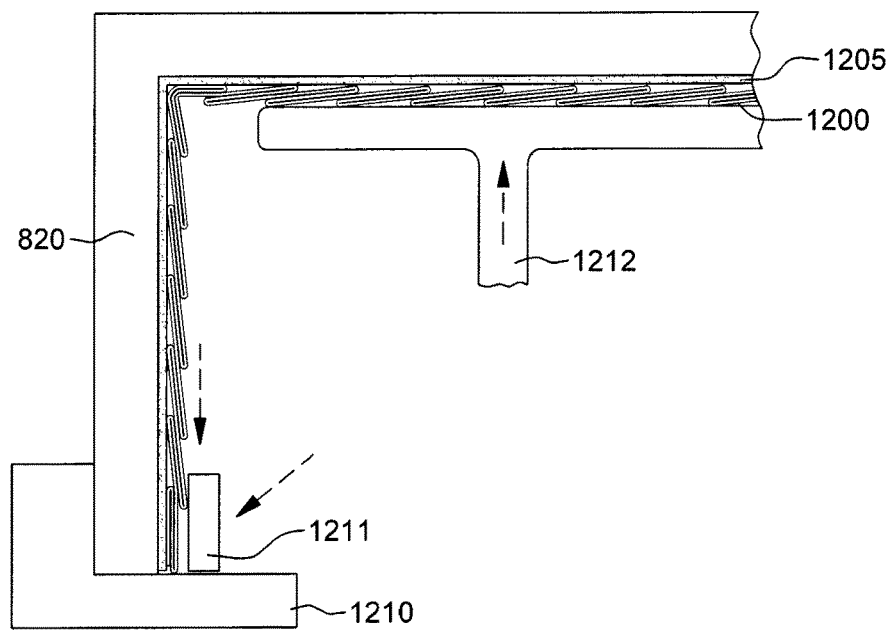
FIG. 12 depicts one embodiment of a process for affixing a tamper-respondent sensor to an inside surface of an electronic enclosure, such as for use with a tamper-respondent assembly described herein with reference to FIGS. 8A-11, in accordance with one or more aspects of the present invention.

FIG. 12 depicts one example of a process for adhering a tamper-respondent sensor 1200 to the inner surface 825 of enclosure 820. In this example, a single tamper-respondent sensor 1200 replaces the tamper-respondent sensors 821, 822 in the example of FIG. 11. However, the adhering apparatus and approach of FIG. 12 could also be applied to securing multiple tamper-respondent sensors 821, 822 to, for instance, the inner surface of electronic assembly enclosure 820. As illustrated, a bounding fixture 1210 may be used in combination with a first push and clamp mechanism 1211, and a second push and clamp mechanism 1212, to hold the tamper-respondent sensor 1200 in place while an adhesive 1205 cures between the tamper-respondent sensor and inner surface 825 of enclosure 820. Note that, in one or more embodiments, the radius of the tamper-respondent sensor 1200 in the corners of the enclosure can vary to account for tolerances of the flexible tamper-respondent sensor comprising the one or more formed flexible layers.

Figure 13A:
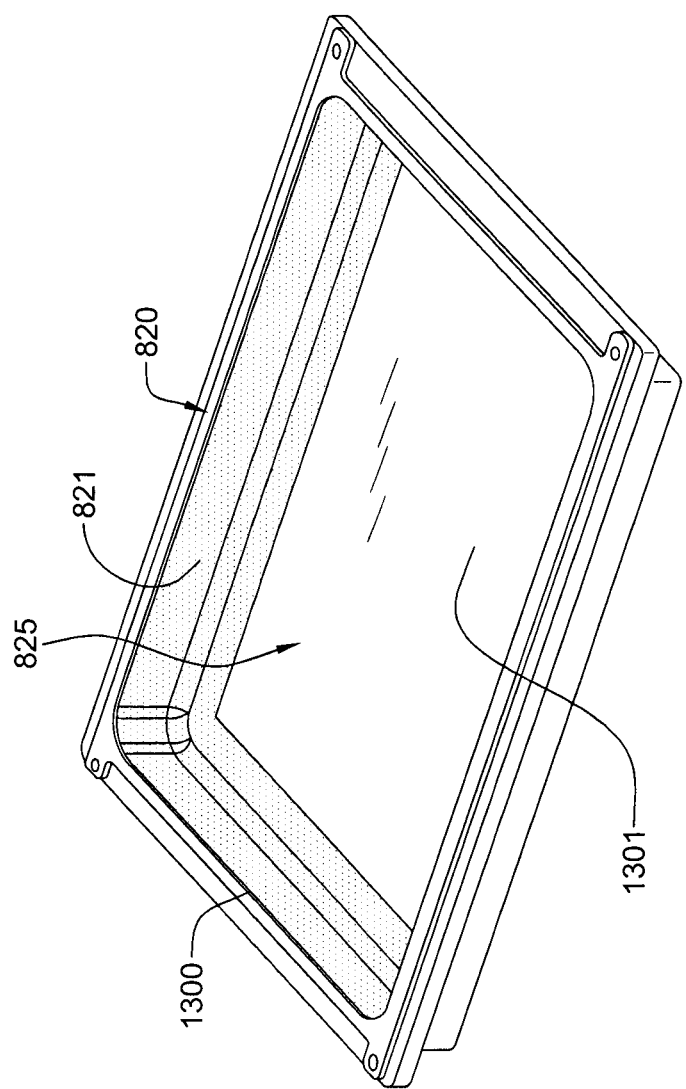
FIG. 13A depicts an underside, isometric view of one embodiment of an electronic enclosure such as depicted in FIGS. 8A, 11 & 12, and illustrating placement of an inner-sidewall tamper-respondent sensor over an inner sidewall surface of the electronic enclosure, in accordance with one or more aspects of the present invention.
Figure 13C:
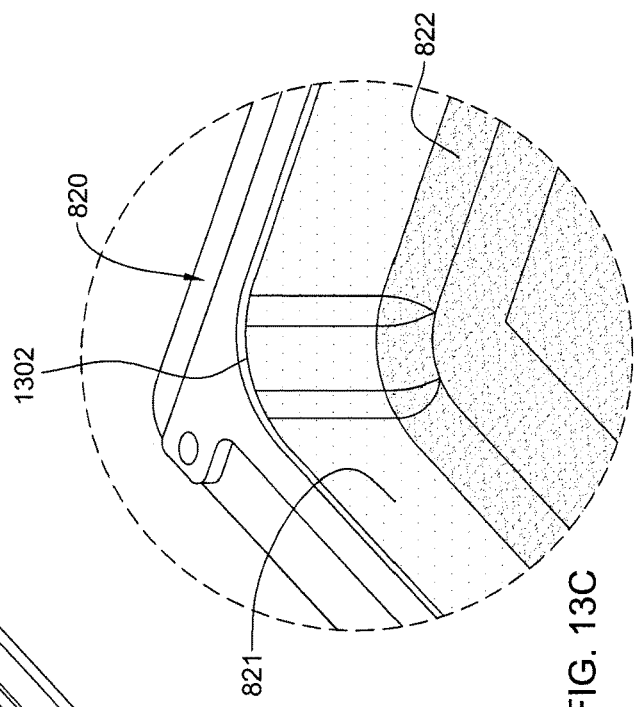
FIG. 13C is an enlarged, corner depiction of the electronic enclosure and tamper-respondent sensors of FIG. 13B, illustrating the inner main surface tamper-respondent sensor overlying the inner-sidewall tamper-respondent sensor at an inner corner of the electronic enclosure, in accordance with one or more aspects of the present invention.
Figure 13B:
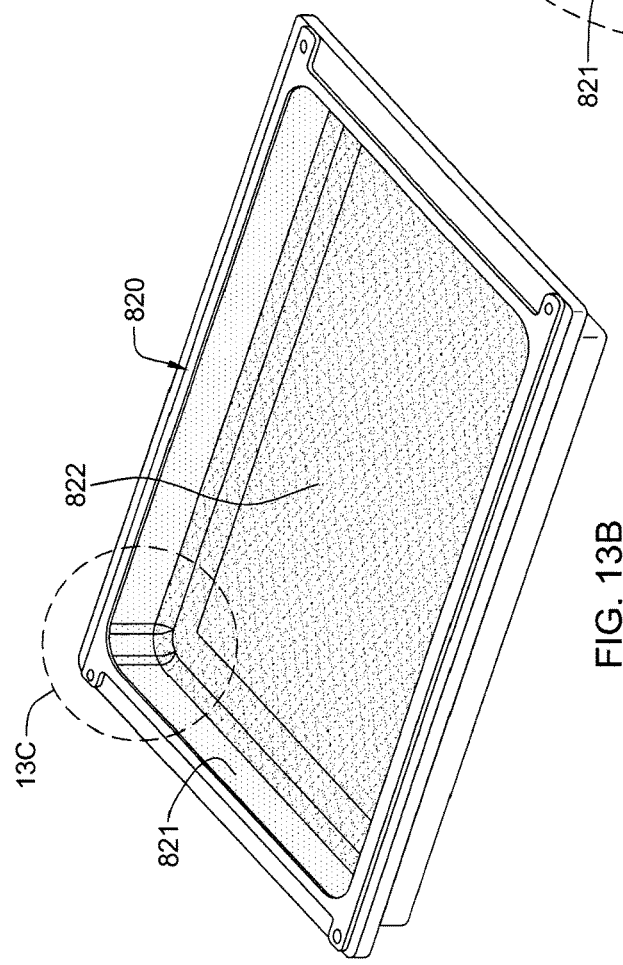
FIG. 13B depicts the structure of FIG. 13A, with an inner main surface tamper-respondent sensor provided over an inner main surface of the electronic enclosure, and with the inner main surface tamper-respondent sensor shown overlapping, at least in part, the inner-sidewall tamper-respondent sensor, in accordance with one or more aspects of the present invention.

FIGS. 13A-13C depict one example of a process for adhering tamper-respondent electronic circuit structure 1100 of FIG. 11 to inner surface 825 of electronic enclosure 820. As illustrated in the underside, isometric view of FIG. 13A, inner surface 825 of electronic enclosure 820 includes an inner sidewall surface 1300 and an inner main surface 1301. Tamper-respondent sensor 821, also referred to herein as an inner-sidewall tamper-respondent sensor, may be secured to the inner sidewall surface of enclosure 820 using an adhesive, such as a thermoset adhesive, in combination with an appropriate bonding fixture and push and clamp mechanisms (not shown) to, for instance, align tamper-respondent sensor 821 to the bottom edge of inner sidewall surface 1300.

As depicted in FIG. 13B, in one or more implementations, tamper-respondent sensor 822 may concurrently or subsequently be affixed to main inner surface 1301 (FIG. 13A) of electronic enclosure 820 using a bonding agent such as a thermoset adhesive. Note that in this embodiment, tamper-respondent sensor 822 is sized to overlap, at least in part, tamper-respondent sensor 821 affixed to inner sidewall surface 1300 (FIG. 13A). This overlap is depicted in greater detail in the partial enlargement of an inner corner 1302 of electronic enclosure 820 in FIG. 13C. Advantageously, by providing two or more discrete tamper-respondent sensors, securing of the tamper-respondent electronic circuit structure to an electronic enclosure is facilitated by allowing more flexibility to align a particular sensor to a particular portion of the electronic enclosure, such as to the bottom edge of the inner sidewall surface of electronic enclosure 820, as in the example of FIGS. 13A-13C.

As illustrated in FIG. 13C, inner corner 1302 of electronic enclosure 820 may be shaped with one or more curved portions and one or more flat, angled-sidewall portions to facilitate wrapping of tamper-respondent sensor 821 over inner sidewall surface 1300 (as explained further below). Note further that, within electronic enclosure 820, various tamper-respondent sensor overlap and folding arrangements may be employed, as the case with the external wrapping of sensors about the electronic enclosure depicted in FIGS. 6A-6G. In the embodiment of FIGS. 13A-13C, the connections to the resistive networks of the tamper-respondent sensors 821, 822 may be provided in the region of the overlap, between the sensors, which in the embodiment of FIGS. 8A-10, facilitate defining the secure volume between the electronic enclosure and the multilayer circuit board.

One consideration with a tamper-respondent assembly, and more particularly, a tamper-respondent electronic circuit structure such as described herein, arises from the need to transition the inner-sidewall tamper-respondent sensor through one or more inner-sidewall corners of an electronic enclosure such as described. As noted above, in one or more embodiments, the tamper-respondent electronic circuit structure comprises one or more tamper-respondent sensors, which are adhesively mounted or affixed to the inner surfaces of the electronic enclosure. These inner surfaces include an inner main surface, and an inner sidewall surface having, for instance, at least one inner-sidewall corner. As noted, the tamper-respondent sensor(s) may each be formed of one or more flexible layers having circuit lines on one or more layers which define tamper-detect networks, such as resistive networks, that may be connected to monitor circuitry for detection of intrusion attempts into the secure space defined by the tamper-respondent assembly. During fabrication, the flexible layers of the tamper-respondent sensor(s) could stretch and potentially buckle within one or more inner-sidewall corners of the electronic enclosure as the sensor is mounted to the enclosure. This stretching or buckling within the corner(s) could result in breaking one or more circuit lines defining the tamper-detect networks to be monitored, which would destroy the tamper-respondent assembly for its intended use. Further, any buckling of the tamper-respondent sensor(s) over the inner surface, such as at the inner-sidewall corner(s) of an inner sidewall surface, could result in potential breach points, which would cause the tamper-respondent assembly to fail a NIST FIPS 140-2 Level 4 security test. Described hereinbelow with reference to FIGS. 14A-18 therefore, are various enhancements to tamper-respondent assemblies such as disclosed herein which address this concern.

Figure 14A:
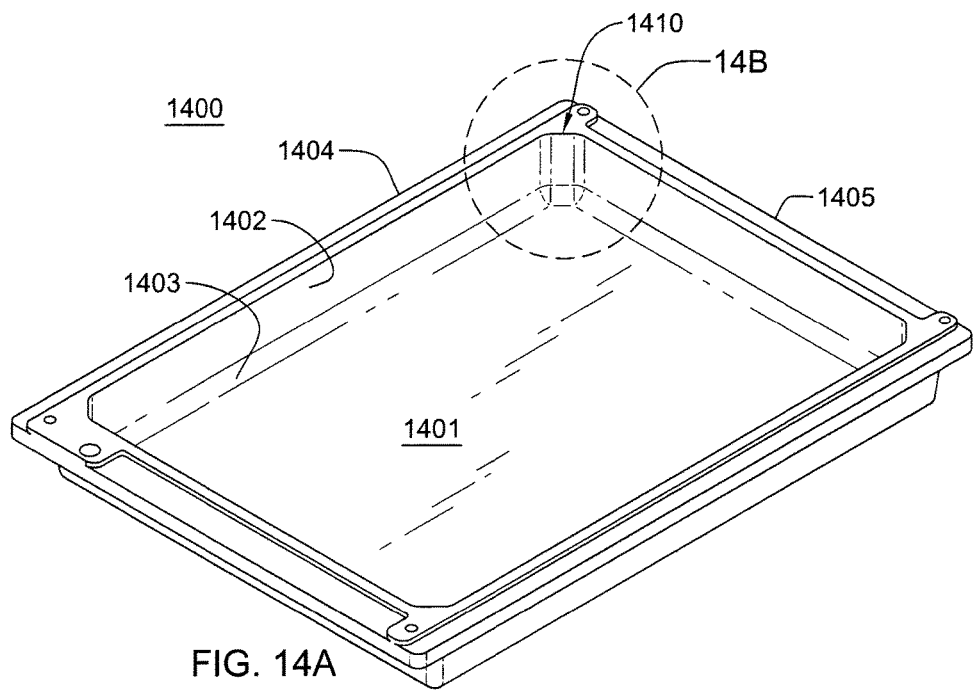
FIG. 14A depicts an underside, isometric view of one embodiment of an electronic enclosure, or electronic assembly enclosure, such as depicted in FIGS. 13A-13C, in accordance with one or more aspects of the present invention.
Figure 14B:
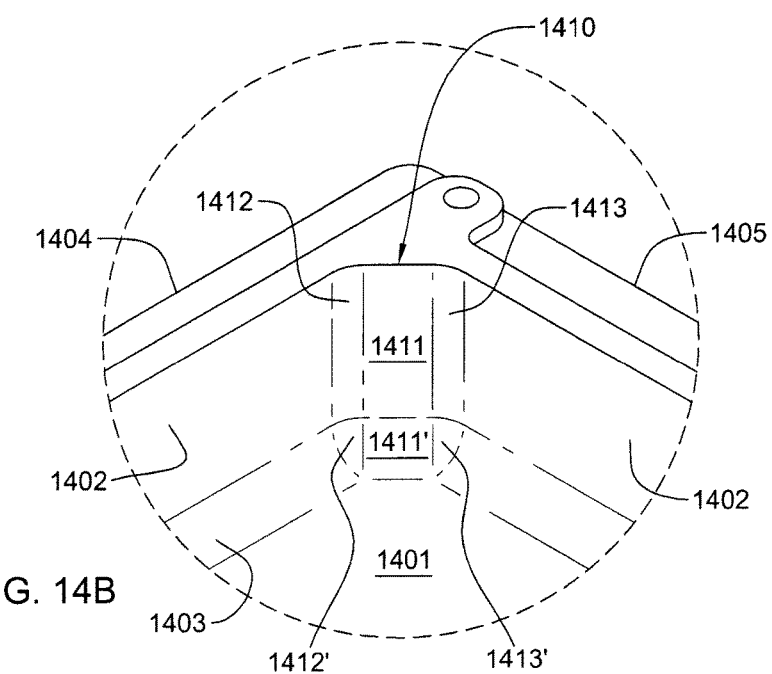
FIG. 14B is an enlarged view of the inner-sidewall corner of FIG. 14A, illustrating region 14B thereof, in accordance with one or more aspects of the present invention.

FIGS. 14A & 14B depict in greater detail one embodiment of an electronic enclosure 1400, similar to enclosure 820 described above in connection with FIGS. 8A-13C. Referring collectively to FIGS. 14A & 14B, in this example, electronic enclosure 1400 includes an inner main surface 1401, which may be substantially flat, and an inner sidewall surface 1402, which in this example joins to inner main surface 1401 via a curved (or radiused) transition region 1403 around the inner perimeter of electronic enclosure 1400. Region 1403 provides a gradual transition between inner sidewall surface 1402 and inner main surface 1401, which in one or more embodiments, may be oriented orthogonal to each other. In the configuration depicted, electronic enclosure 1400 also includes multiple inner-sidewall corners 1410, which may be configured to facilitate transition between adjoining sides of electronic enclosure 1400. By way of example, in the enlarged depiction of FIG. 14B, one inner-sidewall corner 1410 is illustrated, which joins a first side 1404 and a second side 1405 of electronic enclosure 1400. In one or more implementations, each inner-sidewall corner may be similarly configured. In the exemplary embodiment, which is presented by way of example only, inner-sidewall corner 1410 includes a flat, angled-sidewall portion 1411, and first and second curved-sidewall portions 1412, 1413 located at opposite sides of flat, angled-sidewall portion 1411 as shown.

As one example, flat angled-sidewall portion 1411 may be oriented at a 45° angle to the adjoining first side 1404 and second side 1405 of electronic enclosure 1400, which in one or more embodiments may be perpendicular to each other. In one or more implementations, first and second curved-sidewall portions 1412, 1413 may have a similar bend radius, which may be, for instance, approximately five times or greater the thickness of the tamper-respondent sensor being mounted to the inner sidewall surface of the electronic enclosure 1400. In the illustrated example, transition region 1403 between inner sidewall surface 1402 and inner main surface 1401 continues within the inner-sidewall corners 1410, where a lower part 1411' of flat, angled-sidewall portion 1411 curves outward in transition to inner main surface 1401, and lower portions 1412', 1413' of first and second curved-sidewall portions 1412, 1413 also further curve outward in transition to inner main surface 1401, as illustrated. Note that the corner configuration of FIGS. 14A & 14B is presented by way of example only, and that the present invention may be used with other corner designs without departing from the concepts disclosed herein. Also, as noted, in one or more implementations, electronic enclosure 1400 may be employed in combination with a multilayer circuit board, such as multilayer circuit board 810 described above in connection with FIGS. 8A-12, to define a secure volume about one or more electronic components or an electronic assembly, for instance, comprising an encryption and/or decryption module and associated memory.

Electronic enclosure 1400 may be fabricated of a variety of materials and have a variety of different configurations. In one or more implementations, the enclosure may be a rigid, thermally conductive enclosure (fabricated, for instance, of a metal material) to facilitate conduction of heat from one or more electronic components within the secure volume defined (at least in part) by the tamper-respondent assembly. Note also that the rectangular configuration of electronic enclosure 1400 could be replaced with any of a variety of different enclosure configurations, any one of which may include one or more inner-sidewall corners configured, by way of example, such as illustrated in FIGS. 14A & 14B.

Figure 15A:
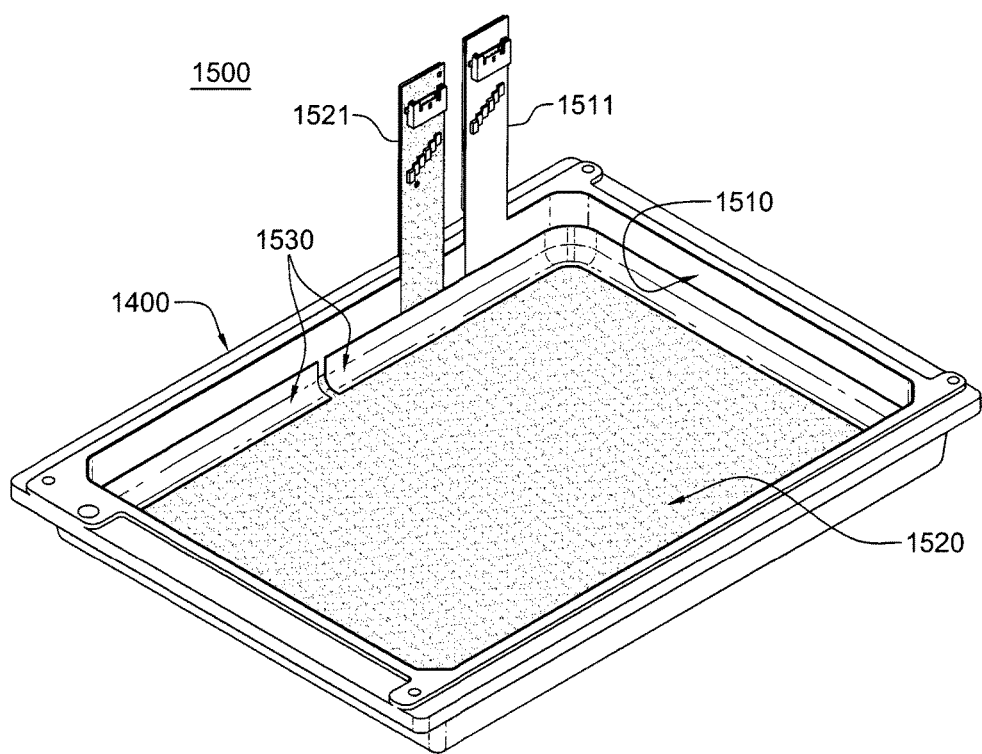
FIG. 15A depicts an underside, perspective view of one embodiment of a tamper-respondent assembly comprising an electronic enclosure such as depicted in FIGS. 14A-14B, in accordance with one or more aspects of the present invention.
Figure 15B:
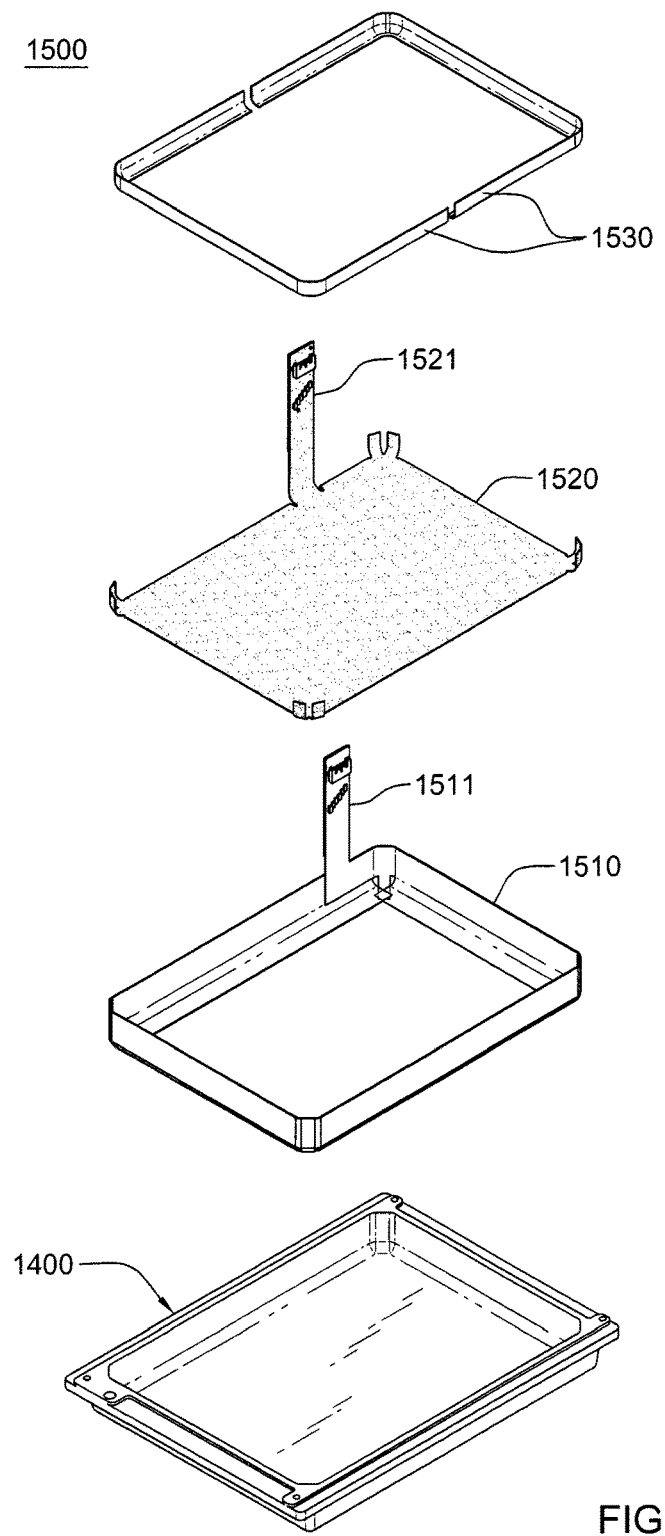
FIG. 15B depicts an exploded view of the tamper-respondent assembly of FIG. 15A, in accordance with one or more aspects of the present invention.

FIGS. 15A & 15B depict underside, isometric views of a further embodiment of a tamper-respondent assembly employing electronic enclosure 1400. Referring collectively to FIGS. 15A & 15B, in one or more implementations, tamper-respondent assembly 1500 includes electronic enclosure 1400 which, as noted, is to enclose, at least in part, one or more electronic components or an electronic assembly to be protected. Electronic enclosure 1400 includes an inner main surface, and an inner sidewall surface including at least one inner-sidewall corner, such as described above in connection with FIGS. 14A & 14B. Further, tamper-respondent assembly 1500 includes a tamper-respondent electronic circuit structure which includes at least one tamper-respondent sensor mounted to and covering, at least in part, the inner surface(s) of electronic enclosure 1400. As explained further below, the tamper-respondent sensor(s) is configured so as to facilitate good contact, and good adhesion, of the sensor to the inner surfaces of the enclosure, such as, for instance, the one or more inner-sidewall corners of the electronic enclosure 1400, to provide secure coverage of the tamper-respondent sensor(s) over the inner surface(s) of the electronic enclosure.

As illustrated, in one or more implementations, the tamper-respondent electronic circuit structure associated with electronic enclosure 1400 may include an inner-sidewall tamper-respondent sensor 1510 and an inner main surface tamper-respondent sensor 1520, along with a security band 1530. In the illustrated example, inner-sidewall tamper-respondent sensor 1510 may be formed with an integrated flex ribbon cable or extension 1511 to facilitate electrical connection of the at least one resistive network within inner-sidewall tamper-respondent sensor 1510 to appropriate monitor circuitry (not shown) disposed within, for instance, the secure volume defined, at least in part, by the tamper-respondent assembly of FIGS. 15A & 15B. Similarly, inner main surface tamper-respondent sensor 1520 may be configured with an integrated flex ribbon cable or extension 1521 to facilitate electrical connection of inner main surface tamper-respondent sensor 1520 to the monitor circuitry, as well. A bonding agent (not shown), such as a thermoset adhesive, may be employed to adhere inner-sidewall tamper-respondent sensor 1520 to inner sidewall surface 1402 (FIG. 14A) and to inner-sidewall corners 1410 (FIG. 14A). A similar adhesive could be used to adhere inner main surface tamper-respondent sensor 1520 to inner main surface 1401 (FIG. 14A) and to inner-sidewall tamper-respondent sensor 1510 where the sensors overlap. Security band 1530 may further be adhesively secured over the overlap between inner main surface tamper-respondent sensor 1520 and inner-sidewall tamper-respondent sensor 1510 covering, in one or more implementations, transition region 1403 (FIG. 14A) between the inner sidewall surface and the inner main surface around the inner perimeter of electronics enclosure 1400.

Note that, in the example provided in FIGS. 15A & 15B, inner-sidewall tamper-respondent sensor 1510 and inner main surface tamper-respondent sensor 1520 are discrete tamper-respondent sensors that overlap, at least in part, and facilitate defining a secure volume about the at least one electronic component to be protected. For instance, the secure volume may be defined by flipping over and securing the illustrated tamper-respondent assembly of FIGS. 15A & 15B to a multilayer circuit board with an embedded tamper-respondent sensor, such as described above.

Figure 16A:
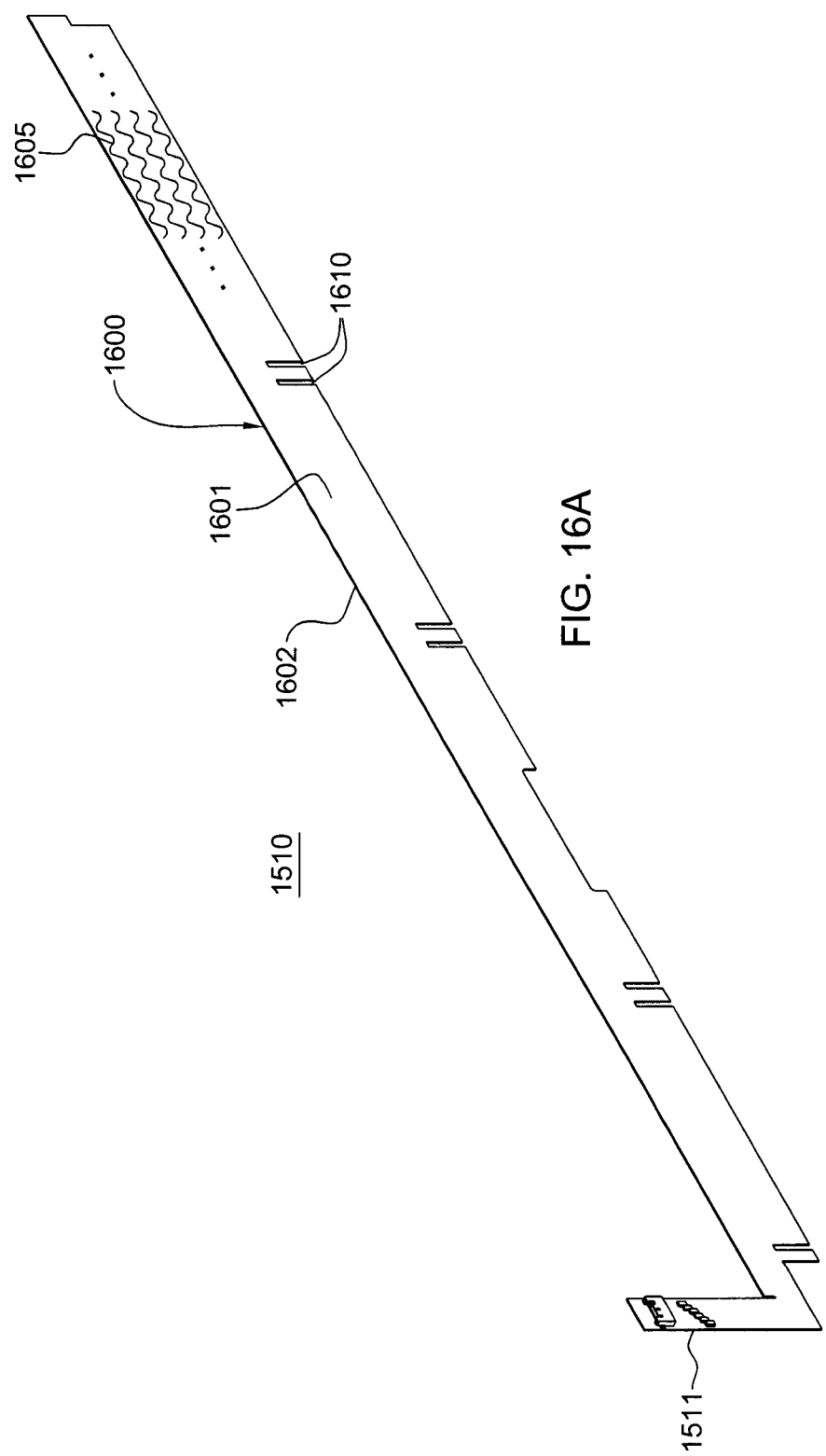
FIG. 16A is an isometric view of one embodiment of an inner-sidewall tamper-respondent sensor for covering an inner sidewall surface of electronic enclosure such as depicted in FIG. 14A, in accordance with one or more aspects of the present invention.

FIG. 16A depicts one embodiment of inner-sidewall tamper-respondent sensor 1510 of FIGS. 15A & 15B. In this embodiment, inner-sidewall tamper-respondent sensor 1510 includes at least one first layer 1600 having opposite first and second sides 1601, 1602, and circuit lines 1605 extending substantially over all of the flexible layer, and forming at least one tamper-detect network, such as described herein. For instance, circuit lines 1605 may be disposed on at least one of first side 1601 or second side 1602 of the at least one flexible layer 1600. Note that the at least one flexible layer 1600 may be fabricated as a conventional security sensor layer, or be fabricated as one of the enhanced, tamper-respondent sensors described herein. In particular, although illustrated as a non-formed, flexible layer, the at least one flexible layer 1600 of inner-sidewall tamper-respondent sensor 1510 could comprise a formed flexible layer, such as one of the sensors depicted in FIGS. 4A-5H, or multiple weaved tamper-respondent sensors, such as illustrated in FIGS. 7A-7C. As noted, extension 1511 may extend from inner-sidewall tamper-respondent sensor 1510 to facilitate electrical connection of the at least one resistive network of the inner-sidewall tamper-respondent sensor 1510 to appropriate monitor circuitry (not shown) disposed within, for instance, the secure volume defined, at least in part, by the tamper-respondent assembly of FIGS. 15A & 15B. As illustrated, in one or more implementations, inner-sidewall tamper-respondent sensor 1510 is of sufficient length to encircle the inside of the electronic enclosure, covering the inner sidewall surface thereof, and overlap at its ends. Further, multiple slots 1610 are provided within inner-sidewall tamper-respondent sensor 1510. These multiple slots 1610 are sized and positioned along the inner-sidewall tamper-respondent sensor so as to approximately align (in one or more embodiments) to respective inner-sidewall corners of the electronic enclosure to facilitate good contact, and good adhering, and bending the sensor within the inner-sidewall corners of the electronic enclosure, for instance, by allowing for regions of overlap of the inner-sidewall tamper-respondent sensor on itself.

Figure 16B:
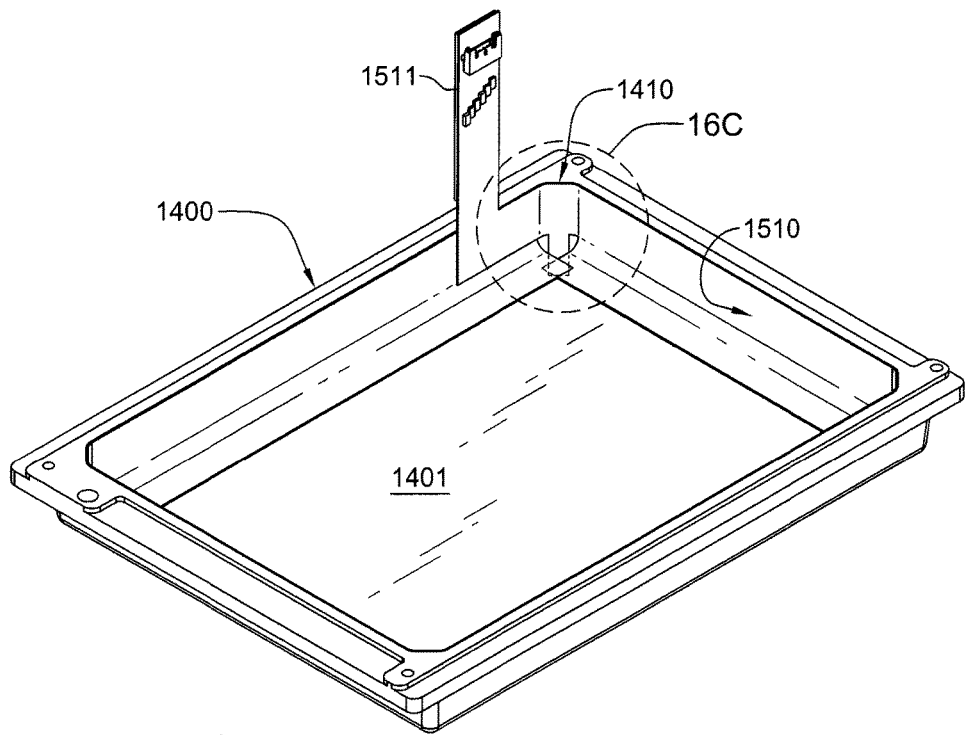
FIG. 16B depicts an underside, isometric view of the electronic enclosure and inner-sidewall tamper-respondent sensor of FIGS. 15A & 15B, with the inner-sidewall tamper-respondent sensor shown positioned over the inner sidewall surface of the electronic enclosure, in accordance with one or more aspects of the present invention.
Figure 16C:
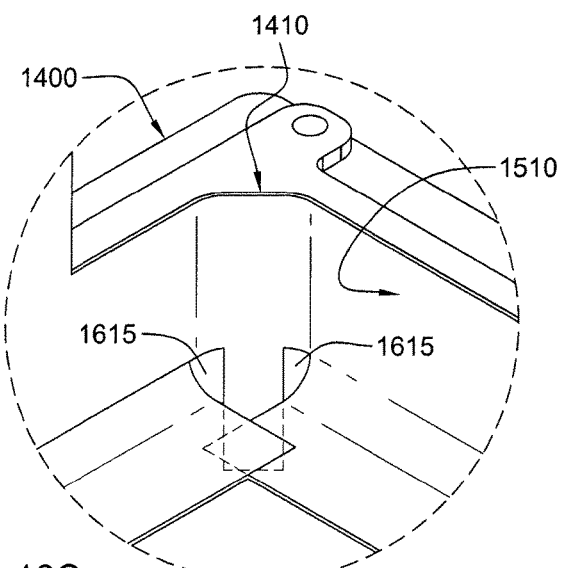
FIG. 16C is an enlarged depiction of the tamper-respondent assembly of FIG. 16B, illustrating region 16C thereof, in accordance with one or more aspects of the present invention.

FIGS. 16B & 16C depict one embodiment of inner-sidewall tamper-respondent sensor 1510 mounted within electronic enclosure 1400. As illustrated, in the exemplary embodiment, the inner-sidewall tamper-respondent sensor includes first and second slots that respectively overlie, at least in part, the first and second curved-sidewall portions 1412, 1413 (FIG. 14B) of the associated inner-sidewall corner 1410 to be covered. These first and second slots are spaced apart to reside at opposite sides of the flat, angled-sidewall portion 1411 (FIG. 14B) of the inner-sidewall corner 1410, and facilitate reducing the amount of material in the corner and thereby enhance good contact and adhesion of the inner-sidewall tamper-respondent sensor 1510 to the inner sidewall surface 1402 (FIG. 14A) of the electronic enclosure, including at the inner-sidewall corners 1410 thereof, while also reducing stress on the sensor within the corner(s). For instance, the multiple slots 1610 allow for overlapping of the inner-sidewall tamper-respondent sensor on itself at the inner-sidewall corners, as illustrated. Note that, in this configuration, the inner-sidewall tamper-respondent sensor 1510 has a width which allows the sensor to cover the transition region 1403 (FIG. 14A), as well as extend over, in part, the inner main surface 1401 of electronic enclosure 1400. Note also that one or more uncovered regions 1615 may result from the presence of the slots when the inner-sidewall tamper-respondent sensor 1510 is wrapped around the inner sidewall surface as shown, exposing portions of the inner sidewall surface at the inner-sidewall corner(s), for instance, along the seams where the inner-sidewall tamper-respondent sensor overlaps at the corner. As explained below, these regions 1615 may be covered or protected by inner main surface tamper-respondent sensor 1520 corner tabs once that sensor and its corner tabs are adhered to the assembly. This is illustrated, by way of example, in FIGS. 17A-17C.

Figure 17A:
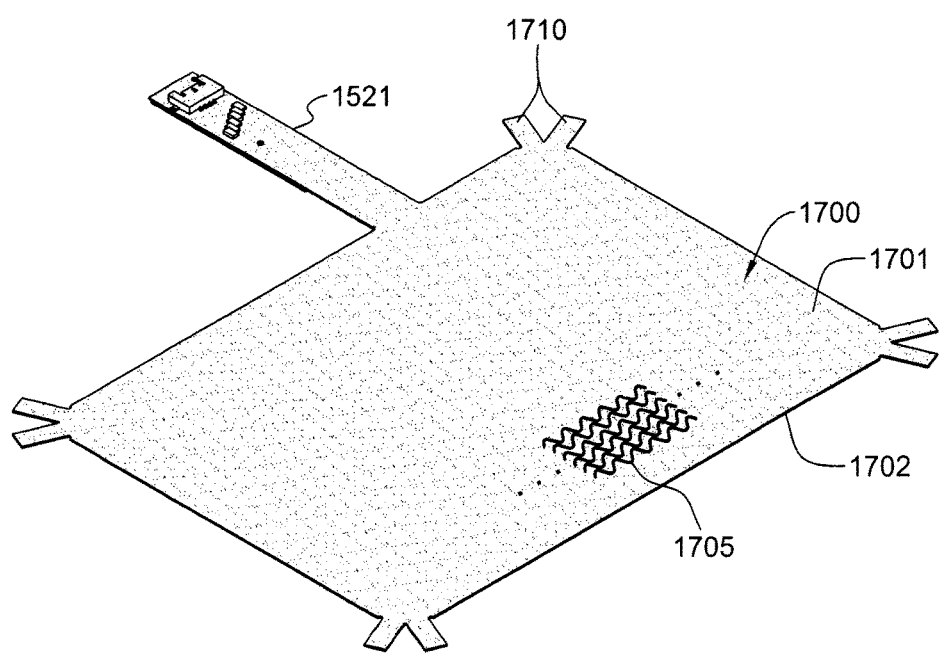
FIG. 17A is an enlarged depiction of the inner main surface tamper-respondent sensor embodiment illustrated in FIGS. 15A & 15B, in accordance with one or more aspects of the present invention.
Figure 17B:
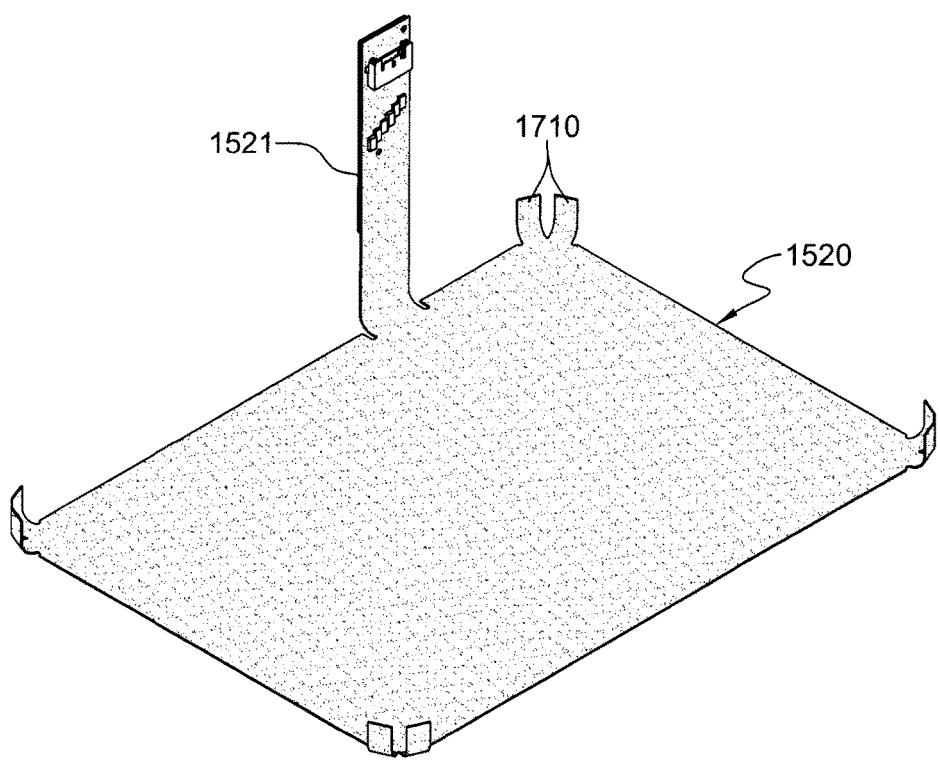
FIG. 17B depicts the inner main surface tamper-respondent sensor of FIG. 17A, with the corner tabs shown raised for positioning, as illustrated in FIGS. 15A & 15B, in accordance with one or more aspects of the present invention.
Figure 17C:
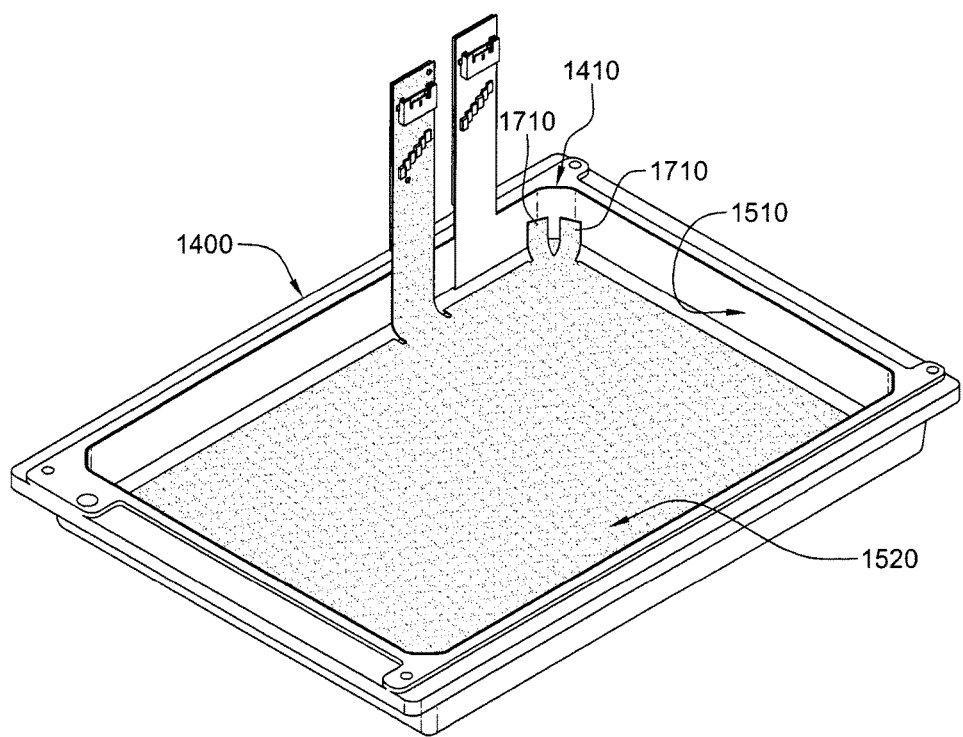
FIG. 17C depicts the tamper-respondent assembly of FIGS. 15A & 15B, with the inner main surface tamper-respondent sensor positioned therein, and with the security elements(s) removed, in accordance with one or more aspects of the present invention.

Referring collectively to FIGS. 17A-17C, inner main surface tamper-respondent sensor 1520 includes at least one flexible layer 1700 having opposite first and second sides 1701, 1702, and circuit lines 1705 extending substantially over all of the flexible layer 1700 and forming at least one tamper-detect network, such as described herein. For instance, circuit lines 1705 are disposed on one or both of first side 1701 and second side 1702 of the at least one flexible layer 1700, as described. As noted above, the at least one flexible layer 1700 may be fabricated as a conventional security sensor layer, or be fabricated as one of the enhanced, tamper-respondent sensors described herein. In particular, although illustrated as a non-formed, flexible layer, the at least one flexible layer 1700 of inner main surface tamper-respondent sensor 1520 could comprise a formed flexible layer, such as one or more of the sensors depicted in FIGS. 4A-5H, or multiple weaved tamper-respondent sensors, such as illustrated in FIGS. 7A-7C. As noted, extension 1521 may be formed integral with inner main surface tamper-respondent sensor 1520 to facilitate electrical connection of the at least one associated resistive network to monitor circuitry (not shown) within the secure volume being defined, at least in part, by the tamper-respondent assembly of FIGS. 15A & 15B; for instance, in association with a multilayer circuit board having an embedded tamper-respondent sensor therein, as described above.

In the depicted configuration, multiple corner tabs 1710 are provided, with at least one corner tab 1710 being provided at the at least one inner-sidewall corner. In the exemplary embodiment illustrated, two corner tabs 1710 are provided at each corner of the inner main surface tamper-respondent sensor 1520. These corner tabs 1710 include circuit lines 1705 (FIG. 17A) and are sized to cover a respective one of the uncovered regions 1615 in inner-sidewall tamper-respondent sensor and enclosure assembly which remain after securing inner-sidewall tamper-respondent sensor 1510 to electronic enclosure 1400, as illustrated in FIGS. 16B & 16C. In particular, those skilled in the art should understand that corner tabs 1710 include respective portions of the at least one tamper-detect network provided by inner main surface tamper-respondent sensor 1520, such that if an attempt were made to breach the tamper-respondent assembly 1500 through the underlying, uncovered regions 1615 of the inner sidewall surface, the respective corner tab would be contacted, thereby resulting in detection of the attempted breach.

As noted above in connection with FIGS. 15A & 15B, reinforcement of the overlap between inner-sidewall tamper-respondent sensor 1510 (FIG. 15A) and inner main surface tamper-respondent sensor 1520 (FIG. 15) may be provided, in one or more implementations, by one or more physical security structures, such as security band 1530. One potential point of exposure for a tamper-respondent assembly such as described herein would be at an overlap between two or more tamper-respondent sensors, such as at an overlap between an inner-sidewall tamper-respondent sensor and an inner main surface tamper-respondent sensor. For instance, an attack on a tamper-respondent assembly could entail drilling through the enclosure and chemically attaching an overlapped bond area between two tamper-respondent sensors of the tamper-respondent electronic circuit structure, such as the overlap area where inner main surface tamper-respondent sensor 1520 is adhesively secured over inner-sidewall tamper-respondent sensor 1510. To address this concern, a physical security structure, such as security band 1530, may be provided. Note that security band 1530 is one embodiment only of a physical security structure which could be employed to overlie and physically secure in place, at least in part, one or more tamper-respondent sensors covering one or more inner surfaces of an electronic enclosure, such as described herein.

Generally stated, in one or more implementations, disclosed herein is a tamper-respondent assembly which includes an electronic enclosure to enclose, at least in part, at least one electronic component to be protected, wherein the electronic enclosure includes an inner surface. The tamper-respondent assembly also includes a tamper-respondent electronic circuit structure comprising a tamper-respondent sensor lining and covering, at least in part, the inner surface of the electronic enclosure. The tamper-respondent sensor may include a flexible layer having opposite first and second sides, and circuit lines substantially covering at least one of the first side or the second side of the flexible layer, forming at least one tamper-respondent network, such as described herein. The flexible layer of the tamper-respondent sensor could be a non-formed sensor layer or a formed sensor layer, in accordance with one or more of the sensor layer embodiments described herein.

Figure 18:
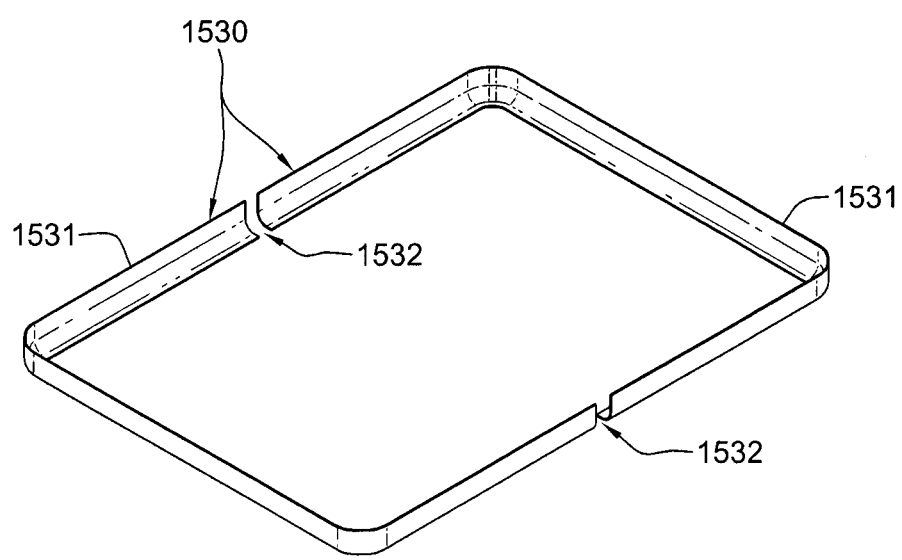
FIG. 18 is a perspective view of the security elements(s) illustrated in FIGS. 15A & 15B for the tamper-respondent assembly depicted, in accordance with one or more aspects of the present invention.

The tamper-respondent assembly further includes a physical security structure, such as at least one security element, that overlies and physically secures in place, at least in part, the tamper-respondent sensor covering, at least in part, the inner surface of the electronic enclosure. In the embodiment of FIGS. 15A & 15B, security band 1530 is illustrated which includes multiple security elements 1531, as shown in enlarged view in FIG. 18. Note that the security structure, such as security band 1530, could comprise a single element or multiple elements, depending on the desired configuration. In the example of FIGS. 15A, 15B & 18, two substantially identical, U-shaped security elements 1531 are illustrated, by way of example only. In the depicted embodiment, security elements 1531 are spaced apart, with gaps 1532 therebetween. By providing two or more security elements 1531, to define a desired physical security structure (such as security band 1530) manufacturing tolerances may be better accommodated within the tamper-respondent assembly. By way of example, the gaps 1532 between adjacent security elements of the multiple, distinct security elements 1531, may be on the order of several millimeters. Note that although illustrated as two security elements 1531, any number of physical security elements could be provided within the tamper-respondent assembly, and any number of security structures, such as multiple security bands or plates, could be provided within the tamper-respondent assembly as desired to provide additional mechanical securing of the tamper-respondent sensor(s) in place over the inner surface of the electronic enclosure.

In the example of FIGS. 15A, 15B & 18, the physical security structure is configured as a security band or collar comprising multiple distinct security elements 1531 which extends substantially fully around the inner perimeter of the electronic enclosure 1400. The security band 1530 is sized and positioned to overlie and physically secure in place at least the overlap of the inner main surface tamper-respondent sensor and the inner-sidewall tamper-respondent sensor, as illustrated in FIG. 15A. In one or more implementations, security band 1530 may be adhesively secured to the tamper-respondent sensors. Note that in this example, security band 1530, comprising security elements 1531, extends around the inner perimeter, including through the inner-sidewall corners, as illustrated in FIG. 15A. In this manner, security elements 1531 advantageously overlie and secure in place the overlap(s) of the inner-sidewall tamper-respondent sensor and the inner main surface tamper-respondent sensor at the inner-sidewall corners of the electronic enclosure. By way of example, in the embodiment depicted, security band 1530, or more particularly, security elements 1531, overlie and physically secure in place the multiple corner tabs 1710 (FIG. 17C) projecting from the inner main surface tamper-respondent sensor 1520 at the inner-sidewall corners of the electronic enclosure. This advantageously prevents an attack against the tamper-respondent assembly through the areas lined by the multiple corner tabs projecting from the inner main surface of the tamper-respondent sensor. The security band 1530 creates a mechanical barrier that prevents the tamper-respondent sensors from being separated.

In one or more enhanced embodiments, the security element(s) defining the security band, or more generally, the physical security structure, are formed (for instance, by stamping) a metal material, or metal alloy, such as copper, soft stainless steel, etc. Further, the metal security element(s) may advantageously be electrically connected to ground to further enhance detection capabilities of the tamper-respondent assembly. By forming the security element(s) of a metal that is difficult to drill through, then, if an attempt were made to drill through the security element, metal fragments would be created, which potentially could be pulled into the sensor layer(s) lining the inner surface of the electronic enclosure, which would result in a greater chance of shorting or otherwise damaging the circuit lines forming the one or more tamper-respondent networks of the sensor during the attack, and thus enhance detection capability of the tamper-respondent sensor. Further, by electrically grounding the security element(s), then a drill contacting the grounded security element(s) after drilling through one or more tamper-respondent sensors would be more likely to short one or more of the circuit lines forming the at least one tamper-detect network in the associated tamper-respondent sensor(s). By grounding the security element(s), another path for current to flow is established, which advantageously increases the likelihood of detecting an attempt to tamper with the tamper-respondent assembly. Note that grounding of the security element(s) could be by any means, such as by electrically connecting the elements to one or more ground lines on the electronic assembly being protected by the tamper-respondent assembly, or (in certain of the embodiments disclosed herein) by electrically connecting the elements to one or more ground planes within the multilayer circuit board forming, in part, the secure volume about the electronic assembly being protected. In one or more implementations, the security element(s), or more generally, the security band or physical security structure, may be preformed (e.g., by stamping) into the desired shape, for example, to accommodate and overlie the overlap between the inner-sidewall tamper-respondent sensor and the inner main surface tamper-respondent sensor, such as depicted in FIG. 15A.

As a further enhancement, increased sensor sensitivity to a tamper event may be provided by fabricating the tamper-respondent assembly, and in particular, the tamper-respondent sensor, to include one or more regions with increased fragility or susceptibility to damage from mechanical stress resulting from or associated with a tamper event. By including circuit lines or traces of the tamper-respondent sensor at least in part within the one or more regions of increased susceptibility to damage, then there is an increased likelihood that one or more of the circuit lines may be damaged during the tamper event due the associated mechanical stress, thus enhancing ability to detect the tamper event. The one or more regions of the tamper-respondent sensor having increased susceptibility may be formed using a variety of approaches, such as selective laser ablation or etching of the sensor, configuring the sensor with cutout areas to define stress-concentrating inner edges, and/or directly adhering exposed circuit lines to a rigid surface of the tamper-respondent assembly. By way of example, FIGS. 19A-20B depict examples of tamper-respondent assemblies with one or more tamper-respondent sensors having one or more regions of increased susceptibility to damage due to mechanical stress associated with a tamper event.

Referring to FIG. 19A, a tamper-respondent assembly 1900 is depicted comprising a structure 1901 having a rigid surface 1902. By way of example only, structure 1901 could comprise an electronic enclosure or housing surrounding, at least in part, one or more electronic components to be protected. By way of specific example, rigid surface 1902 could be an outer surface of an electronic enclosure, or an inner surface of an electronic enclosure. FIGS. 6A-6G depict exemplary embodiments of one or more tamper-respondent sensors of a tamper-respondent electronic circuit structure being adhered to an outer surface of an electronic enclosure, while FIGS. 8A-17C depict exemplary embodiments of one or more tamper-respondent sensors being adhered to an inner surface of an electronic enclosure. Still further, structure 1901 might be or comprise any rigid structure of an electronic assembly, or cooling apparatus associated with an electronic assembly to be protected. In one or more specific instances, structure 1901 could comprise a heat sink, such as a thermal spreader.

As illustrated, tamper-respondent assembly 1900 includes a tamper-respondent electronic circuit structure comprising a tamper-respondent sensor 1910. In the depicted embodiment, tamper-respondent sensor 1910 includes one or more flexible layers 1911 having opposite first and second sides 1912, 1913, and circuit lines 1915, 1915' forming, at least in part, at least one tamper-detect network. For instance, the circuit lines may form, at least in part, at least one resistive network electrically coupled to monitor circuitry such as described herein. By way of example, first circuit lines 1915 are disposed on first side 1912, and second circuit lines 1915' are disposed on second side 1913 of flexible layer 1911. The circuit lines may be in the same or different patterns, as described above. Further, note that there may be any number of flexible layers 1911, and any number of circuit line 1915, 1915' layers provided within tamper-respondent sensor 1910 as discussed above, for instance, in connection with FIGS. 3A-3E, with the illustrated embodiment being provided by way of example only.

In accordance with one or more aspects of the present invention, circuit lines 1915 at first side 1912 of flexible layer 1911 are exposed, that is, any overlying protective layer, such as a polyimide layer, is at least partially, or fully, removed in the region to be secured to rigid surface 1902 of structure 1901. Note that circuit lines 1915, 1915' may be formed of a variety of materials including, for instance, a metal or metal alloy. For instance, first circuit lines 1915 could be formed from copper, silver, silver-carbon, nickel-phosphorous. Alternatively, other materials, such as conductive ink or Omega-Ply®, or Ticer™, could be employed.

In the exemplary embodiment, an adhesive 1920, such as a thermoset material, is used to adhere or laminate tamper-respondent sensor 1910 to rigid surface 1902. In particular, in the embodiment depicted, the exposed first circuit lines 1915 on first side 1912 are directly, adhesively secured to rigid surface 1902 of structure 1901. In one or more implementations, adhesive 1920 is selected with a bond strength to secure first circuit lines 1915 to rigid surface 1902 that is equal or greater to a bond strength of first circuit lines 1915 to first side 1912 of one or more flexible layers 1911. In this manner, should a tamper event occur comprising an attempt to physically separate tamper-respondent sensor 1910 from structure 1901, one or more of first circuit lines 1915 will likely separate from flexible layer 1911, and thus be broken, with the resultant broken lines enhancing the ability of the tamper-respondent electronic circuit structure to detect the tamper event.

In one or more embodiments, setoff elements could be provided between rigid surface 1902 of structure 1901 and first side 1912 of tamper-respondent sensor 1910 to ensure the presence of a gap between first side 1912 of tamper-respondent sensor 1910 and the rigid surface 1920, and thus ensure that adhesive 1920 remains between the two surfaces during a fabrication approach where pressure may be applied to force the surfaces together to, for instance, facilitate the laminating of tamper-respondent sensor 1910 to structure 1901. In one or more implementations, the setoff elements could be dispersed throughout adhesive 1920 and may comprise, for instance, spherical elements 1922, such as glass spheres, disposed within the adhesive. Alternatively, in one or more implementations, rigid surface 1902 could be formed with one or more standoffs extending from the surface a desired gap distance.

FIG. 19B depicts an alternate embodiment of a tamper-respondent assembly 1900', in accordance with one or more aspects of the present invention. In this embodiment, structure 1901 of FIG. 19A is replaced by an electronic enclosure 1400, such as described above in connection with FIGS. 14A & 14B, as a further example. Electronic enclosure 1400 includes a rigid surface 1902', which may be, for instance, the inner main surface 1401 (FIG. 14A) or inner-sidewall surface 1402 (FIG. 14A) in the exemplary embodiment of FIGS. 14A & 14B.

As illustrated in FIG. 19B, in one or more implementations, tamper-respondent assembly 1900' may also include a tamper-respondent sensor 1910', and another structure 1930, with another rigid surface 1932. By way of example, in one or more implementations, another structure 1930 may comprise a cooling structure, such as a thermal spreader, provided to facilitate cooling of one or more components within the electronic enclosure.

In one or more embodiments, tamper-respondent sensor 1910' may comprise a stack of tamper-respondent layers secured together via an adhesive layer 1925, such as a double-sided adhesive film, similar to the structure described above in connection with FIG. 3C. However, in this example, the circuit line widths and line-to-line spacings may be of any desired dimension, with the above-described line widths and spacings of ≤200 μm, respectively, being one example. Tamper-respondent sensor 1910' includes multiple layers of circuit lines 1915, 1915' which may be electrically connected to define one or more tamper-detect networks, such as one or more resistive networks. Any of the various materials described herein, or other known materials, may be employed to form the circuit lines. The circuit lines are provided on one or both sides of respective flexible layers 1911, with first circuit lines 1915 being provided on a first side of each flexible layer 1911, and second circuit lines 1915' being provided on a second side of the layer, as one example only. The flexible layers 1911 may be formed of any flexible, dielectric material, such as a polyester material. Alternatively, the flexible layers 1911 could be formed of a crystalline polymer, such as the above-described PVDF, or Kapton, or other crystalline-polymer material.

In accordance with one or more aspects of the present invention, a portion of circuit lines 1915 is exposed on the upper side and a portion of circuit lines 1915' is exposed on the lower side of tamper-respondent sensor 1910'. The exposed circuit lines 1915, 1915' are respectively laminated using an adhesive layer 1920, 1920', to rigid surface 1902' of electronic enclosure 1400, or to rigid surface 1932 of another structure 1930, as illustrated. That portion of tamper-respondent sensor 1910' adhered to electronic enclosure 1400 and/or to another structure 1930 defines the one or more regions of the tamper-respondent sensor having the increased susceptibility to damage from mechanical stress associated with a tamper event. That is, should a tamper event attempt to delaminate the tamper-respondent sensor from one or both of electronic enclosure 1400 and another structure 1930, then adhesive layers 1920, 1920' bonding the structures to the first side and the second side of tamper-respondent sensor 1910', will likely cause one or more of the exposed circuit lines 1915, 1915' to delaminate from the tamper-respondent sensor as the structures are separated, causing breaks in the circuit lines, and thereby facilitating detection of the tamper event by monitor circuitry of the tamper-respondent electronic circuit structure. As noted, this result can be facilitated by selecting the adhesive 1920, 1920' to have, for instance, an equal or greater bond strength than the bond strength holding circuit lines 1915, 1915' to their respective sides of the tamper-respondent sensor 1910'.

As noted, in the embodiments depicted in FIGS. 19A & 19B, the circuit lines may comprise a metal, such as copper, laminated directly to a rigid surface of the tamper-respondent assembly to define regions of the tamper-respondent sensor that have increased susceptibility to damage from mechanical stress associated with a tamper event, such as a tamper event which physically disturbs the lamination of the tamper-respondent sensor to the rigid surface. In one or more other implementations, the region(s) of the tamper-respondent sensor with increased susceptibility may be provided by increasing fragility of the tamper-respondent sensor. This may be accomplished, for example, through the provision of cutout areas in the sensor, such as channels, notches, openings, etc., which define one or more stress-concentrating inner edges (or stress risers) within the tamper-respondent sensor. Various examples of this approach are depicted in FIGS. 20A & 20B.

Figure 20A:
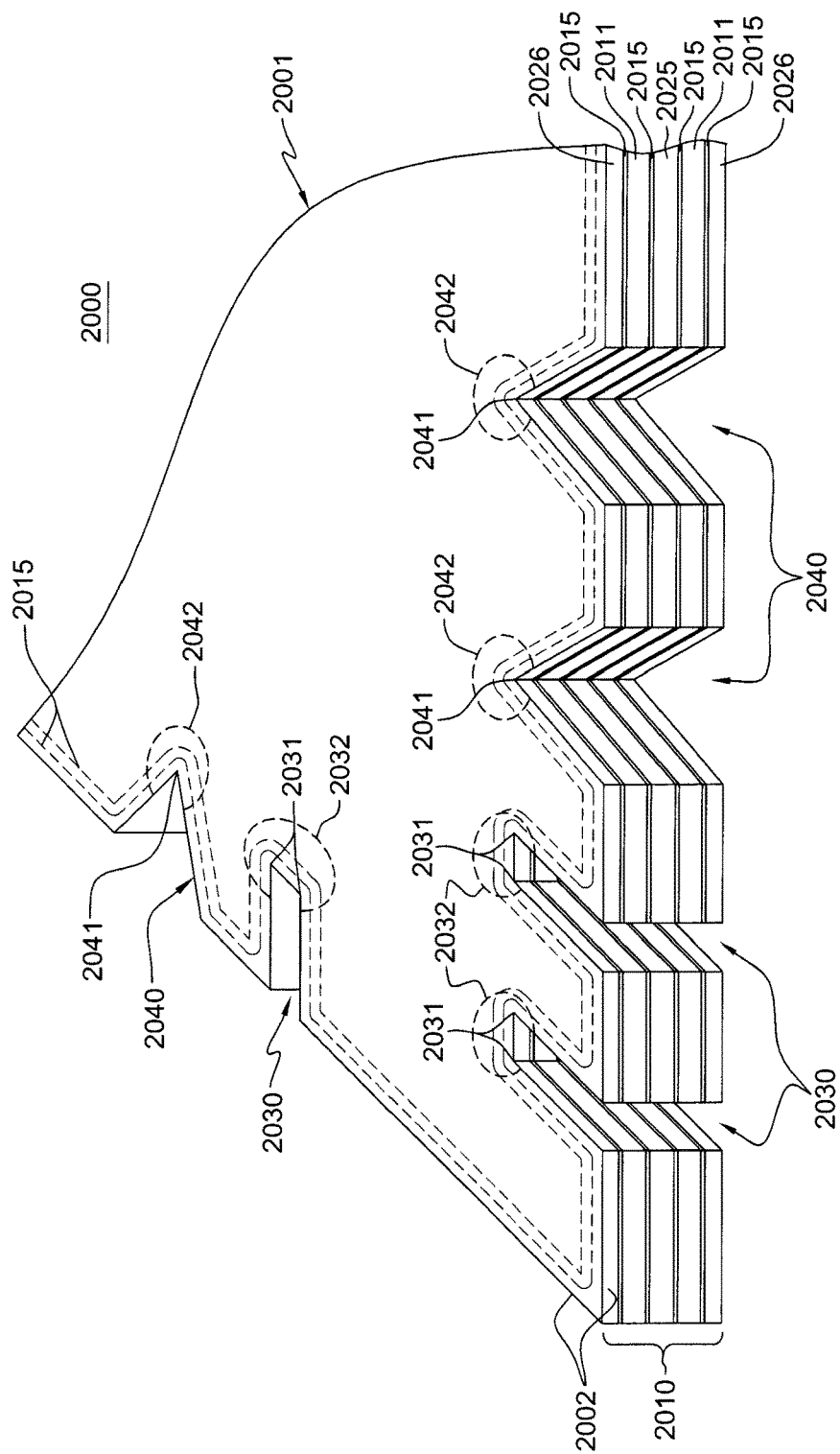
FIG. 20A is a partial isometric view of a further embodiment of a tamper-respondent sensor for a tamper-respondent assembly, in accordance with one or more aspects of the present invention.
Figure 20B:
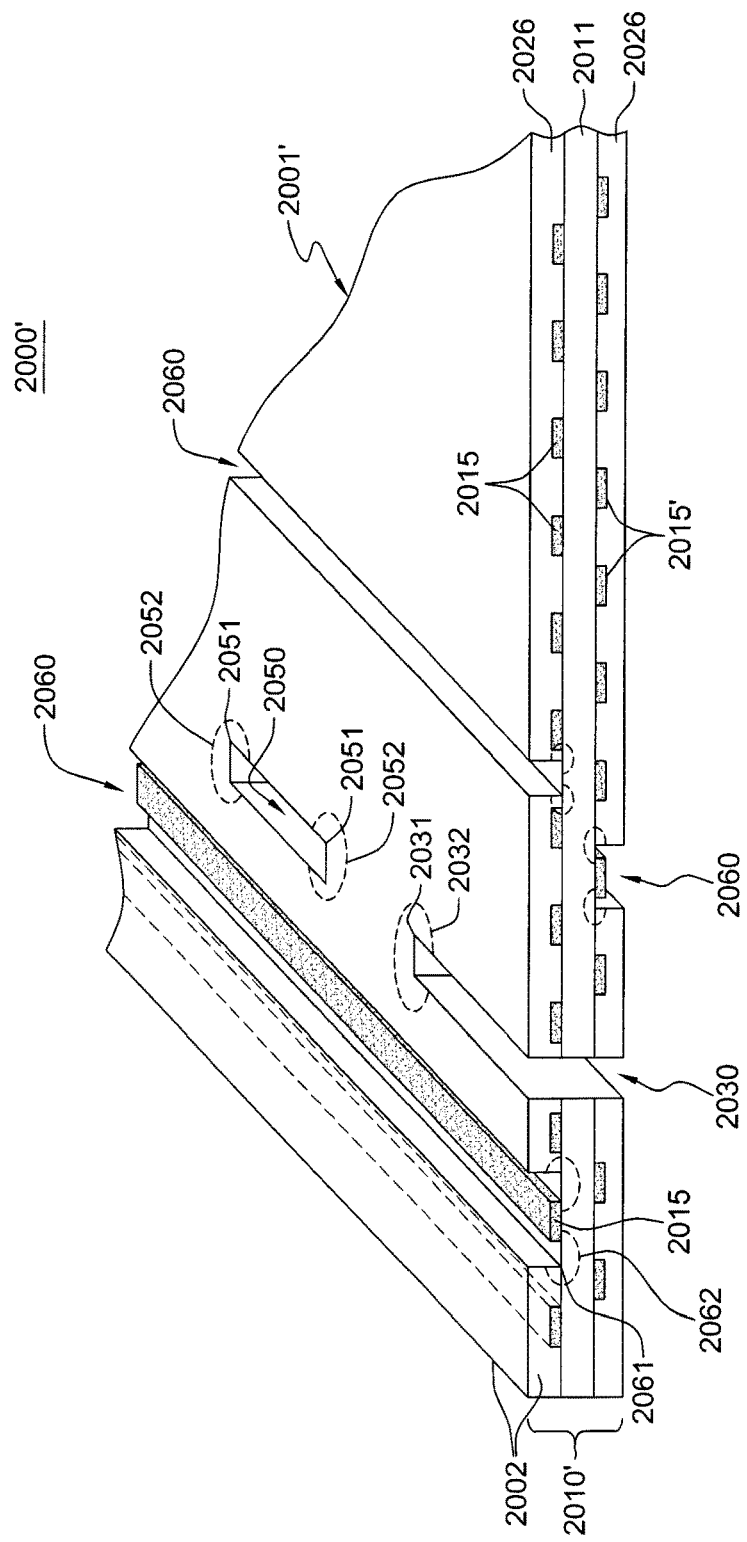
FIG. 20B is a partial isometric view of another embodiment of a tamper-respondent sensor for a tamper-respondent assembly, in accordance with one or more aspects of the present invention.

Referring to FIG. 20A, one embodiment of a tamper-respondent assembly 2000 is illustrated. As shown, tamper-respondent assembly 200 includes a tamper-respondent sensor 2001, with multiple peripheral edges 2002 of tamper-respondent sensor 2001 being shown. As described herein, such as with reference to FIGS. 3A-3E, tamper-respondent sensor 2001 includes one or more flexible layers 2011, and one or more layers of circuit lines 2015 on one or both opposite sides of each flexible layer 2011. The circuit lines 2015 may be electrically connected to define one or more tamper-detect networks, such as one or more resistive networks. The tamper-respondent layers within the stack may be adhesively laminated together using, for instance, a double-sided adhesive film 2025, as discussed above.

Multiple regions 2032, 2042 within tamper-respondent sensor 2001 of increased susceptibility to damage from mechanical stress are defined in this example by providing the tamper-respondent sensor with one or more cutout areas 2030, 2040. In the exemplary embodiment, cutout areas 2030 are illustrated as rectangular-shaped cutouts, extending into the sensor from one or more peripheral edges 2002, and cutout areas 2040 are triangular-shaped cutouts, extending into the sensor from one or more peripheral edge 2002 of the tamper-respondent sensor 2001. In each instance, cutout areas 2030, 2040 define stress-concentrating inner edges 2031, 2041, which (in this example) extend vertically through tamper-respondent sensor 2001. These edges 2031, 2041 are stress risers which define the regions 2032, 2042, respectively, of increased susceptibility to damage within tamper-respondent sensor 2001. The regions 2032, 2042 are locations within the sensor 2001 where stress is concentrated due to the provision of the stress-concentrating inner edges 2031, 2041. For instance, circuit lines 2015 may be provided which follow the contours of tamper-respondent sensor 2001 and extend, at least in part, through the respective regions 2032, 2042 of increased susceptibility to damage. In this manner, should a tamper event occur, mechanical stress within the tamper-respondent sensor will be concentrated by the stress-concentrating inner edges 2031, 2041, in regions 2032, 2042 of the sensor, thereby increasing a likelihood of a break in one or more of the circuit lines 2015 within those regions. This increased likelihood of a break facilitates detection of the tamper event by the monitor circuitry of the tamper-respondent electronic circuit structure.

Note that the circuit lines 2015 may be provided in any desired configuration or pattern on the various flexible layers 2011, as described herein. For instance, a rectangular grid of circuit lines could be provided in one or more layers which intersects, at least in part, the regions 2032, 2042 of increased susceptibility to damage from mechanical stress associated with a tamper event. Note also that regions 2032, 2042 of the tamper-respondent sensor are distinct regions of the sensor, separate from the balance of the tamper-respondent sensor, which may be characterized as being a standard robustness region outside of the regions 2032, 2042 created with the increased susceptibility to damage from mechanical stress. Thus, the tamper-respondent sensor may be thought of as being divided into different regions, a standard robustness region, and the regions 2032, 2042 of increased susceptibility to damage resulting from the provision of stress risers within the tamper-respondent sensor.

Note that any stress in one or more of regions 2032, 2042 of increased susceptibility to damage may extend vertically across multiple layers of the tamper-respondent sensor 2001, or be associated with one or more particular tamper-respondent layers (or flexible layers) within the tamper-respondent sensor 2001, dependent, for instance, on the tamper event. In one or more implementations, the cutouts, comprising for instance cutout areas 2030 and/or cutout areas 2040, may extend around a portion or all of the periphery of tamper-respondent sensor 2001, in any desired configuration and number. Further, any cutout configuration may be used that provides stress-concentration regions within the tamper-respondent sensor, for instance, due to the presence of one or more stress-concentrating inner edges (or stress risers). Additional embodiments of this concept are depicted in FIG. 20B.

Referring to FIG. 20B, a tamper-respondent assembly 2000' is illustrated as comprising a tamper-respondent sensor 2001' of a tamper-respondent electronic circuit structure. The tamper-respondent sensor 2001' is partially depicted, with a corner thereof shown defined by peripheral edges 2002. In this implementation, a cutout area 2030 is again depicted, defining (for instance) multiple stress-concentrating inner edges 2031 which define an adjoining region or regions 2032 of the tamper-respondent sensor having increased susceptibility to damage from mechanical stress within the sensor. By way of further example, in line with cutout area 2030, one or more openings 2050 are formed extending through tamper-respondent sensor 2001'. The one or more openings 2050 include one or more stress-concentrating inner edges 2051 extending vertically through tamper-respondent sensor 2001', which respectively define one or more regions 2052 within the tamper-respondent sensor having increased susceptibility to damage from mechanical stress within the sensor accompanying a tamper event. The stress-concentrating inner edges 2051 associated with opening 2050 again increase likelihood of damage to those portions of circuit lines 2015 of the tamper-respondent sensor 2001' extending through the one or more of the regions of higher susceptibility to damage. For instance, tamper-respondent sensor 2001' may be more likely to delaminate in regions 2052 of increased susceptibility to damage in response to a tamper event. Note that any mechanical stress within the tamper-respondent sensor may propagate through the sensor and be concentrated by the stress-concentrating inner edges 2051 within regions 2052, resulting in increased susceptibility to damage for any circuit lines extending through those regions.

In the exemplary embodiment of FIG. 20B, tamper-respondent sensor 2001' is illustrated as comprising one or more flexible layers 2011 having opposing first and second sides, with circuit lines 2015 disposed on the opposing first and second sides. Protective layers 2026 are disposed over the first and second sides of the one or more flexible layers 2011 and circuit lines 2015. By way of example, protective layers 2026 may comprise a polyimide material, as one example only.

As illustrated, cutout areas 2060 may also, or alternatively, by provided as one or more channels extending through protective layers 2026 above and/or below the one or more flexible layers 2011 and circuit lines 2015. These cutout areas 2060 again comprise stress-concentrating inner edges 2061, which define regions 2062 adjoining the edges within the tamper-respondent sensor 2001' that have increased susceptibility to damage from mechanical stress accompanying a tamper event against tamper-respondent sensor 2001'. As in the embodiments described above, circuit lines 2015 may extend, at least in part, through regions 2062 of increased susceptibility to damage, and thus, should a tamper event occur which generates mechanical stress within tamper-respondent sensor 2001', any circuit lines within the regions of increased susceptibility to damage, for instance, in regions adjoining the stress-concentrating inner edges 2061, will more likely be damaged or break (that is, compared with the balance of the tamper-respondent sensor, characterized above as the standard robustness region of the sensor), thereby enhancing likelihood of detection of the tamper event by the monitor circuitry of the tamper-respondent electronic circuit structure comprising the tamper-respondent sensor 2001'.

Those skilled in the art will note that, disclosed herein are various enhancements to creating a secure volume for accommodating one or more electronic components, such as one or more encryption and/or decryption modules and associated components of a communications card or other electronic assembly. In certain embodiments, the tamper-respondent assembly, or tamper-proof electronic package, includes a tamper-respondent electronic circuit structure comprising one or more tamper-respondent sensors in various configurations disposed, for instance, external to or internal to an electronic enclosure to contain the electronic component(s) or electronic assembly to be protected. The tamper-respondent electronic circuit structure may also include tamper-detect monitor circuitry which monitors, for instance, for changes in resistance in one or more tamper-detect networks, such as one or more resistive networks, defined (at least in part) by circuit lines within the tamper-respondent sensor(s).

In one or more embodiments, the tamper-respondent sensor may be implemented as a fine-pitch flex circuit being formed, for instance, of multiple stacked layers of flexible film, such as the above-described crystalline-polymer material, with Kapton being one specific example. On one or more sides of each flexible layer, circuit lines are provided and electrically connected to facilitate defining one or more tamper-detect networks of the tamper-respondent sensor. In one or more implementations, line width and pitch may be significantly reduced in size from conventional approaches to, for instance, ≤200 µm. The circuit lines may be formed of any appropriate material, including a metal or metal alloy such as copper, silver, nickel-phosphorous (NiP), Omega-Ply®, or Ticer™. The flexible layers with the circuit lines are enclosed, for instance, by polyimide, such that the circuit lines are unexposed within the tamper-respondent sensor, and the tamper-respondent sensor provides a secure defense against a mechanical or physical intrusion through the sensor into a secure volume defined, at least in part, by the tamper-respondent sensor.

A variety of tamper-respondent assembly configurations are disclosed herein which may employ an adhesive in one or more external bond regions on a surface of the tamper-respondent sensor(s) to secure, for instance, a tamper-respondent sensor in an operative position within the tamper-respondent assembly. By way of example, the adhesive may be employed to maintain a particular configuration of the tamper-respondent sensor about an electronic enclosure, or to bond two or more tamper-respondent sensors together in a multi-sensor configuration, or to position a tamper-respondent sensor relative to an electronic enclosure of a tamper-respondent assembly, such as over an inner surface of an electronic enclosure. These external bond regions could be susceptible to chemical attack against the adhesive.

Therefore, by way of further enhancement, increased sensitivity to a tamper event may be provided by fabricating the tamper-respondent assembly to include conductive traces positioned and fabricated to have increased mechanical and/or chemical fragility or susceptibility to damage from a tamper event, and in particular to a tamper event at an external bond or overlap region of the sensor. For instance, one or more conductive traces may be exposed within a bond region(s) of one or more tamper-respondent sensors, and an adhesive provided contacting the conductive trace(s) within the bond region(s) of the tamper-respondent sensor(s). By directly contacting the adhesive to the conductive traces, any attempt to mechanically and/or chemically tamper with the adhesive, to facilitate gaining access to the secure volume within the tamper-respondent assembly, is more likely to damage one or more conductive traces, and thus be detected. Note in this regard, that by forming the conductive traces of a chemically compromisable or dissolvable conductive material during a chemical attack on the adhesive, then the conductive traces will likely be damaged during the attack on the adhesive. In this manner, the exposed conductive traces provide increased fragility or susceptibility to mechanical and/or chemical attack at the external bond region(s).

As noted, the at least one external bond region may be a region of the tamper-respondent sensor(s) where the sensor adheres to another surface, such as the surface of a rigid structure of the tamper-respondent assembly, or the surface of another tamper-respondent sensor, in a multi-tamper-respondent sensor embodiment, or even to another region of the same tamper-respondent assembly, such as depicted (for instance) in FIG. 6A. In each of these examples, one or more conductive traces could be provided to form, for instance, an outer tamper-detect network that is exposed, at least in part, on a surface of the one or more tamper-respondent sensors within the bond region(s) of the sensor(s).

In one or more embodiments, these one or more conductive traces may be distinct conductors from the unexposed circuit lines on the flexible layers within the tamper-respondent sensor(s). For instance, and as noted, conductive traces may be formed of a chemically compromisable or dissolvable material susceptible to damage during a chemical attack of the adhesive within the bond region(s) of the tamper-respondent sensor(s) to facilitate detecting the chemical attack, whereas the unexposed circuit lines forming the tamper-respondent sensor may be of a different conductive material (and may even be of different line width, and/or line-to-line spacing) to facilitate, for instance, securing the one or more electronic components to be protected against a mechanical tamper event through the sensor. In one or more examples, the circuit lines within the tamper-respondent sensor(s) may be smaller and of closer pitch than the conductive traces exposed on the surface of the tamper-respondent sensor(s) within the bond region(s). The one or more conductive traces forming the outer tamper-detect network may be placed on the tamper-respondent sensor(s) in any location susceptible to a chemical attack, such as where adhesive is employed to bond the tamper-respondent sensor to another surface of the tamper-respondent assembly, such as to an electronic enclosure, or to another tamper-respondent sensor of the assembly, or even to itself, depending on the implementation.

Figure 21A:
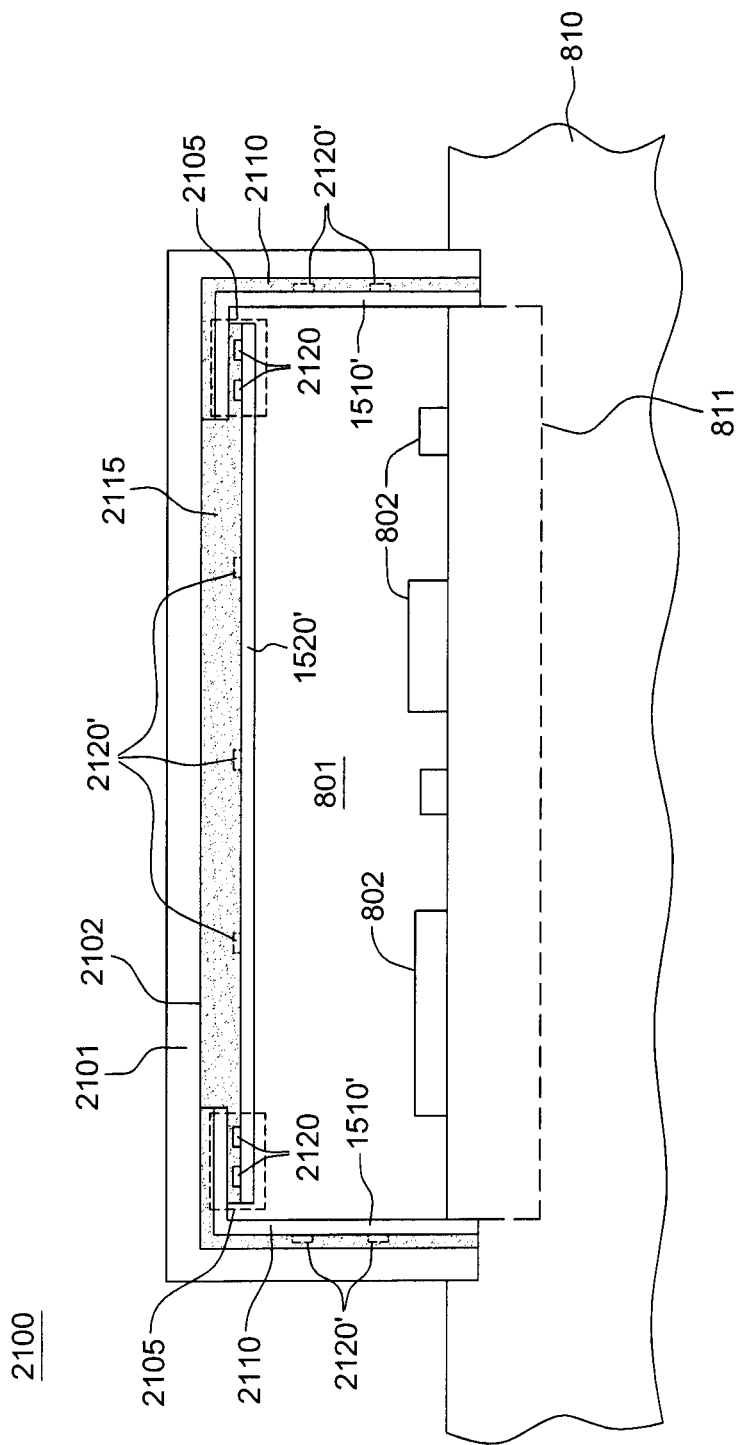
FIG. 21A is a cross-sectional elevational view of another embodiment of a tamper-respondent assembly comprising first and second tamper-respondent sensors secured to an electronic enclosure, in accordance with one or more aspects of the present invention.
Figure 21B:
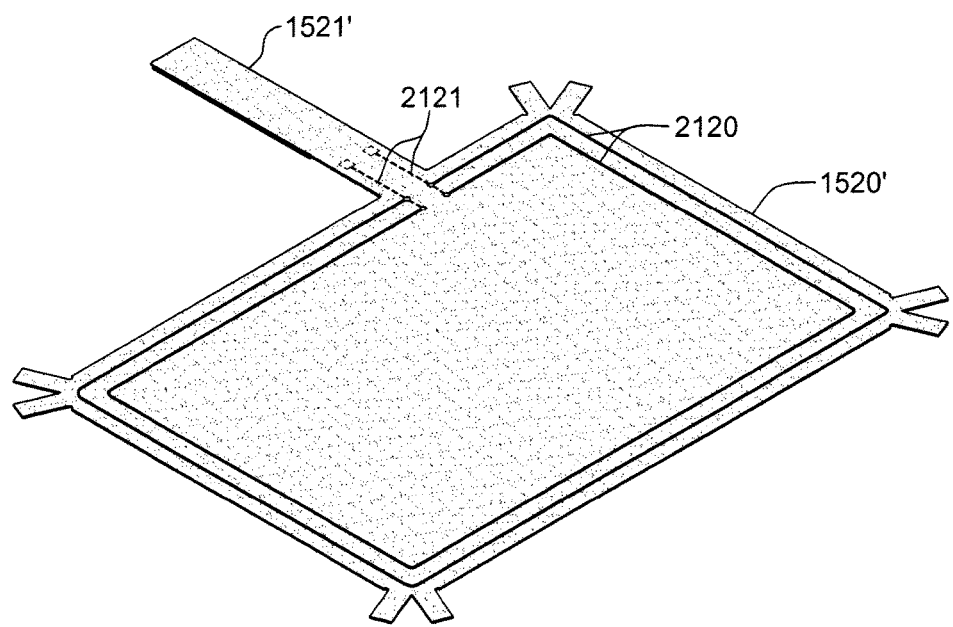
FIG. 21B is an isometric view of one embodiment of an inner main surface tamper-respondent sensor with one or more conductive traces in one or more bond regions thereof, in accordance with one or more aspects of the present invention.
Figure 21C:
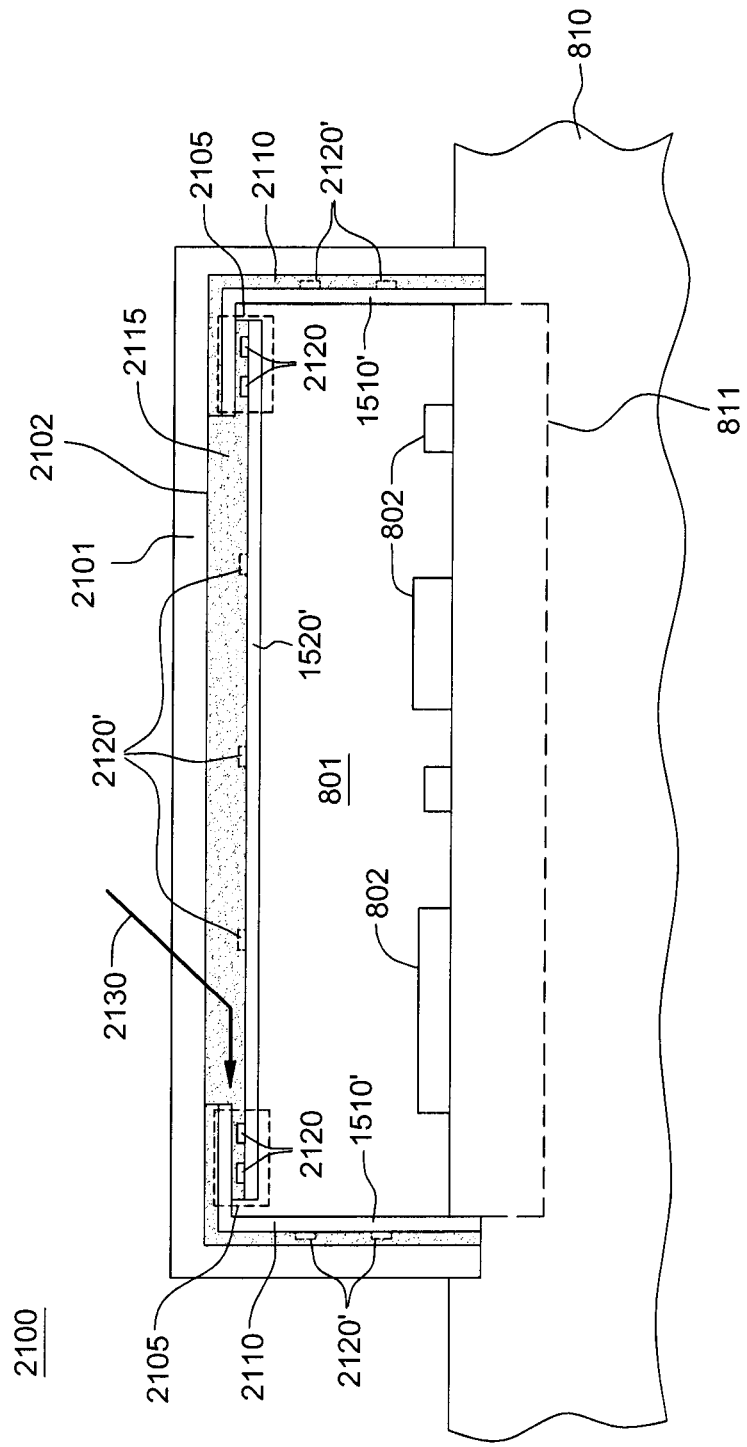
FIG. 21C is a cross-sectional elevational view of the tamper-respondent assembly of FIG. 21A, illustrating an attempted line of attack through the electronic enclosure and adhesive encountering the one or more conductive traces, in accordance with one or more aspects of the present invention.

FIGS. 21A-21C depict one embodiment of a tamper-respondent assembly having one or more tamper-respondent sensors with conductive traces positioned and fabricated to facilitate detection of a mechanical and/or chemical attack against an adhesive of the tamper-respondent assembly.

Referring to FIG. 21A, a tamper-respondent assembly 2100 is depicted comprising a structure 2101 having a rigid surface 2102. By way of example, structure 2101 is illustrated as an electronic enclosure or housing surrounding, at least in part, one or more electronic components 802 to be protected. By way of specific example, rigid surface 2102 is shown (by example) as an inner surface of the electronic enclosure, such as an inner surface of electronic enclosure 1400 described above in connection with FIGS. 14A-15B. The embodiment of FIG. 21A is presented, by way of example only, in connection with the implementation of FIGS. 8A-17C, where one or more tamper-respondent sensors are adhered to an inner surface of an electronic enclosure. In this example, conductive traces 2120 may be provided between discrete first and second tamper-respondent sensors (such as inner-sidewall tamper-respondent sensor 1510' and inner main surface tamper-respondent sensor 1520'), or alternatively, or additionally, conductive traces 2120' may be provided between one or more of the tamper-respondent sensors and the inner surface of the enclosure.

Note also that, in one or more other implementations, the conductive traces described herein as susceptible to damage during chemical attack of the adhesive, could be disposed between one or more tamper-respondent sensors and an outer surface of a structure, such as an outer surface of an electronic enclosure. In this regard, reference the embodiments of FIGS. 6A-6G, where one or more tamper-respondent sensors of a tamper-respondent electronic circuit structure may be adhered to an outer surface of an electronic enclosure. Still further, the conductive traces forming the outer tamper-detect network might be between the tamper-respondent sensor and any rigid structure of an electronic assembly, or cooling apparatus of an electronic assembly to be protected. For instance, the conductive traces disclosed herein could be disposed between one or more tamper-respondent sensors and a heat sink, such as a thermal spreader.

As illustrated, in one or more implementations, the tamper-respondent electronic circuit structure of the tamper-respondent assembly 2100 may include an inner-sidewall tamper-respondent sensor 1510' and an inner main surface tamper-respondent sensor 1520', each comprising one or more tamper-detect networks, such as one or more unexposed tamper-detect networks formed by circuit lines on one or more flexible layers, such as described above. The one or more tamper-detect networks are electrically connected to appropriate monitor circuitry (not shown) disposed within, for instance, the secure volume 801 defined by tamper-respondent assembly 2100. Note that in this example, inner-sidewall tamper-respondent sensor 1510' and inner main surface tamper-respondent sensor 1520' are discrete, first and second tamper-respondent sensors that overlap, at least in part, and facilitate defining the secure volume about the at least one electronic component 802 to be protected. For instance, the secure volume may be defined by securing the electronic enclosure to a multilayer circuit board 810 with an embedded tamper-respondent sensor 811, such as described above in connection with FIGS. 8A-10. Note further, in the depicted configuration, inner-sidewall tamper-respondent sensor 1510' may be bonded via an adhesive 2110 to an inner-sidewall surface of the electronic enclosure, wrapping partially around and over, onto the inner main surface of the electronic enclosure, as shown. This allows the overlap region 2105 of the inner-sidewall tamper-respondent sensor 1510' and inner main surface tamper-respondent sensor 1520' to occur at the flat, inner main surface portion of the structure 2101. An adhesive 2115 is provided to bond inner main surface tamper-respondent sensor 1520' to the inner main surface of structure 2101, as well as to the inner-sidewall tamper-respondent sensor 1510' in overlap region(s) 1205. Adhesives 2110, 2115 may be the same or different adhesives. In one or more implementations, adhesives 2110, 2115 may be a thermoset material, such as a thermally conductive epoxy.

As noted, to provide enhanced tamper-detect protection, one or more conductive traces 2120 may be provided exposed, at least in part, on one or more of the tamper-respondent sensors 1510', 1520' of tamper-respondent assembly 2100. For instance, one or more conductive traces 2120 are illustrated in the overlap region 2105 between inner-sidewall tamper-respondent sensor 1510' and inner main surface tamper-respondent sensor 1520', by way of example. Additionally, or alternatively, one or more conductive traces 2120' could be provided, as part of the same or a different tamper-detect network(s), on a surface of inner-sidewall tamper-respondent sensor 1510' between inner-sidewall tamper-respondent sensor 1510' and an inner-sidewall of structure 2101, and/or on a surface of inner main surface tamper-respondent sensor 1520', between inner main surface tamper-respondent sensor 1520' and rigid surface 2102 of structure 2101. In one or more implementations, the conductive traces 2120, 2120' in the bond region(s) are formed of a chemically compromisable or dissolvable conductive material susceptible to wetting or other damage during a chemical attack of the adhesive 2110, 2115 in direct contact therewith. The damage may result in dissolving one or more portions of the conductive traces, and thus, one or more portions of the associated tamper-detect network(s) defined (at least in part) by the traces and being monitored by the tamper-respondent electronic circuit structure, thereby facilitating detecting the tamper event. Note that the chemically dissolvable conductor used to form the conductive traces may be the same or a different material than the material used to form the unexposed circuit lines defining the one or more tamper-detect networks of the respective tamper-respondent sensor.

Stated generally, the conductive traces may be formed of a chemically compromisable conductive material, and may be provided in any bond region external to one or more sensors where, for instance, an adhesive bonds the respective tamper-respondent sensor to another surface, such as another surface of the tamper-respondent assembly. By way of example, the chemically dissolvable material used to form the conductive traces may comprise, at least in part, at least one of carbon, silver, or carbon-silver. For instance, the one or more conductive traces of the respective tamper-detect network(s) may be formed of a carbon-loaded conductive material, silver-loaded conductive material, or carbon-silver-loaded conductive material. Note also that different conductive traces may be in the same or different tamper-detect networks, and that conductive traces may be in the same or a different tamper-detect network than the network(s) defined by the sensor's unexposed circuit lines.

FIG. 21B depicts a modified version of inner main surface tamper-respondent sensor 1520' described above in connection with FIG. 17A. As described above, inner main surface tamper-respondent sensor 1520' includes one or more flexible layers having opposite first and second sides, and circuit lines on the flexible layer(s) forming, at least in part, at least one tamper-detect network, such as at least one resistive network, where the circuit lines may be disposed on at least one of the first side or the second side the flexible layer(s). For instance, multiple flexible layers could be provided within a stack, with circuit lines being defined on each side of each flexible layer within the stack, in any desired pattern and in any desired network configuration, to facilitate detection of a mechanical attempt to gain access to the secure volume through the tamper-respondent sensor.

In the example of FIG. 21B, multiple conductive traces 2120 are provided about the periphery of inner main surface tamper-respondent sensor 1520' in an area which aligns with a bond region of the tamper-respondent sensor, and in particular, aligns to an overlap region of, for instance, inner-sidewall tamper-respondent sensor 1510', such as depicted in FIG. 21A. Note in this regard, that two conductive traces 2120 are shown by way of example only. One, or more than two conductive traces in any desired pattern could be provided within the bond region(s). Note also that, in the example of FIG. 21A, the bond region comprises substantially the entire upper surface of the inner main surface tamper-respondent sensor 1520', since the inner main surface tamper-respondent sensor 1520' is either bonded to the inner main rigid surface 2102 (FIG. 21A) or to inner-sidewall tamper-respondent sensor 1510' (FIG. 21A). The conductive traces 2120 are illustrated in FIG. 21B in the overlap region 2105 (FIG. 21A) between the two tamper-respondent sensors of the tamper-respondent assembly shown in FIG. 21A. Note that in this implementation, a tamper-detect network is formed, at least in part, by conductive traces 2120, and that this network may further include unexposed circuit lines 2121, such as unexposed circuit lines within the tamper-respondent sensor 1520' itself. That is, a tamper-detect network may include both exposed conductive traces 2120 and unexposed circuit lines 2121, as desired for a particular application. The unexposed circuit lines may be provided within the tamper-respondent sensor to, for instance, complete the tamper-detect network where not needed to be external for tamper-detect purposes. For example, in the implementation of FIG. 21B, the unexposed circuit lines 2121 are shown extending within integrated flex ribbon cable or extension 1521' of inner main surface tamper-respondent sensor 1520'. The integrated flex ribbon cable or extension 1521' would be within the secure volume 801 in the implementation of FIG. 21A to, for instance, facilitate electrical connection of the inner main surface tamper-respondent sensor 1520' to monitor circuitry within the secure volume. Note further, in one or more other implementations, where the bond region of the tamper-respondent sensor comprises only a portion of the outer surface of the tamper-respondent sensor, that both unexposed circuit lines and exposed conductive traces may be employed in forming one or more tamper-detect networks, with the exposed conductive traces only residing in the bond region to provide the enhanced tamper-detection capability disclosed herein in areas susceptible to mechanical and/or chemical attack of the adhesive.

FIG. 21C illustrates a potential line of attack 2130 addressed by the enhanced tamper-respondent assembly of FIGS. 21A & 21B. In particular, line of attack 2130 may be attempted through structure 2101, into adhesive 2115, with the attack involving a chemical attack against the adhesive in order to, for instance, separate inner main surface tamper-respondent sensor 1520' from inner main surface tamper-respondent sensor 1510', and/or from the inner main surface of structure 2101. By providing one or more of conductive traces 2120, 2120' as illustrated, any chemical attack against adhesive 2115 will also wet or otherwise damage conductive traces 2120, 2120', with the damage to the conductive traces facilitating detection of the chemical attack by the monitor circuitry, and thus, initiation of an alarm and/or triggering of an erasure of, for instance, encryption/decryption keys stored within the secure volume.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating a tamper-respondent assembly comprising:
    providing an enclosure enclosing, at least in part, at least one electronic component to be protected;
    providing a tamper-respondent electronic circuit structure comprising a tamper-respondent sensor secured to an inner surface of the enclosure, the tamper-respondent sensor being a first tamper-respondent sensor, and the providing the tamper-respondent electronic circuit structure comprising providing the tamper-respondent sensor, including:
        providing at least one flexible layer having opposite first and second sides;
        forming circuit lines defining at least part of at least one tamper-detect network, the circuit lines being disposed on at least one of the first side or the second side of the at least one flexible layer;
        providing at least one region of the tamper-respondent sensor with increased susceptibility to damage from mechanical stress associated with a tamper event, the at least one region of increased susceptibility to damage facilitating detection of the tamper event by the tamper-respondent sensor;
    providing a multilayer circuit board, the at least one electronic component being mounted on a main surface of the multilayer circuit board;
    embedding an embedded tamper-respondent sensor within the multilayer circuit board as part of the multilayer circuit board, the embedded tamper-respondent sensor being a second tamper-respondent sensor; and
    affixing the enclosure to the main surface of the multilayer circuit board to seal the at least one electronic component between the enclosure and the multilayer circuit board, the tamper-respondent sensor secured to the inner surface of the enclosure and the embedded tamper-respondent sensor within the multilayer circuit board facilitating defining a secure volume about the at least one electronic component.

2. The fabrication method of claim 1, wherein the inner surface of the enclosure comprises a rigid surface, and the tamper-respondent sensor comprises first circuit lines, of the circuit lines, the first circuit lines being disposed at the first side of the at least one flexible layer, and the method comprises adhesively bonding the first circuit lines to the rigid surface of the enclosure to define the at least one region of increased susceptibility to damage from mechanical stress associated with the tamper event.

3. The fabrication method of claim 2, wherein the first circuit lines of the tamper-respondent sensor are exposed at the first side of the at least one flexible layer, and the bonding comprises bonding the first circuit lines to the rigid surface of the tamper-respondent assembly via an adhesive.

4. The fabrication method of claim 3, wherein the adhesive secures the first circuit lines to the rigid surface with an equal or greater bond strength than a bond strength of the first circuit lines to the first side of the at least one flexible layer.

5. The fabrication method of claim 3, further comprising providing set-off elements disposed between the first side of the at least one flexible layer and the rigid surface of the tamper-respondent assembly to define a gap between the first side of the at least one flexible layer, having the first circuit lines, and the rigid surface of the tamper-respondent assembly, the gap being substantially filled with the adhesive.

6. The fabrication method of claim 5, further comprising dispersing the set-off elements throughout the adhesive within the gap.

7. The fabrication method of claim 2, further comprising:
    providing the tamper-respondent sensor with second circuit lines, of the circuit lines, the second circuit lines being disposed at the second side of the at least one flexible layer, and being adhesively bonded to another rigid surface of the tamper-respondent assembly, to define between the inner surface of the electronic enclosure and the another rigid surface of the tamper-respondent assembly, the at least one region of the tamper-respondent sensor of increased susceptibility to damage from mechanical stress associated with the tamper event.

8. The fabrication method of claim 1, wherein providing the tamper-respondent sensor includes providing at least one cutout area in the tamper-respondent sensor, the at least one cutout area defining, at least in part, at least one stress-concentrating inner edge within the tamper-respondent sensor, the at least one region of increased susceptibility to damage adjoining the at least one stress-concentrating inner edge within the tamper-respondent sensor.

9. The fabrication method of claim 8, wherein providing the at least one cutout area comprises providing at least one channel extending into the tamper-respondent sensor on at least one of the first side or the second side of the at least one flexible layer, the at least one channel providing the at least one stress-concentrating inner edge within the tamper-respondent sensor.

10. The fabrication method of claim 8, wherein providing the at least one cutout area comprises, at least in part, providing at least one opening that extends through the at least one flexible layer with the circuit lines, the at least one opening providing the at least one stress-concentrating inner edge within the at least one tamper-respondent sensor.

11. The fabrication method of claim 8, wherein providing the tamper-respondent sensor comprises providing multiple regions of the tamper-respondent sensor with increased susceptibility to damage from mechanical stress associated with the tamper event, and wherein the multiple regions of increased susceptibility to damage are associated with multiple cutout areas in the tamper-respondent sensor, the multiple cutout areas being disposed at a periphery of the tamper-respondent sensor, and defining respective stress-concentrating inner edges within the tamper-respondent sensor, wherein each region of increased susceptibility to damage of the multiple regions of increased susceptibility to damage adjoins a respective stress-concentrating inner edge of the multiple stress-concentrating inner edges defined by the multiple cutout areas at the periphery of the tamper-respondent sensor.

12. The fabrication method of claim 1, wherein forming one or more circuit lines of the circuit lines of the tamper-respondent sensor comprises forming the one or more circuit lines to be disposed, at least in part, within the at least one region of the tamper-respondent sensor having the increased susceptibility to damage from mechanical stress associated with the tamper event.

* * * * *